(12) United States Patent
Ooishi

(10) Patent No.: US 6,421,789 B1
(45) Date of Patent: Jul. 16, 2002

(54) SYNCHRONOUS SEMICONDUCTOR MEMORY DEVICE CAPABLE OF REDUCING TEST COST AND METHOD OF TESTING THE SAME

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/333,649

(22) Filed: Jun. 16, 1999

(30) Foreign Application Priority Data

Jan. 19, 1999 (JP) ............................................ 11-010507

(51) Int. Cl.$^7$ ........................ G06F 11/27; G01R 31/28

(52) U.S. Cl. ........................... 714/7; 714/733; 365/201

(58) Field of Search ............................ 714/7, 25, 30, 714/48, 733, 724, 5, 37, 718, 735, 763; 365/230.01, 230.03, 189.01

(56) References Cited

U.S. PATENT DOCUMENTS

| | | | | |
|---|---|---|---|---|
| 5,157,781 A | * | 10/1992 | Harwood et al. | |
| 5,577,236 A | * | 11/1996 | Johnson et al. | |
| 5,721,860 A | * | 2/1998 | Stolt et al. | |
| 5,726,950 A | | 3/1998 | Okamoto et al. | |
| 6,311,300 B1 | * | 10/2001 | Omura et al. | |

FOREIGN PATENT DOCUMENTS

| | | |
|---|---|---|
| JP | 7-78498 | 3/1995 |
| JP | 9-33611 | 2/1997 |

* cited by examiner

Primary Examiner—Gopal C. Ray
(74) Attorney, Agent, or Firm—McDermott, Will & Emery

(57) ABSTRACT

A match detection circuit detecting match of data outputted to a plurality of data terminals is provided on an input/output circuit part. In a test, the same result is written in two latches, and alternately read in response to a clock signal. From a terminal outputting data at a double data rate in general, therefore, a test result can be outputted at a lower data rate. Observation is enabled with a tester having low performance, for reducing the cost for the test.

19 Claims, 58 Drawing Sheets

FIG.58

THIRD STAGE

| | 3 | Ra | Cb | 1 | |
|---|---|---|---|---|---|
| | 3 | Ra | Cc | 1 | |
| | 3 | Ra | Cd | 1 | |
| | | | | | |
| | | | | | |
| | | | | | |

FIG.59

FOURTH STAGE

| | 4 | Ra | Cb | 1 | |
|---|---|---|---|---|---|
| | 4 | Ra | Cc | 1 | |
| | 4 | Ra | Cd | 1 | |
| | 4 | Ra | Ce | 1 | |
| | | | | | |
| | | | | | |

FIFTH STAGE
FLAGGED TO FIX ADDRESS

SIXTH STAGE

SYNCHRONOUS SEMICONDUCTOR MEMORY DEVICE CAPABLE OF REDUCING TEST COST AND METHOD OF TESTING THE SAME

BACKGROUND OF THE INVENTION

1. Field of the Invention

The present invention relates to a synchronous semiconductor memory device and a method of testing the same, and more specifically, it relates to an input/output circuit inputting/outputting data in synchronization with a clock, a synchronous semiconductor memory device including the same and a method of testing the same.

2. Description of the Prior Art

In general, a data input/output circuit employed for a semiconductor device such as a semiconductor memory device, for example, puts a plurality of outputted data out of phase with an internal clock thereby transferring the data from the semiconductor memory device to an external device at a rate higher than the clock frequency.

In order to reduce a test cost, a BIST (built-in self test) structure providing a function of performing read and write tests of memory cells on a chip itself is increasingly employed.

FIG. 67 is a block diagram showing the block structure of a conventional memory having a BIST (built-in self test) function.

Referring to FIG. 67, this memory includes a clock generation circuit CKG generating an internal operation clock in response to control signals /RAS, /CAS and /WE, an address buffer ADB externally receiving an address signal AI, an X decoder XDEC and a Y decoder YDEC decoding the address signal in accordance with the clock generated by the clock generation circuit CKG, and a memory cell array MA transmitting/receiving data to/from an external device.

This memory further includes a self test circuit STC. The self test circuit STC includes a ROM storing a coded test procedure, a program counter PC, an address counter CA, a data generation circuit DG, a data compare circuit DC and a test clock generation circuit TCG.

In order to read a desired instruction from the ROM in a self test, the program counter PC specifies an address of the ROM storing the instruction. The ROM sequentially outputs the coded test procedure for controlling the program counter PC, the address counter AC, the data generation circuit DG, the data compare circuit DC and the test clock generation circuit TCG and progressing a memory test.

When such a self test circuit is built in the semiconductor memory device, a high-performance test can be executed with a simple tester, to reduce the test cost.

When interleaving a plurality of data in a data input/output circuit following the recent increase of the operating speed of the semiconductor device, however, the data may collide with each other when picked up by an externally connected circuit, or erroneous data may be picked up.

In a gigantic synchronous semiconductor memory device having a memory capacity reaching 1 Gbit, a skew of an internal signal, particularly a clock controlling the overall operation of the chip increases to limit the operating frequency of the chip. Particularly when receiving an externally inputted reference clock in a clock buffer and thereafter receiving an address, data and a command on the basis of the clock, the received clock must be distributed to input terminals for the address, the data and the command and a delay required for transmitting the clock limits the performance of the chip. Also when controlling an output buffer on the basis of the clock, the output is delayed by the clock skew to degrade the margin of output data received by an external device.

Following the increase of the operating speed of the semiconductor memory device, further, the following problem arises in an operation test during a step of fabricating the semiconductor memory device or in advance of shipment of products:

The time required for the test increases following increase of the memory capacity of the semiconductor memory device, to result in increase of the cost for the test as well as the fabrication cost for the products.

In order to prevent such increase the test time following increase of the memory capacity of the semiconductor memory device, a plurality of semiconductor memory devices are generally tested in parallel for improving the test efficiency. However, the aforementioned increase of the memory capacity of the semiconductor memory device results in increase of the bit number of an address signal supplied to the semiconductor memory device, a multi-bit structure of a data input/output interface and the like, and the number of semiconductor memory devices simultaneously testable in parallel is limited due to increase of the number of input pins and input/output pins for control signals in each semiconductor memory device.

In general, the number of chips of semiconductor memory devices simultaneously measurable in a tester depends on the number of pins provided on the tester and that of pins required by the chips, and is generally expressed as follows:

(number of pins provided in tester)/(number of pins required by chips)>(number of simultaneously measurable chips)

Assuming that the operating speed of a tester for testing a semiconductor memory device is improved following improvement of the operating speed of the semiconductor memory device itself, further, an extremely high-priced tester is required, to also result in increase of the test cost.

In addition, while a synchronous semiconductor memory device employs complicated systems such as BIST (built-in self test), generation of a clock by DLL (delay locked loop) and the like to reduce the cost and improve the function, it is difficult to externally observe operating states of these circuits.

SUMMARY OF THE INVENTION

An object of the present invention is to provide a synchronous semiconductor memory device capable of reducing a test cost by reducing the number of terminals employed in testing thereby increasing the number of chips simultaneously measurable with a single tester and reducing the data rate for output data to be observed thereby allowing efficient testing without employing a high-priced tester of high performance.

Another object of the present invention is to provide a synchronous semiconductor memory device simplifying testing or evaluation of an internal circuit by rendering the state of the internal circuit, whose operation is not directly observable from outside, externally observable through an input/output circuit.

Briefly stated, the present invention is directed to a synchronous semiconductor memory device comprising a memory array, a read circuit, first and second data buses, a first output circuit and a first output node.

The read circuit batch-reads first and second stored data from the memory array in response to an address signal. The first and second data buses receive the first and second stored data respectively. The first output circuit receives the first and second stored data from the first and second data buses, performs different conversions in an normal operation and in a test, holds the converted data and thereafter outputs the same. The first output node receives the output of the first output circuit.

According to another aspect of the present invention, a synchronous semiconductor memory device comprises a memory array, a first match detection circuit, a shift register and a second match detection circuit.

The first match detection circuit receives a plurality of stored data batch-read from the memory array in response to a clock signal and detects a match. The shift register receives an output of the match detection circuit. The shift register includes serially connected first to n-th hold circuits (n: natural number of at least 2) fetching the stored data and outputting held data in response to the clock signal. The second match detection circuit determines whether or not all outputs of the first to n-th hold circuits match with each other.

According to still another aspect of the present invention, a synchronous semiconductor memory device comprises a memory array, a BIST (built-in self test) control circuit and a first terminal.

The BIST control circuit controls execution of a self test for the memory array, supplies an address signal and a command signal to the memory array, and transmits/receives stored data to/from the memory array. In a pretest for testing whether or not the self test is executable, the first terminal outputs a result of the pretest.

According to a further aspect of the present invention, a method of testing a synchronous semiconductor memory device including a memory array, a BIST (built-in self test) control circuit controlling execution of a self test for the memory array, supplying an address signal and a command signal to the memory array and transmitting/receiving stored data and a first terminal outputting, in a pretest for testing whether or not the self test is executable, a result of the pretest comprises a first step and a second step.

The BIST control circuit includes a RAM part storing test data corresponding to the procedure of the self test and a pattern generator part controlling the self test on the basis of the test data stored in the RAM part. The result of the pretest includes the test data stored in the RAM part. The RAM part includes first to n-th groups of storage units (n: natural number) which are units selected by the pattern generator part in execution of the self test. Each group of storage units have m storage units (m: natural number) batch-selected to output the test data to the pattern generator part in execution of the self test while serving as serially connected shift registers in the pretest.

In the first step, the test data is inputted from the first terminal and sequentially shifted and stored in the first to n-th groups of storage units.

In the second step, the test data set in the first to n-th groups of storage units is sequentially shifted and read from the n-th group of storage units through the first terminal.

Accordingly, a principal advantage of the present invention resides in that the number of data input/output terminals necessary for monitoring data output as well as the number of channels employed by a tester for testing the semiconductor memory device can be reduced, whereby the cost for testing the semiconductor memory device can be reduced.

Another advantage of the present invention resides in that non-defectiveness/defectiveness of the synchronous semiconductor memory device can be determined with a small count of observation of a test result output signal, so that a tester of low performance can determine non-defectiveness/defectiveness of the synchronous semiconductor memory device.

Still another advantage of the present invention resides in that the operation of a circuit controlling a self test can be previously confirmed before executing the self test.

A further advantage of the present invention resides in that whether or not the RAM part of the BIST control circuit normally operates is recognizable and the number of pins necessary for testing the RAM can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 56 to 62 illustrate states in first to seventh stages of address storage respectively;

DESCRIPTION OF THE PREFERRED EMBODIMENTS

Figure 1:
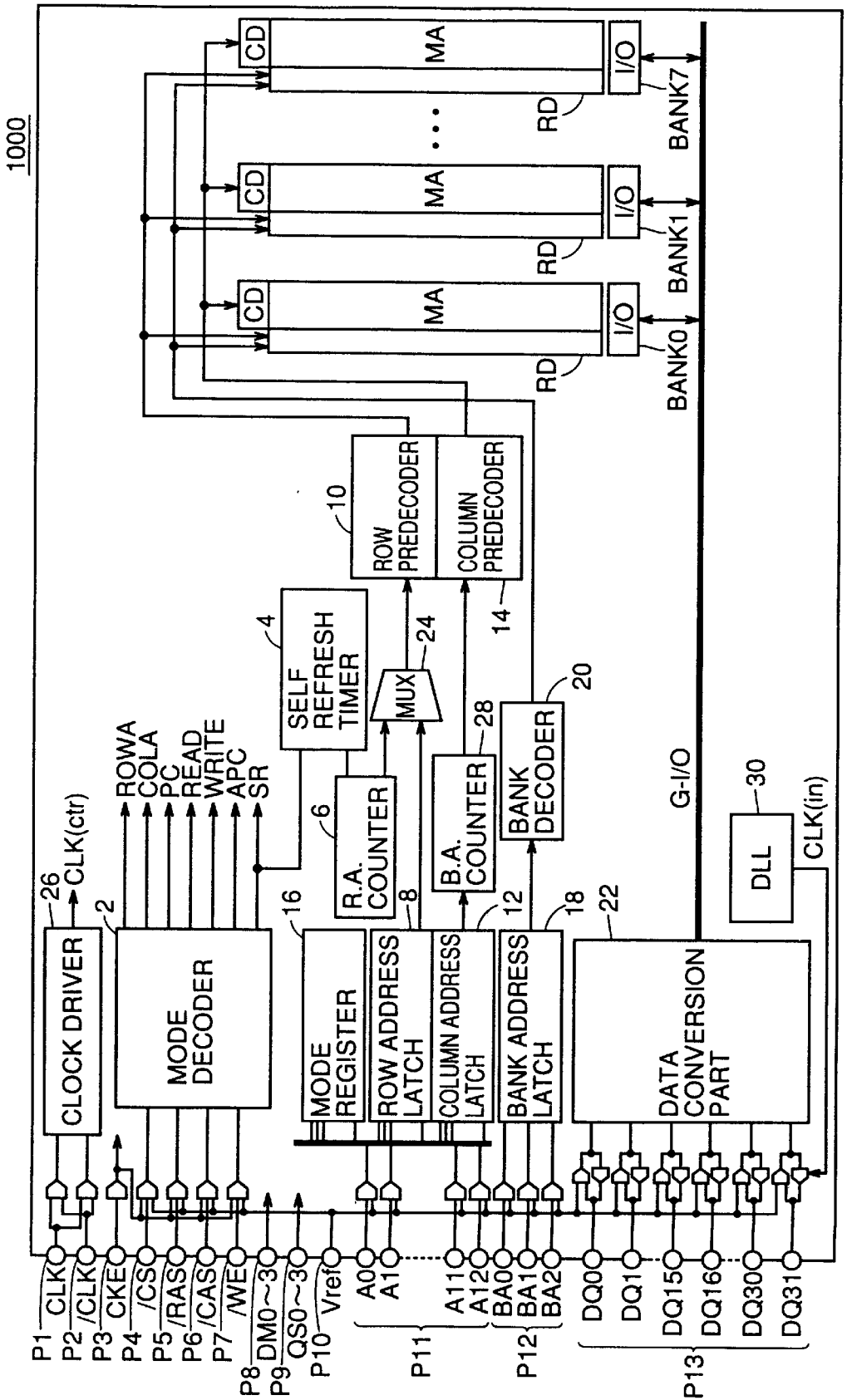
FIG. 1 is a schematic block diagram showing the overall structure of a synchronous semiconductor device 1000 according to an embodiment 1 of the present invention.

Embodiments of the present invention are now described in detail with reference to the drawings. In the drawings, the same reference numerals denote identical or corresponding parts.

Embodiment 1

FIG. 1 is a schematic block diagram showing the overall structure of a synchronous semiconductor memory device 1000 according to an embodiment 1 of the present invention.

Referring to FIG. 1, the synchronous semiconductor memory device 1000 is a synchronous dynamic random access memory (hereinafter referred to as DDR SRAM) of a double data rate having a capacity of 1 Gbit.

The synchronous semiconductor memory device 1000 includes terminals P1 and P2 receiving externally supplied complementary clock signals CLK and /CLK serving as the reference for the overall operation, a terminal P3 receiving an enable signal CKE enabling input in a chip, a terminal P4 receiving a signal /CS identifying input of a command, a terminal P5 receiving a signal /RAS indicating input of a row-system command, a terminal P6 receiving a signal /CAS indicating input of a column-system command, a terminal P7 receiving a read/write identification signal /WE, a terminal P8 inputting/outputting data mask signals DM0 to DM3 identifying invalidness of data in reading or writing, a terminal group P9 inputting/outputting data strobe signals QS0 to QS3 identifying data timings in reading or writing, a terminal P10 receiving a reference potential Vref determining high/low levels of the input signals, a terminal group P11 receiving address signals A0 to A12, a terminal group P12 receiving 3-bit bank addresses BA0 to BA2 of eight built-in memory banks, and a terminal group P13 inputting/outputting 32-bit data input/output signals DQ0 to DQ31.

The synchronous semiconductor memory device 1000 does not operate while the enable signal CKE is inactive. During this inactive period, the synchronous semiconductor memory device is in a standby state or a self refresh state.

While the signal /CS is activated, a command is recognized on the leading edge of a clock. The data mask signals DM0 to DM3 are transmitted from the semiconductor memory device to a controller IC when indicating invalidness of data in reading, while transmitted from the controller IC to the semiconductor memory device when indicating invalidness of data in writing. A data mask signal DM is allocated to eight data input/output signals DQ.

Similarly, the data strobe signal QS transmits the data timing from the semiconductor memory device to the controller IC in reading, while transmitting the same from the controller IC to the semiconductor memory device in writing. A data strobe signal QS is allocated to eight data input/output signals DQ.

As to the address signals A0 to A12, all 13 bits are employed for inputting a row address, while 10 among the 13 bits are employed for inputting a column address. Parts of the address signals A0 to A12 are employed also for writing in a mode register.

The synchronous semiconductor memory device 1000 further includes a mode decoder 2 recognizing the inputted command, a mode register 16 holding an operating mode, a row address latch 8 fetching the row address from an address terminal, a column address latch 12 fetching. the column address from the address terminal, a bank address latch 18 fetching a bank address signal from a bank address, and a bank decoder 20 decoding the bank address outputted from the bank address latch 18 and activating a corresponding bank.

The synchronous semiconductor memory device 1000 further includes a self refresh timer 4 and a refresh address counter 6 provided together for generating a refresh address in a refresh operation, a multiplexer 24 selecting either the address outputted from the row address latch 8 or that outputted from the refresh address counter 6, a row predecoder 10 receiving the address outputted from the multiplexer 24 and outputting a corresponding signal to a row decoder RD, a burst address counter 28 generating continuous column addresses in a burst operation, and a column predecoder 14 receiving the addresses outputted from the burst address counter 28 and outputting a corresponding signal to a column decoder CD.

The synchronous semiconductor memory device 1000 further includes a delay locked loop (hereinafter referred to as DDL) circuit 30 generating a clock CLK(in) in phase with an externally inputted clock CLK, and a data conversion part 22 converting a data rate and performing data transfer between the data input/output terminal group P13 and a global input/output line G-I/O.

The global input/output line G-I/O transmits/receives data to/from eight memory banks BANK0 to BANK7.

Figure 2:
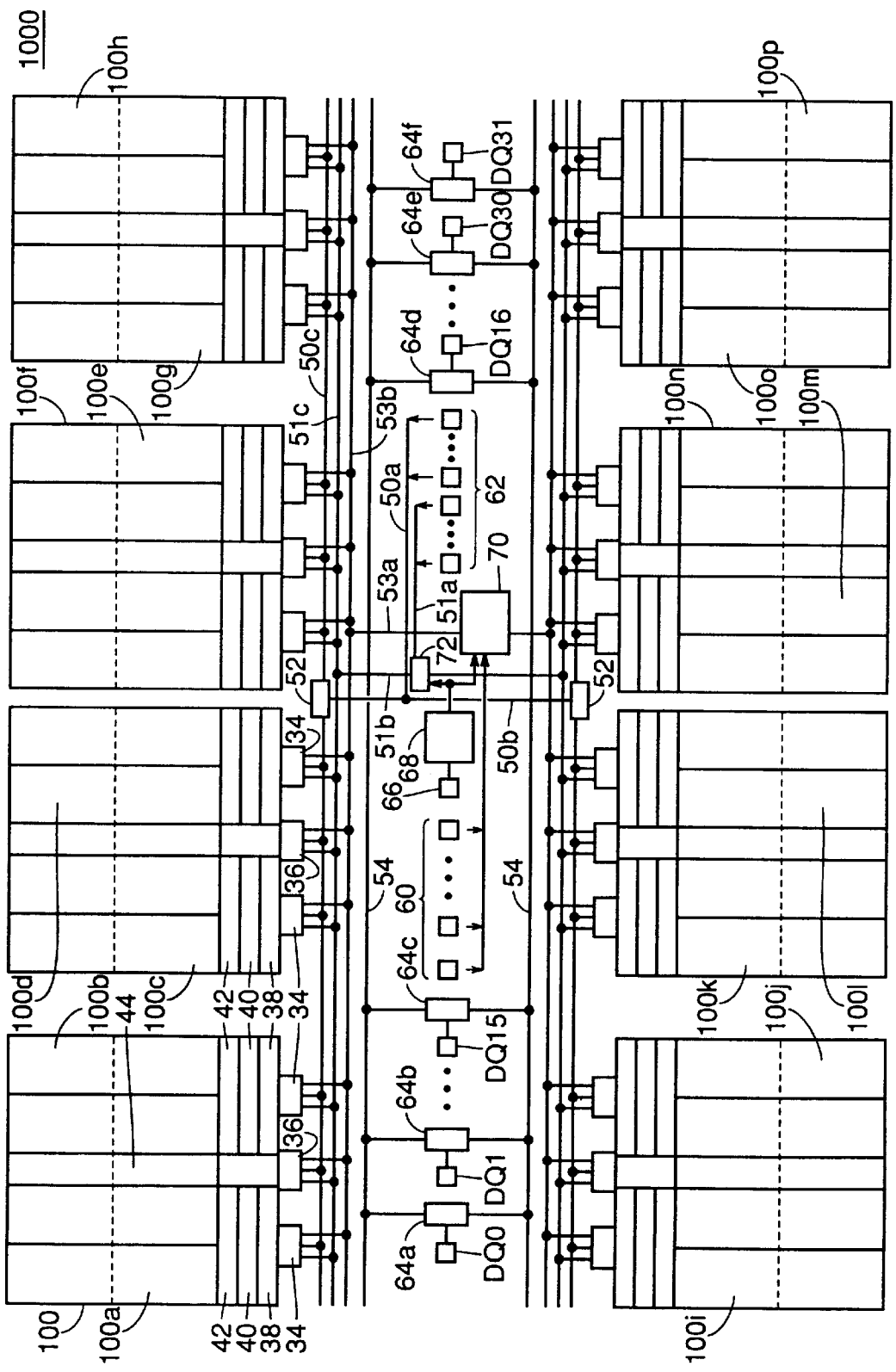
FIG. 2 schematically illustrates exemplary arrangement of each block in the synchronous semiconductor memory device 1000 according to the embodiment 1 of the present invention.

FIG. 2 is a schematic diagram showing exemplary arrangement of each block in the synchronous semiconductor memory device 1000 according to the embodiment 1 of the present invention.

Referring to FIG. 2, the synchronous semiconductor memory device 1000 includes a control circuit 70 receiving the external control signals /RAS, /CAS, /WE, /CS and the like supplied through an external control signal input terminal group 60, decoding the same and generating an internal control signal, command data buses 53*a* and 53*b* transmitting the internal control signal outputted from the control circuit 70, and a memory cell array 100 having memory cells arranged in rows and columns.

As shown in FIG. 2, the memory array 100 is split into 16 memory cell blocks 100*a* to 100*p* in total. When the memory capacity of the synchronous semiconductor memory device 1000 is 1 Gbit, for example, each memory cell block has a capacity of 64 Mbits. Each block can individually operate as a bank.

The synchronous semiconductor memory device 1000 further includes an internal synchronous signal generation circuit 68 receiving the external clock signal CLK supplied to a clock signal input terminal 66, controlled by the control circuit 70 to start a synchronous operation and outputting the internal clock signal CLK(in).

The internal synchronous signal generation circuit 68 generates the internal clock signal CLK(in) synchronous with the external clock signal CLK by a DLL circuit or the like, for example.

The semiconductor memory device 1000 fetches the external address signals A0 to A12 and BA0 to BA2 supplied through an address signal input terminal group 62 in synchronization with the internal clock signal CLK(in) under control of the control circuit 70.

The external address signals BA0 to BA2 are supplied to a bank decoder 72 through an address bus 51*a*. The bank decoder 72 transmits decoded bank addresses B0 to B7 to each memory cell block through address buses 51*b* and 51*c*.

The bank addresses B0 to B7 activate any one of memory cell blocks provided in correspondence to data input terminals DQ0 to DQ15 and any one of memory cell blocks provided in correspondence to data input/output terminals DQ16 to DQ31, i.e., two memory cell blocks in total.

On the other hand, the remaining external address signals supplied to the address signal input terminal group 62 are transmitted to an address driver 52 through address buses 50*a* and 50*b*, and further transmitted from the address driver 52 to each memory cell block through an address bus 50*c*.

The synchronous semiconductor memory device 1000 further includes a row predecoder 36 provided for each pair of memory cell blocks for latching and predecoding a row address transmitted by the address bus 50*c* under control of the control circuit 70, a row decoder 44 selecting a corresponding row (word line) of a selected memory cell block on the basis of an output from the row predecoder 36, a column predecoder 34 provided for each memory cell block for latching and predecoding a column address transmitted by the address bus 50*c* under control of the control circuit 70, a column predecoder line 40 transmitting an output from the column predecoder 34, and a column decoder 42 selecting a corresponding column (pair of bit lines) of the selected memory cell block on the basis of an output from the predecoder line 40.

The synchronous semiconductor memory device 1000 further includes the data input terminals DQ0 to DQ15 and DQ16 to DQ31 arranged in regions along the longer side direction of the chip center part outside the region provided with the external control signal input terminal group 60 and the address signal input terminal group 62 respectively, input/output buffer circuits 64a to 64f provided in correspondence to the data input/output terminals DQ0 to DQ31 respectively, a data bus 54 transmitting data between the input/output buffers and the corresponding memory cell blocks, and read/write amplifiers 38 provided in correspondence to the memory cell blocks 100a to 100p respectively for transferring data between the data bus 54 and the selected memory cell column.

The signal /RAS supplied to the external control signal input terminal group 60 is a row address strobe signal for starting an internal operation of the synchronous semiconductor memory device 1000 and deciding an active period of the internal operation. In response to activation of the signal /RAS, a circuit such as the row decoder 44 related to the operation of selecting the row of the memory cell array 100 is activated.

The signal /CAS supplied to the external control signal input terminal group 60 is a column address strobe signal and activates the circuit for selecting the column in the memory cell array 100.

The signal /CS supplied to the external control signal input terminal group 60 is a chip select signal indicating selection of the synchronous semiconductor memory device 1000, while the signal /WE is a signal indicating a write operation of the synchronous semiconductor memory device 1000.

Operations for fetching the signals /CS, /RAS, /CAS and /WE are performed in synchronization with the internal clock signal CLK(in).

Operations for fetching the address signals supplied to the address signal input terminal group 62 are also performed in synchronization with the internal clock signal CLK(in).

[Description of Concept of Asynchronism]

Figure 3:
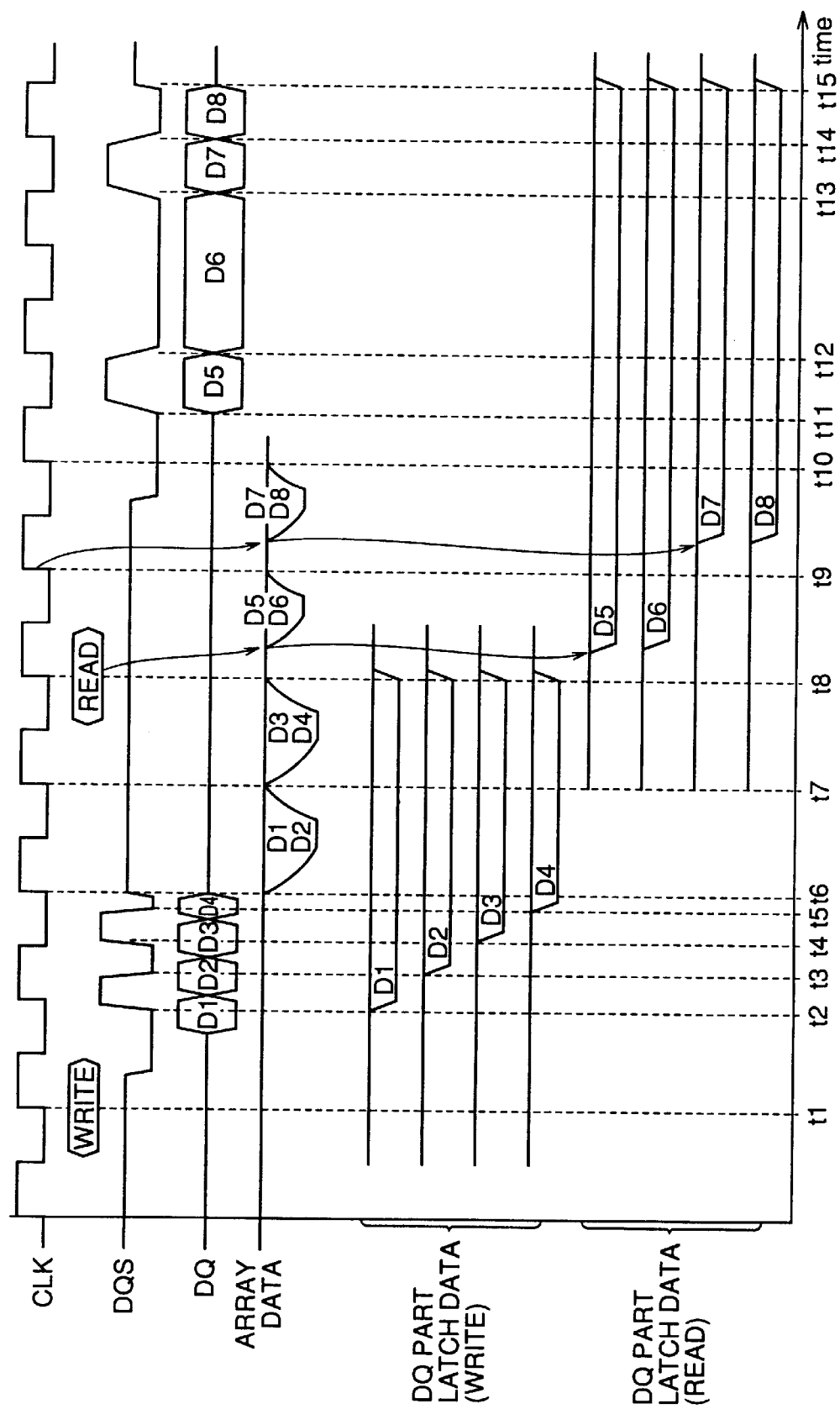
FIG. 3 is an operating waveform diagram for illustrating the concept of asynchronism.

FIG. 3 is an operating waveform diagram for illustrating the concept of asynchronism.

Referring to FIG. 3, the externally inputted clock CLK serves as the reference of data writing/reading in/from the memory array of the synchronous semiconductor memory device.

At a time t1, a write command is externally inputted.

In writing, the synchronous semiconductor memory device fetches data in accordance with the timing of a signal DQS externally inputted in synchronization with the data. At a time t2, data D1 inputted in the data input/output terminal DQ is fetched in response to the leading edge of the signal DQS and written in a write latch provided in an input/output circuit part. At times t3, t4 and t5, data D2, D3 and D4 are similarly fetched in the write latch at change timings of the signal DQS respectively.

At a time t6, the data D1 and D2 fetched in the write latch are written in the memory array in response to the leading edge of the clock CLK. At a time t7, the data D3 and D4 fetched in the write latch are written in the memory array.

At a time t8, burst writing terminates and the write latch is reset.

Also at the time t8, a read command is externally inputted. In accordance with the internal clock internally generated on the basis of the clock CLK between the time t8 and a time t9, the data D5 and D6 written in the memory array part are transmitted to a read latch of the input/output circuit part. Between the time t9 and a time t10, the data D7 and D8 written in the memory array are similarly transmitted to the read latch of the input/output circuit part in accordance with the internal clock internally generated on the basis of the clock CLK. In reading, data held in the latch of the input/output circuit part is outputted at a timing when a system externally connected to the semiconductor memory device requires the data, and the synchronous semiconductor memory device transmits the signal DQS responsive to the timing to the external system.

Between times t11 and t15, the data D5 to D8 are sequentially outputted in accordance with change of the signal DQS.

In this case, the timings for outputting the data are not necessarily synchronous with the externally inputted clock CLK, as shown in FIG. 3.

Burst reading terminates at the time t15 and the read latch is reset.

As described above, the synchronous semiconductor memory device reads/writes data in/from the memory array in accordance with the internal clock internally generated on the basis of the externally inputted clock CLK. When transmitting/receiving data to/from the external system, on the other hand, the synchronous semiconductor memory device fetches the data in the latch part or transmits the data from the latch part in correspondence to the signal DQS indicating the timing suitable for the specification of the externally connected system.

[Description of Detailed Structure of Input/Output Circuit Part]

Figure 4:
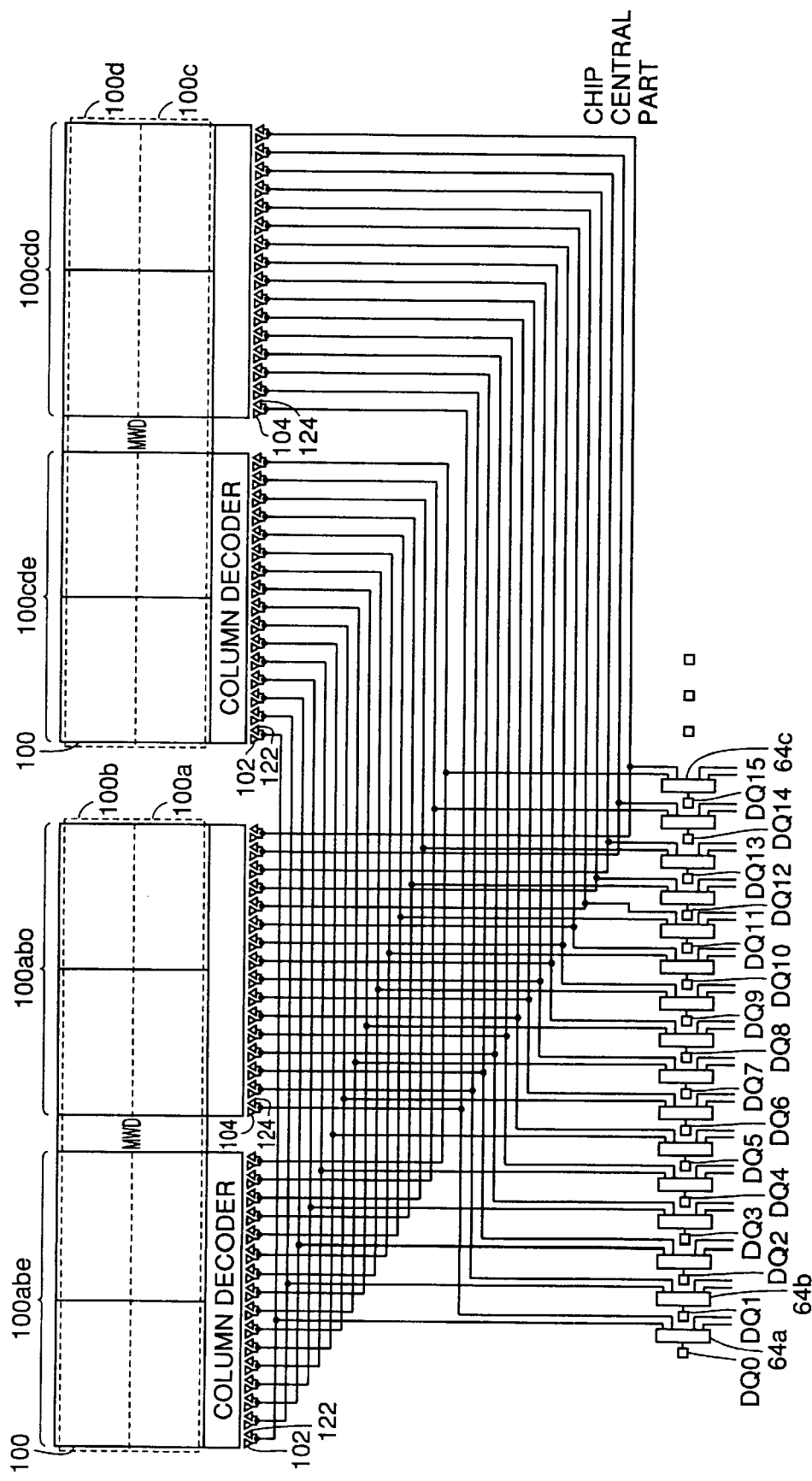
FIG. 4 is a schematic diagram for illustrating connection between each bank and each input/output circuit.

FIG. 4 is a schematic diagram for illustrating connection between each bank and each input/output circuit.

FIG. 4, showing connection between the banks 100a to 100d of the synchronous semiconductor memory device described with reference to FIG. 2 and input/output circuits in the part of the data input/output terminals DQ0 to DQ15, illustrates a region of 256 Mbits on the upper left half of the chip in an enlarged manner. Referring to FIG. 4, each of the banks 100a and 100b is split into an area 100abe corresponding to an even address and an area 100abo corresponding to an odd address through a main word driver MWD.

In the double data rate system, data must be outputted at a frequency twice the internal clock. Data corresponding to the odd address and the even address can be simultaneously accessed by splitting each bank in the aforementioned manner, to simplify a data output operation at the double frequency.

However, this is not necessarily requisite. Implementation is enabled also by slightly quickening the timing for accessing the corresponding area depending on whether the address of data outputted first is odd or even while slightly delaying the timing for accessing a secondly accessed area. Formation of a large current peak can also be prevented by this system. However, operation control is complicated since the phase of the access timing must be changed in response to whether the address accessed first is even or odd.

Data from an area of an even address and that from an area of an odd address in a single bank are inputted in the same DQ part.

For example, the input/output circuit 64a provided in correspondence to the data input/output terminal DQ0 is connected with a read amplifier 102 reading data from the even address areas 100abe and 100cde and a write amplifier 122 writing data. The input/output circuit 64a is further connected with a read amplifier 104 reading data from the odd address areas 100ab0 and 100cd0 and a write amplifier 124 writing data.

Input/output circuits are provided also in correspondence to the data input/output terminals DQ1 to DQ15, and a read amplifier and a write amplifier for an odd address area and an even address area are connected to each input/output circuit.

Figure 5:
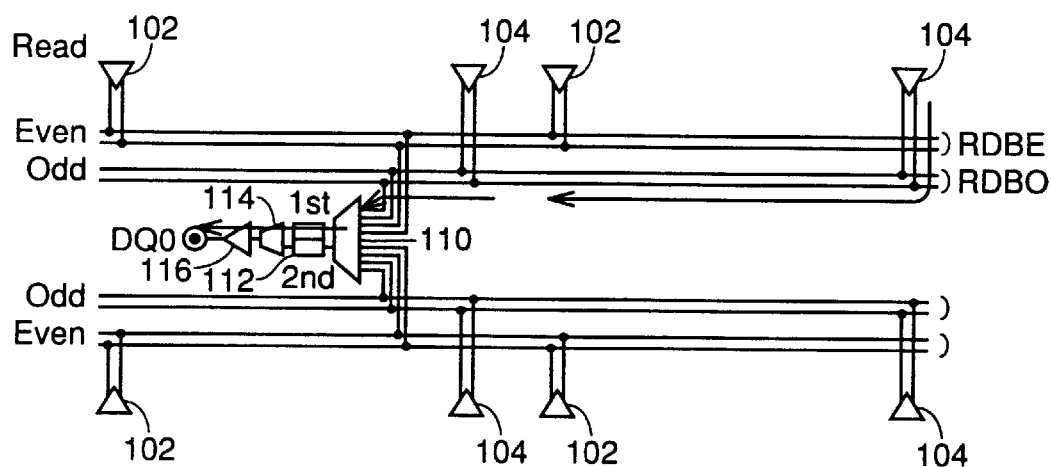
FIG. 5 is a diagram for illustrating the flow of data outputted from a memory bank to a data input/output terminal DQ0.

FIG. 5 is a diagram for illustrating a flow of data outputted from a memory bank to the data input/output terminal DQ0.

When data is read from an odd area of the bank, data read by the read amplifier 104 from the memory cell array is outputted to a read data bus RDBO. This data is selected by a multiplexer 110, temporarily held in a latch 112 and thereafter outputted to the terminal through a multiplexer 114 and an output buffer 116. When reading data from an even area, the data is supplied to the multiplexer 110 from the read amplifier 102 through a read data bus RDBE.

Figure 6:
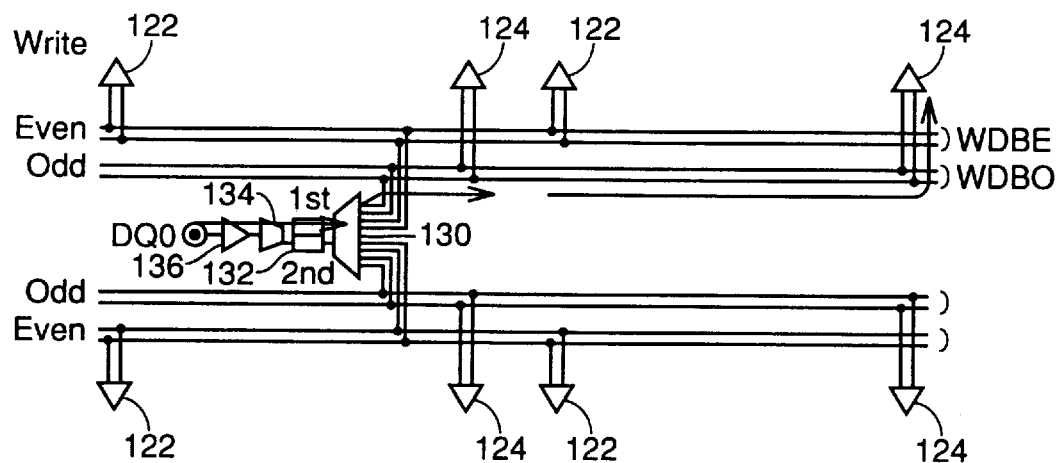
FIG. 6 is a diagram for illustrating the flow of data written in the bank from the data input/output terminal DQ0.

FIG. 6 is a diagram for illustrating a flow of data written from the data input/output terminal DQ0 in the bank.

When writing data in an odd address, the data inputted from the terminal is outputted to a write data bus WDBO through an input buffer 136, a demultiplexer 134, a latch 132 and a demultiplexer 130, and transmitted to the memory array by the write amplifier 124, as shown in FIG. 6. Also when writing data in an even address, the data is transmitted from the demultiplexer 130 to the write amplifier 122 through a write data bus WDBE, amplified and transmitted to the memory array.

Figure 7:
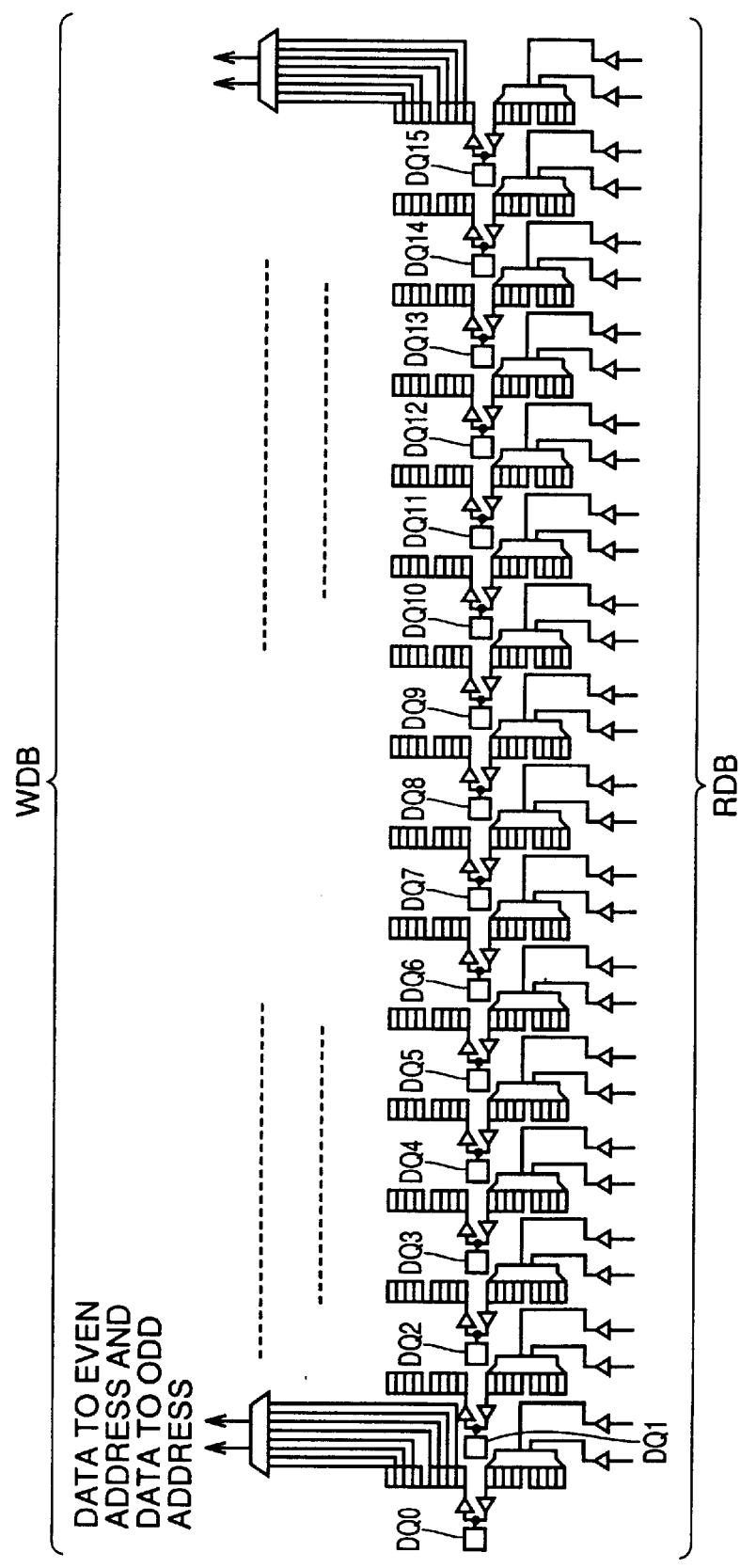
FIG. 7 schematically illustrates the structure of a part of data input/output terminals DQ0 to DQ15.

FIG. 7 schematically illustrates the structure of the part of the data input/output terminals DQ0 to DQ15.

Referring to FIG. 7, the data input/output terminals DQ0 to DQ15 are arranged in order, with provision of input/output circuits including latches in correspondence to the respective ones thereof. A read data bus RDB and a write data bus WDB are connected to the input/output circuits. The read data bus and the write data bus may alternatively be provided in common.

Although not illustrated, input/output circuits are provided also in correspondence to the data input/output terminals DQ16 to DQ31.

Figure 8:
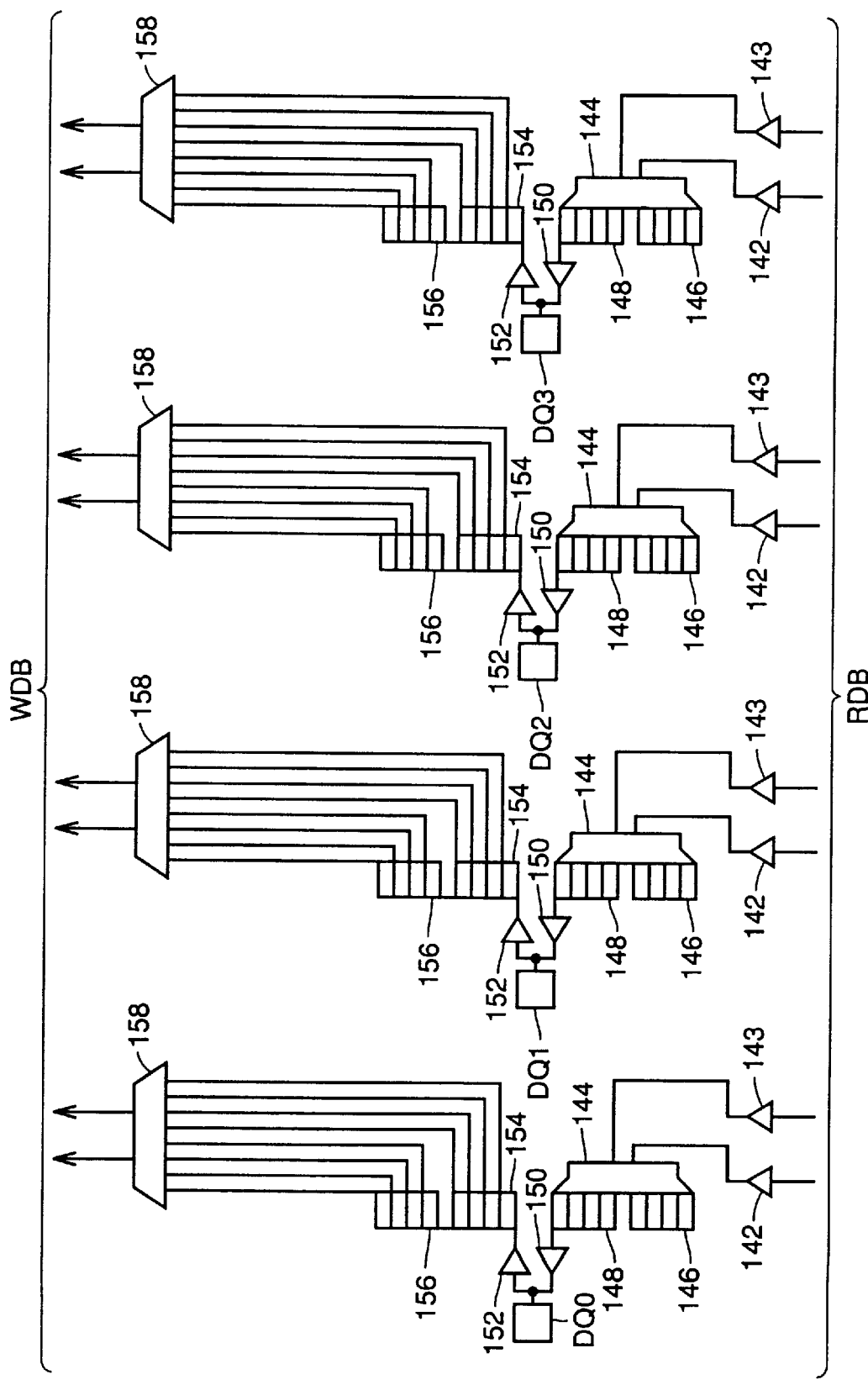
FIG. 8 illustrates a part corresponding to the data input/output terminals DQ0 to DQ3 shown in FIG. 7 in an enlarged manner.

FIG. 8 is a diagram showing a part corresponding to the data input/output terminals DQ0 to DQ3 shown in FIG. 7 in an enlarged manner.

Referring to FIG. 8, each of the input/output circuits provided in correspondence to the data input/output terminals includes receivers 142 and 143 receiving data from the read data bus RDB, a multiplexer 144 receiving the data from the receivers 142 and 143 and distributing the data in response to which data is outputted first, a latch 148 for four data supplied with the data from the multiplexer 144 for outputting the data on an odd clock edge after a CAS latency, a latch 146 for four data supplied with the data from the multiplexer 144 for outputting the data on an even clock edge after the CAS latency, and an output buffer 150 amplifying the data outputted from the latches 148 and 146 and outputting the amplified data to the terminal.

This input/output circuit further includes an input buffer 152 amplifying data externally supplied to the input/output terminal DQ0, a latch 156 for four data latching the data outputted from the input buffer 152 on the leading edge of the clock, a latch 154 for four data fetching the data outputted from the input buffer 152 on the trailing edge of the clock, and a multiplexer 158 for distributing the data fetched in the latches 154 and 156 for input data to either an even address data bus or an odd address data bus in response to the address when internally transmitting the data. An output of the multiplexer 158 is connected to the write data bus WDB including the even address write data bus and the odd address write data bus.

Figure 9:
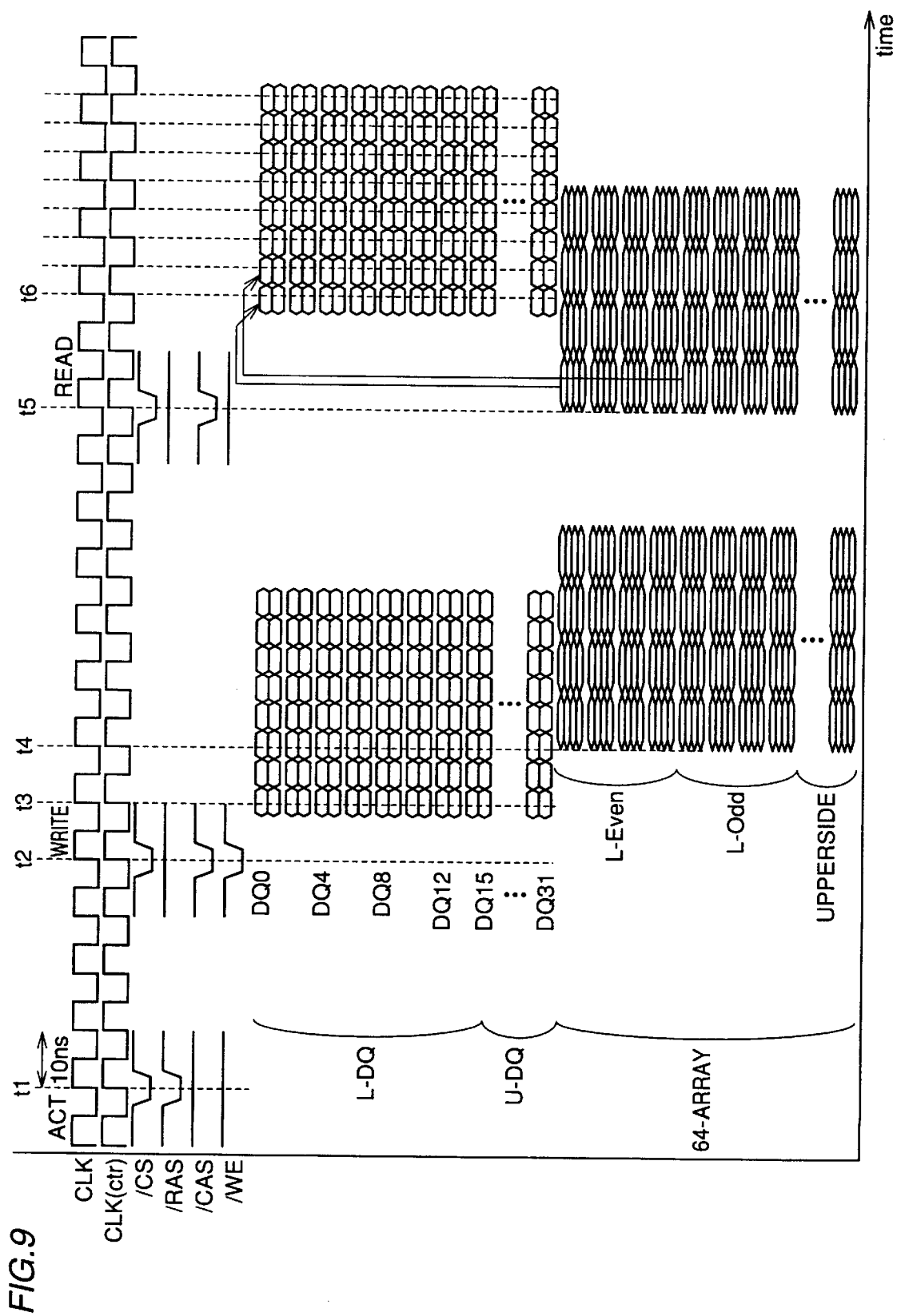
FIG. 9 is a diagram for schematically illustrating data transfer of the synchronous semiconductor memory device 1000 through an input/output circuit part.

FIG. 9 is a diagram for schematically illustrating data transfer of the synchronous semiconductor memory device 1000 through the input/output circuit part.

Referring to FIG. 9, the signal CLK is the externally supplied dock signal, a signal CLK(Ctr) is an internal clock internally generated on the basis of the clock signal CLK for serving as the reference of the operation of the memory array, and the signals ICS, /RAS, /CAS and /VVE are control signals for letting the synchronous semiconductor memory device 1000 recognize commands.

Signals L-DQ are data signals inputted/outputted in/from lower bit sides of the data input/output terminals, i.e., the data input/output terminals DQ0 to DQ15, and signals U-DQ are data signals inputted/outputted in/from upper bit sides of the data input/output terminals, i.e., the data input terminals DQ16 to DQ31.

Signals 64-ARRAY are signals on the data bus inputting/outputting data in/from the input/output circuit part and the internal memory array. Signals L-Even indicate data from areas corresponding to even addresses on lower bit sides of data, and signals L-Odd indicate data from areas corresponding to odd addresses on the lower bit sides of the data.

An active command (ACT) is inputted at a time t1, and a write command (WRITE) is inputted at a time t2.

After a time t3, continuous data of a burst length 8 are inputted in the data input/output terminals DQ0 to DQ31 at a data rate twice the clock CLK.

Two data are fetched in the input/output circuits on the leading edge of the clock CLK at the time t3 and the next trailing edge, and sequentially outputted to the memory array after a time t4. At this time, data externally inputted in 32 bits are reduced half in frequency and doubled in bit number to form 64-bit data, which are simultaneously written in the memory array. In other words, the 32-bit data of the burst length 8 are converted to four data of 64 bits synchronous with the internal clock CLK(ctr) and written in the internal memory array.

At a time t5, a read command is inputted and 64-bit data are simultaneously read from the internal memory array, and the semiconductor memory device outputs 32-bit data of the double data rate after a time t6.

Figure 10:
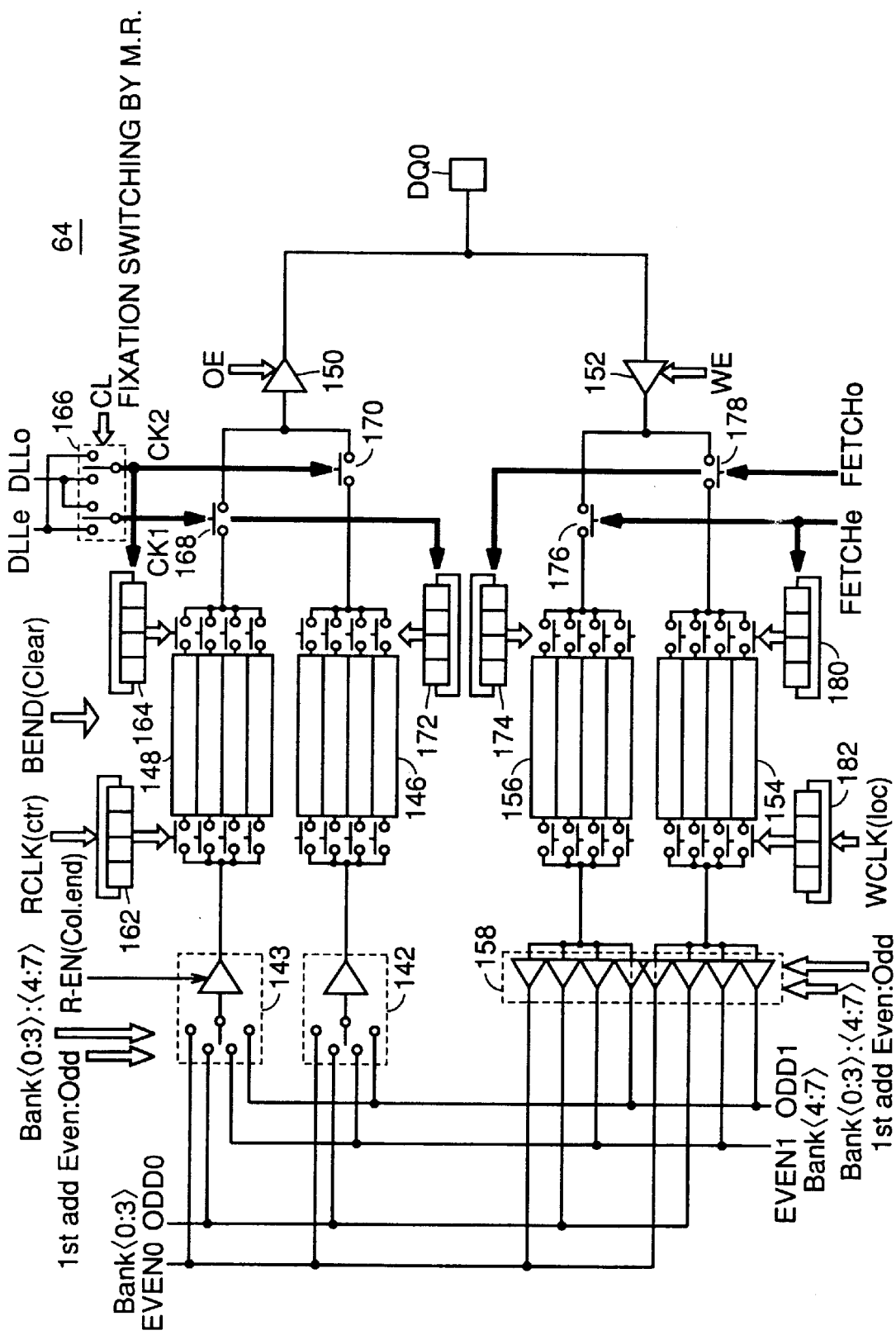
FIG. 10 is a circuit diagram showing the structure of an input/output circuit 64 employed in the embodiment 1.

FIG. 10 is a circuit diagram showing the structure of each input/output circuit 64 employed in the embodiment 1.

Referring to FIG. 10, an address bus EVEN0 is a data bus connected to even address areas of banks 0 to 3, and an address bus ODD0 is a data bus connected to odd address areas of the banks 0 to 3. An address bus EVEN1 is a data bus connected to even address areas of banks 4 to 7, and an address bus ODD1 is a data bus connected to odd address areas of the banks 4 to 7.

The input/output circuit 64 includes the receivers 142 and 143 selecting any one of the address buses EVEN0, ODD0, EVEN1 and ODD1 in response to a selected bank and whether an address corresponding to data outputted first is even or odd and outputting data transmitted from the address bus in response to a receiver activation signal R-EN, a shift register 162 performing a shift operation by a read clock RCLK(ctr) and outputting a select signal, and the latches 146 and 148 fetching the data outputted from the receivers 142 and 143 therein in response to the select signal outputted from the shift register 162.

The input/output circuit 64 further includes a switch 166 receiving culled clocks DLLe and DLLo generated on the basis of a clock DLL generated in a DLL circuit and transmitting the same as data output clocks CK1 and CK2 into the input/output circuit in response to the CAS latency and setting of the mode register, a shift register 164 shifting data in response to the output clock CK2, and a shift register 172 shifting data in response to the output clock CK1. The latches 146 and 148 select and output latched data in response to outputs of the shift registers 172 and 164 respectively.

The input/output circuit 64 further includes the output buffer 150 activated by an enable signal OE for outputting data to the terminal DQ0, a switch 168 supplying the output of the latch 148 to the output buffer 150 in response to activation of the output clock CK1, and a switch 170 supplying the output of the latch 146 to the output buffer 150 in response to activation of the output clock CK2.

The input/output circuit 64 further includes the input buffer 152 receiving data externally inputted in the terminal DQ0 as an input and amplifying the same in response to an enable signal WE, switches 176 and 178 internally transmitting an output of the input buffer 152 in response to signals FETCHe and FETCHo internally generated in response to an externally inputted strobe signal respectively, a shift register 174 receiving the signal FETCHo as a shift clock and outputting a select signal, a shift register 180 receiving the signal FETCHe as a shift clock and outputting a select signal, the latch 156 fetching the signal transmitted through the switch 176 in response to the select signal outputted from the shift register 174, and the latch 154 fetching the signal transmitted by the switch 178 in response to the select signal outputted from the shift register 180.

The input/output circuit 64 further includes a shift register 182 receiving a write clock WCLK(loc) as a shift clock and outputting a select signal, and a bus driver 158 receiving the data outputted from the latches 154 and 156 in response to the select signal outputted from the shift register 182. The bus driver 158 distributes and outputs data to the data buses EVEN0, ODD0, EVEN1 and ODD1 in response to the bank for writing the received data and whether an address (first address) for writing externally received data first is even or odd.

Briefly stated, either data received from the even address areas and the odd address areas of the banks 0 to 3 or those received from the even address areas and the odd address areas of the banks 4 to 7 are distinguished and fetched in four-point switch parts provided on input parts of the receivers 142 and 143.

A signal distinguishing upper (4 to 7)/lower (0 to 3) banks and a signal indicating whether or not a first address in burst reading is even or odd are inputted therein. The path provided with the receiver 143, the latch 148 and the switch 168 is that for data outputted first, and the path provided with the receiver 142, the latch 146 and the switch 170 is that for outputting second data. Data passed through the switches of the input parts of the receivers 143 and 142 are amplified by an amplifier and transferred to selector parts of input parts of the latches 148 and 146. The selectors select one of four paths included in the latches. This selection of the path is sequentially shifted in response to the read internal clock RCLK(ctr), and inputted data are sequentially latched.

The data stored in the latches are outputted with reference to a clock different from that when inputted in the latches. Selection paths on output sides of the latches are shifted by the select signals outputted from the shift registers 164 and 172 performing shift operations in response to the output side clocks DLLe and DLLo. The latch 148 stores odd output data, while the latch 146 stores even output data. Therefore, which one of the clocks DLLe and DLLo is inputted in the switch 168 as a control signal is decided in response to the latency from the read dock RCLK(ctr) recognizing the read command to data output, and the remaining clock is inputted in the switch 170 as a control signal. If the latency is 1.5, for example, the clock DLLo is inputted in the switch 168 as a control signal, and the clock DLLe is inputted in the switch 170 as a control signal.

In writing, data externally inputted first is unconditionally transferred to the latch 156, data inputted next is unconditionally transferred to the latch 154, and subsequent data are alternately transferred to the latches 156 and 154.

The latched data are transmitted to the bus driver 158 in response to the write internal clock WCLK(loc). The bus driver 158 outputs the data to the corresponding data bus in response to the bank address and the first address of burst data.

While FIG. 10 shows the circuit structure of the input/output circuit, a data input part employed as a data mask in writing may conceivably be driven with the same margin through the same type of circuit. While only a circuit on a data input side is available in this case, an output circuit may be dummy-arranged although not driven, in order to attain capacitance balance.

This also applies to a strobe terminal related to data output. While only a circuit on a data output side is available in this case, an input circuit may be dummy-arranged although not driven, in order to attain capacitance balance.

These circuits may be combined. The same bus is employable if a strobe of output data and input of write mask data do not collide. In this case, a circuit for the strobe of the output data can be allocated to the output side while a circuit for the mask data can be allocated to the input side in the same circuit structure as the input/output circuit employed for the data input/output terminal DQ.

Figure 11:
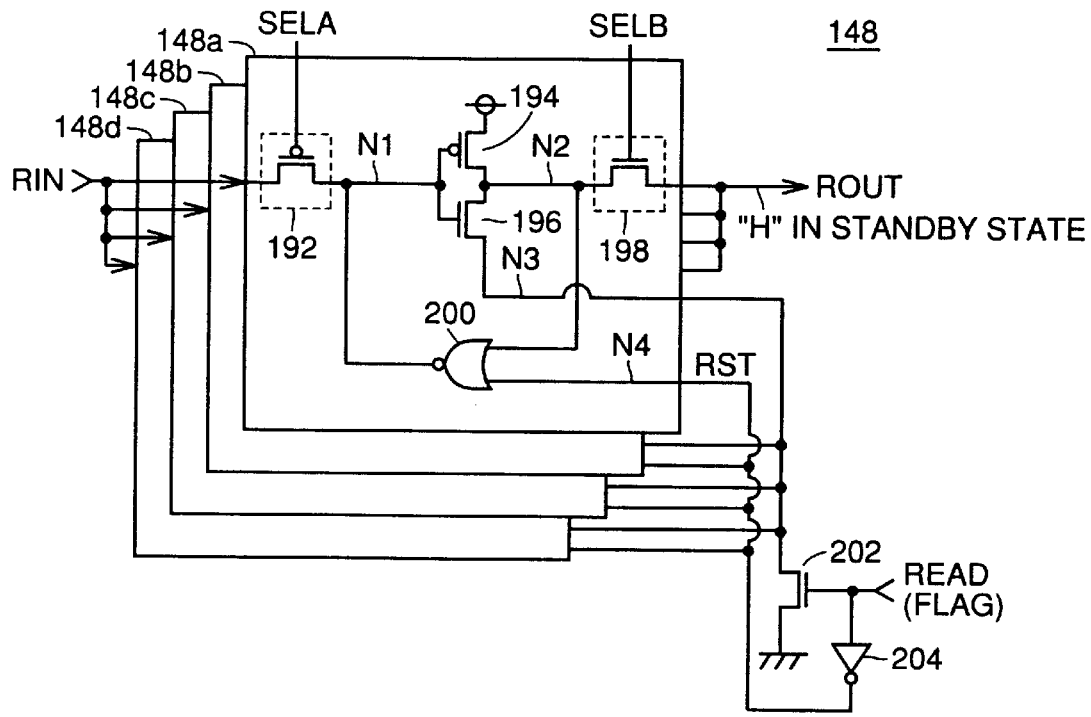
FIG. 11 is a circuit diagram showing the structure of a latch 148 holding data in reading shown in FIG. 10.

FIG. 11 is a circuit diagram showing the structure of the latch 148 holding data in reading shown in FIG. 10.

Referring to FIG. 11, the latch 148 includes four latches 148*a* to 148*d* receiving, fetching and holding data RIN read from the memory array and outputting the same as an output signal ROUT. The latch 148*a* includes a P-channel MOS transistor 192 supplying the input signal RIN to an internal node N1 in response to activation of a select signal SELA, a P-channel MOS transistor 194 having a source coupled to a power supply potential, a gate connected to a node N1 and a drain connected to a node N2, an N-channel MOS transistor 196 having a gate connected to the node N1, a source connected to a node N3 and a drain connected to the node N2, an N-channel MOS transistor 198 supplying the potential of the node N2 as the output signal ROUT to outside the latch in response to activation of a select signal SELB, and a NOR circuit 200 having an input connected with the nodes N2 and N4 and an output connected with the node N1.

The latches 148*b*, 148*c* and 148*d* are similar in structure to the latch 148*a*, and therefore description is not repeated.

The latch 148 further includes an N-channel MOS transistor 202 provided in common for the latches 148*a* to 148*d* for coupling the node N3 with a ground potential in response to activation of a read flag READ(FLAG), and an invertor 204 inverting the read flag READ(FLAG) when inactive and outputting and supplying a reset signal to the node N4.

The transistors 194 and 196 employed in the latch have low threshold voltages for attaining a high-speed operation with a low voltage, while the N-channel MOS transistor 202 has a high threshold voltage for suppressing subthreshold currents flowing in the transistors 194 and 196 when no read operation is performed.

The latch 146 shown in FIG. 10 is similar in structure to the latch 148, and therefore description is not repeated.

Figure 12:
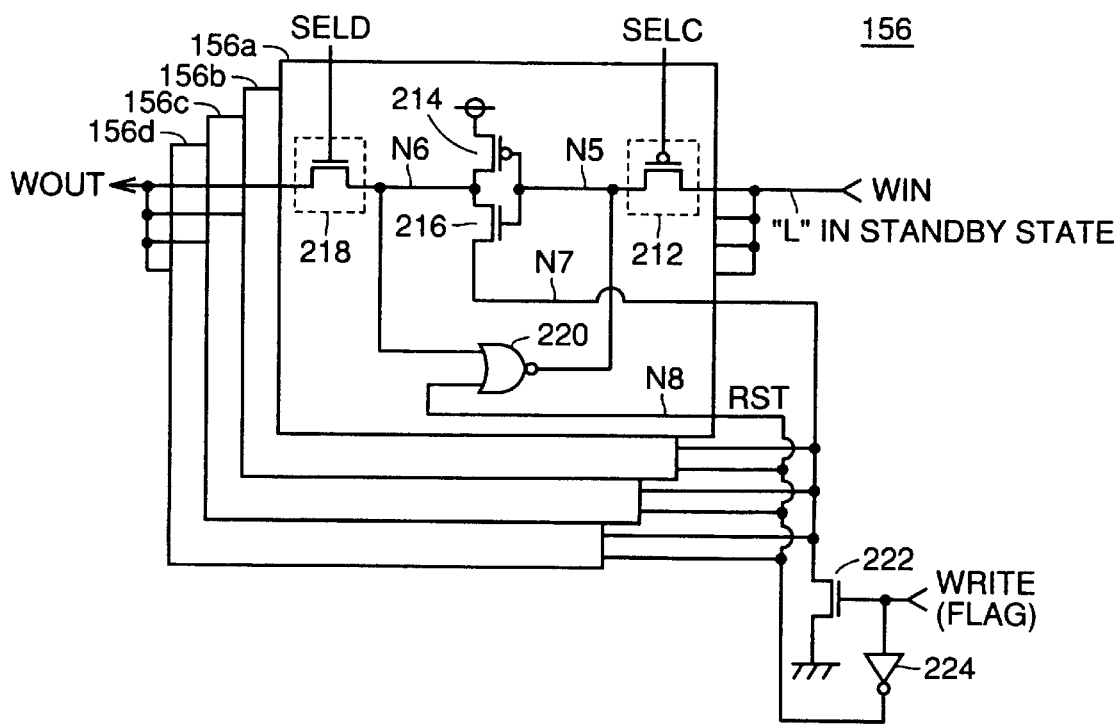
FIG. 12 is a circuit diagram showing the structure of a latch circuit 156 holding data in data writing shown in FIG. 10.

FIG. 12 is a circuit diagram showing the structure of the latch circuit 156 holding data in data writing shown in FIG. 10.

Referring to FIG. 12, the latch circuit 156 includes four latches 156a to 156d receiving and holding a data signal WIN inputted in the data input/output terminal and outputting the same to the memory array as an output signal WOUT.

The latch 156a includes a P-channel MOS transistor 212 supplying the input signal WIN to a node N5 in response to activation of a select signal SELC, a P-channel MOS transistor 214 having a gate connected to the node N5, a source coupled to a power supply potential and a drain connected to a node N6, an N-channel MOS transistor 216 having a gate connected to the node N5 and a drain and a source connected to the node N6 and a node N7 respectively, and an N-channel MOS transistor 218 supplying the potential of the node N6 as the output signal WOUT in response to activation of a select signal SELD. The latch 156a further includes a NOR circuit 220 having an input connected with the node N6 and a node N8 and an output connected with the node N5.

The latches 156b, 156c and 156d are similar in structure to the latch 156a, and therefore description is not repeated.

The latch 156 further includes an N-channel MOS transistor 222 provided in common for the latches 156a to 156d for coupling the node N7 to a ground potential in response to activation of a write flag WRITE(FLAG), and an invertor 224 inverting the write flag WRITE(FLAG) when inactive and supplying the same to the node N8 as a reset signal.

The transistors 214 and 216 employed in the latch have low threshold voltages for attaining a high-speed operation with a low voltage, while the N-channel MOS transistor 222 has a high threshold voltage for suppressing subthreshold currents flowing in the transistors 214 and 216 when no write operation is performed.

The latch 154 shown in FIG. 10 is similar in structure to the latch 156, and therefore description is not repeated.

Referring to FIGS. 11 and 12, input sides of the latches 148 and 156 are reset low and output sides are reset high by the reset signals when not operated. Therefore, the conductivity types of the MOS transistors employed as transfer gates are changed.

The MOS transistors for the transfer gates have low threshold voltages for increasing the operating speed. P-channel transistors are employed for the input sides of the latches since input nodes go low, while N-channel transistors are employed for the output sides since output nodes are at high levels. At this time, gate potentials for node potentials of the latches in a standby state, i.e., the gate-to-source voltages are negative and hence leakage currents are hardly generated in the respective transistors despite the low threshold voltages (although not illustrated, the output nodes and the input nodes in resetting are controlled by front and rear circuit parts).

As described above, subthreshold currents in the standby state can be suppressed by resetting the latches in termination of the burst operation in reading or writing of the data and separating the invertors from the ground potential by the N-channel MOS transistors having high threshold voltages provided on the ground sides of the invertor parts in common.

While the input nodes of the invertors are reset low by the NOR circuits in FIGS. 11 and 12, the input nodes may alternatively be reset high. In this case, P-channel MOS transistors having large absolute values of the threshold voltages are provided on power supply node sides of the invertors and the conductivity types of the MOS transistors of the transfer gates inputting/outputting data in/from the latches are selected in response to the reset logic.

Figure 13:
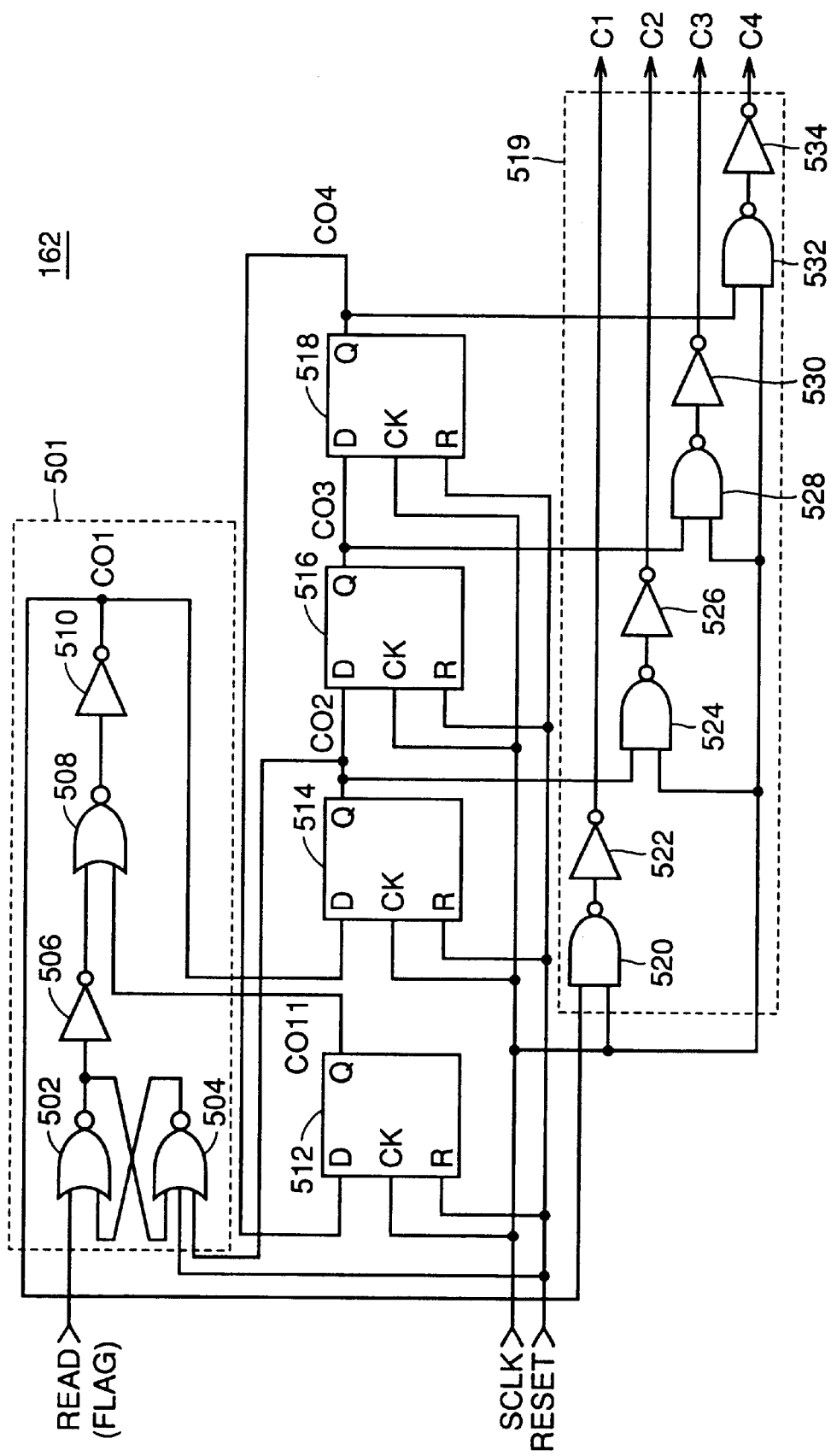
FIG. 13 is a circuit diagram showing the structure of a shift register 162 shown in FIG. 10.

FIG. 13 is a circuit diagram showing the structure of the shift register 162 shown in FIG. 10.

Referring to FIG. 13, the shift register 162 includes a pulse generation circuit 501 receiving the read flag READ (FLAG), a reset signal RESET, an internal signal CO2 and an internal signal CO11 and generating an internal signal CO1, a flip-flop 514 receiving the internal signal CO1 in an input node D and outputting the internal signal CO2 from an output node Q, a flip-flop 516 receiving the internal signal CO2 in an input node D and outputting an internal signal CO3 from an output node Q, a flip-flop 518 receiving the internal signal CO3 in an input node D and outputting an internal signal CO4 from an output node Q, a flip-flop 512 receiving the internal signal CO4 in an input node D and outputting the internal signal CO11 from an output node Q, and an output circuit 519 receiving the internal signals CO1, CO2, CO3 and CO4 and a clock signal SCLK and outputting select signals C1, C2, C3 and C4.

The clock signal SCLK is inputted in clock nodes CK of the flip-flops 512, 514, 516 and 518 as a shift clock, while the reset signal RESET is inputted in reset input nodes R.

The pulse generation circuit 501 includes a NOR circuit 502 receiving the read flag READ(FLAG) in one input, a three-input NOR circuit 504 receiving an output of the NOR circuit 502, the reset signal RESET and the internal signal CO2 in its input and outputting NOR to another input node of the NOR circuit 502, an invertor 506 receiving and inverting the output of the NOR circuit 502, a NOR circuit 508 receiving an output of the invertor 506 and the internal signal CO11, and an invertor 510 receiving and inverting an output of the NOR circuit 508 and outputting the internal signal CO1.

The output circuit 519 includes a NAND circuit 520 receiving the internal signal CO1 and the clock signal SCLK, an invertor 522 receiving and inverting an output of the NAND circuit 520 and outputting the select signal C1, a NAND circuit 524 receiving the internal signal CO2 and the clock signal SCLK, an invertor 526 receiving and inverting an output of the NAND circuit 524 and outputting the select signal C2, a NAND circuit 528 receiving the internal signal CO3 and the clock signal SCLK, an invertor 530 receiving and inverting an output of the NAND circuit 528 and outputting the select signal C3, a NAND circuit 532 receiving the internal signal CO4 and the clock signal SCLK, and an invertor 534 receiving and inverting an output of the NAND circuit 532 and outputting the select signal C4.

Figure 14:
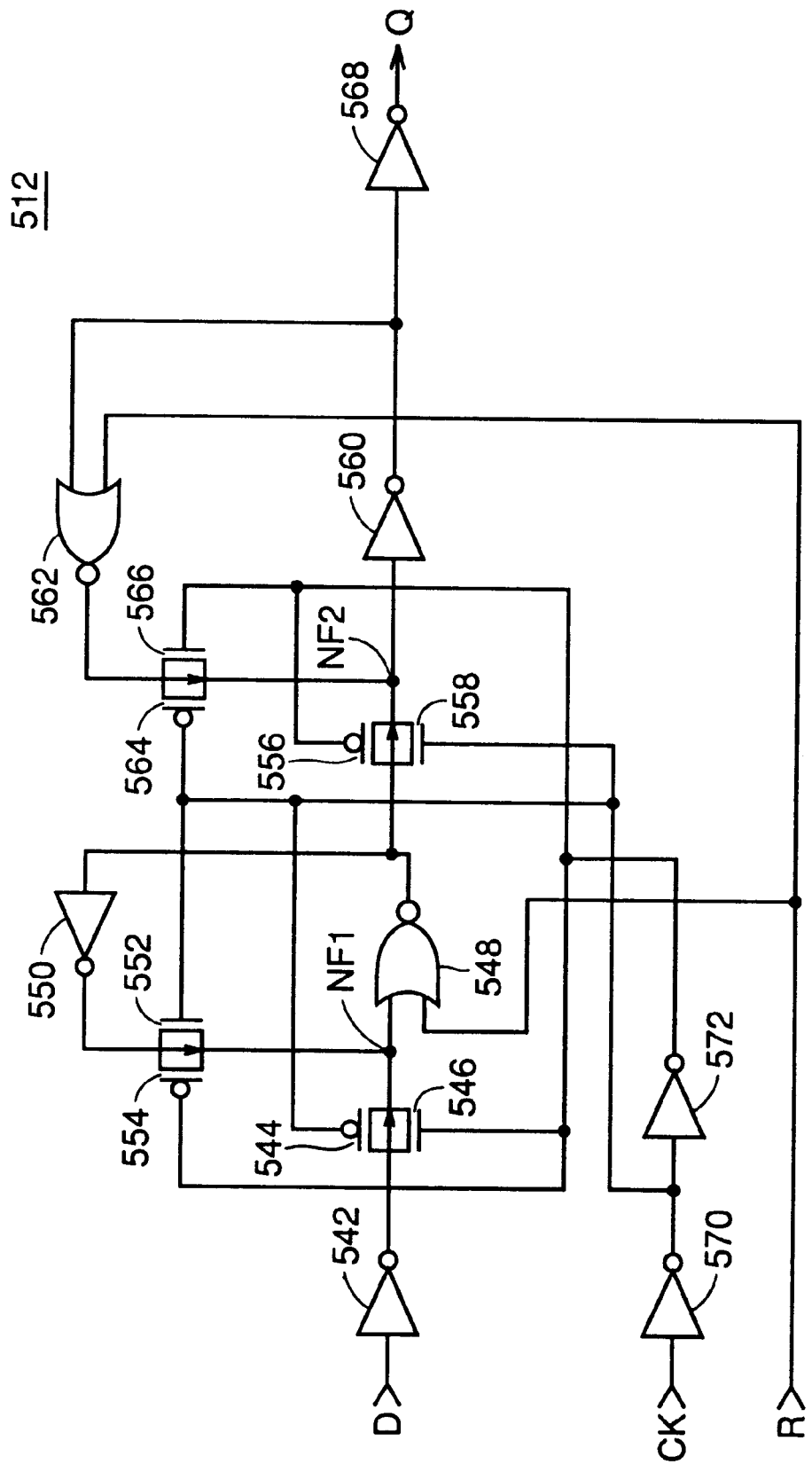
FIG. 14 is a circuit diagram showing the structure of a flip-flop 512 shown in FIG. 13.

FIG. 14 is a circuit diagram showing the structure of the flip-flop 512 shown in FIG. 13.

Referring to FIG. 14, the flip-flop 512 includes an invertor 570 having an input connected with the clock node CK, an invertor 572 receiving and inverting an output of the invertor 570, an invertor 542 having an input connected with the input node D, a P-channel MOS transistor 544 and an N-channel MOS transistor 546 connected in parallel between an output node of the invertor 542 and a node NF1, a NOR circuit 548 having an input connected with the node NF1 and a reset input node R, an invertor 550 receiving and inverting an output of the NOR circuit 548, and a P-channel MOS transistor 554 and an N-channel MOS transistor 552 connected in parallel between an output node of the invertor 550 and the node NF1.

Gates of the P-channel MOS transistor 544 and the N-channel MOS transistor 552 receive the output of the invertor 570. Gates of the N-channel MOS transistor 546 and the P-channel MOS transistor 554 receive the output of the invertor 572.

The flip-flop 512 further includes a P-channel MOS transistor 556 and an N-channel MOS transistor 558 connected in parallel between an output node of the NOR circuit 548 and a node NF2, an invertor 560 having an input connected with the node NF2, a NOR circuit 562 having an input connected with an output node of the invertor 560 and the reset input node R, a P-channel MOS transistor 564 and an N-channel MOS transistor 566 connected in parallel between an output node of the NOR circuit 562 and the node NF2, and an invertor 568 receiving and inverting an output of the invertor 560 and outputting the result of inversion to the output node Q.

Gates of the P-channel MOS transistor 556 and the N-channel MOS transistor 566 receive the output of the invertor 572. Gates of the N-channel MOS transistor 558 and the P-channel MOS transistor 564 receive the output of the invertor 570.

The flip-flops 514, 516 and 518 shown in FIG. 13 are similar in structure to the flip-flop 512, and therefore description is not repeated.

The operation of the shift register 162 is now briefly described.

In an initial state, data held by the flip-flops 512 to 518 are cleared by the reset signal RESET. Then, the read flag READ(FLAG) is inputted and the internal signal CO1 rises to a high level.

When the clock signal SCLK is inputted, the internal signal CO1 is fetched in the flip-flop 514 and the internal signal CO2 rises to a high level. At the same time, the pulse generation circuit 501 is reset by the internal signal CO2 and the internal signal CO1 falls to a low level. Thereafter the high level of the internal signal CO2 is sequentially transmitted by the flip-flops 516, 518, 512 and 514. In other words, any one of the internal signals CO1, CO2, CO3 and CO4 is at a high level and this high-level signal is sequentially shifted in synchronization with the edge of the clock signal SCLK.

The internal signals CO1, CO2, CO3 and CO4 are pulses having the width of one clock cycle, and hence signals having the pulse width of the clock signal SCLK are outputted for the select signals C1, C2, C3 and C4 by ANDing the same with the clock signal by the output circuit 519, and these signals are sequentially shifted.

The shift registers 164, 172, 174, 182 and 180 shown in FIG. 10 are similar in structure to the shift register 162, and therefore description is not repeated.

Read Test in Embodiment 1

Data reading in an operation test in the case of including the input/output circuit described with reference to the embodiment 1 is now described.

If the number of observation terminals connected to a tester can be reduced while the observed data rate can be reduced in the operation test, measurement is enabled with a tester of low performance and the cost for the test can be reduced.

Figure 15:
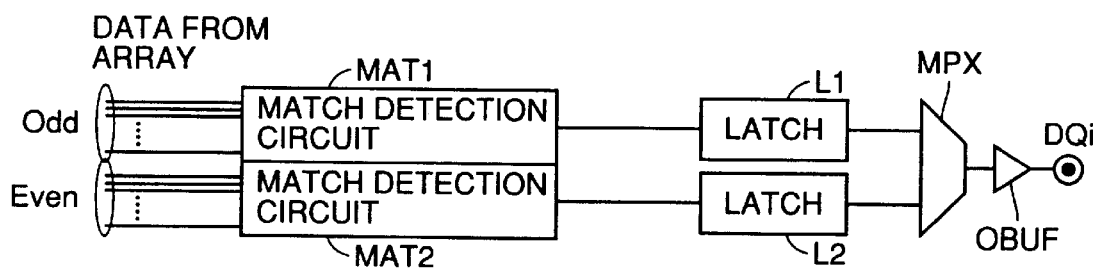
FIG. 15 is a conceptual diagram for illustrating the concept of a data read test in the embodiment 1.

FIG. 15 is a conceptual diagram for illustrating the concept of a data read test in the embodiment 1.

Referring to FIG. 15, the input/output circuit part is provided with a match detection circuit MAT1 receiving data from an odd address area of the memory array, a latch L1 receiving an output of the match detection circuit MAT1, a match detection circuit MAT2 receiving data from an even address area of the memory array, a latch L2 receiving an output of the match detection circuit MAT2, a multiplexer MPX receiving outputs of the latches L1 and L2 and alternately outputting data from the latches L1 and L2 in response to the clock signal, and a buffer circuit OBUF receiving and amplifying the output of the multiplexer MPX and outputting the amplified output to a terminal DQi.

Figure 16:
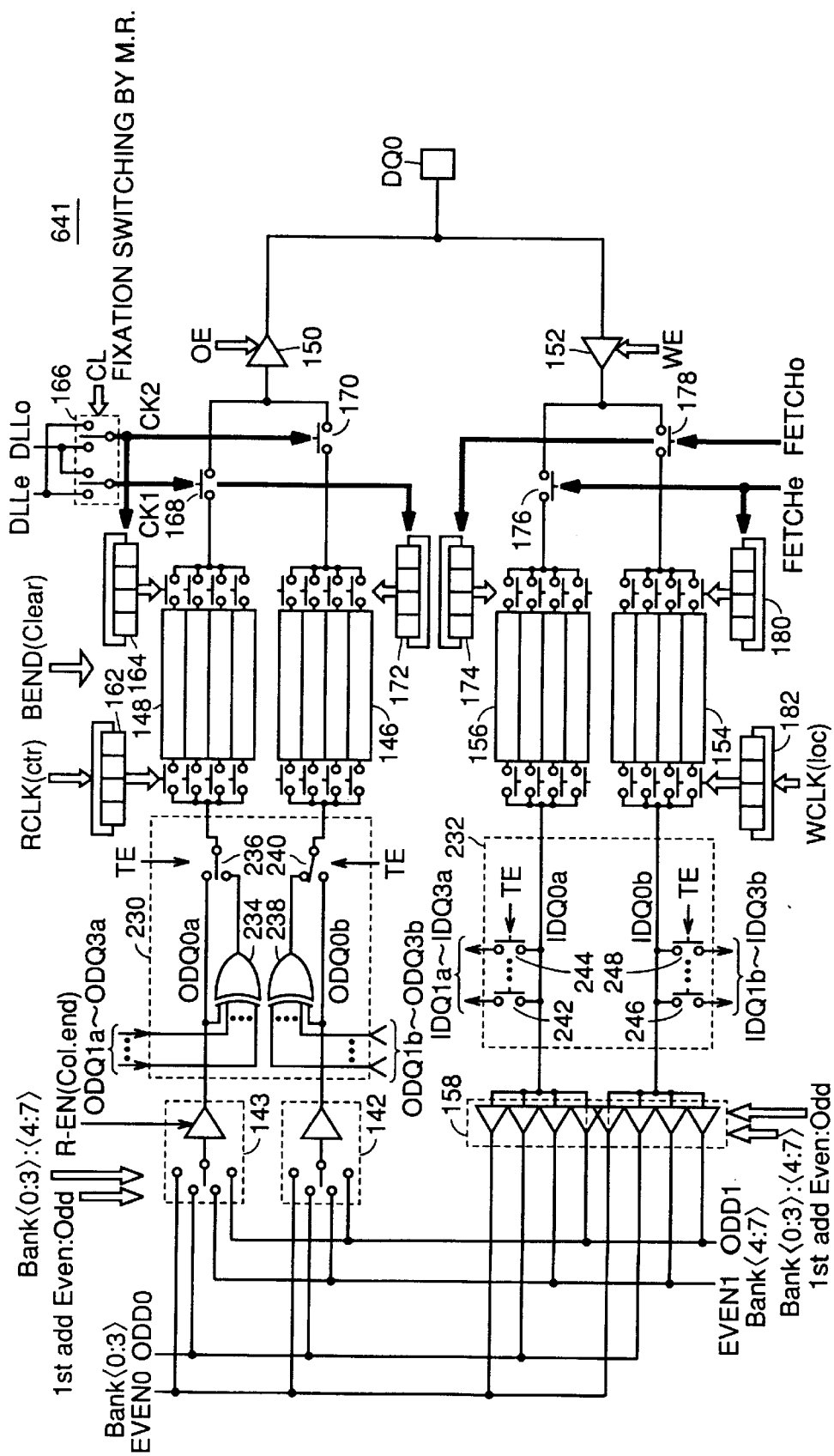
FIG. 16 is a circuit diagram showing the structure of a more detailed input/output circuit 641 corresponding to FIG. 15.

FIG. 16 is a circuit diagram showing the structure of a more detailed input/output circuit 641 corresponding to FIG. 15.

Referring to FIG. 16, the input/output circuit 641 further includes a match detection circuit 230 receiving and compressing the outputs of the receivers 143 and 142 and outputting the same to the latches 148 and 146 respectively as well as an output circuit 232 supplying the outputs of the latches 156 and 154 to an input/output circuit provided in correspondence to another terminal in the test, dissimilarly to the input/output circuit 64 shown in FIG. 10. The remaining structure is similar to that of the input/output circuit 64, and therefore description is not repeated.

The match detection circuit 230 includes an EXOR circuit 234 receiving signals ODQ0$a$ to ODQ3$a$, a switching circuit 236 supplying the signal ODQ0$a$ to the latch 148 in an normal operation while supplying an output of the EXOR circuit 234 to the latch 148 in the test operation, an EXOR circuit 238 receiving signals ODQ0$b$ to ODQ3$b$ in its input, and a switching circuit 240 supplying the signal ODQ0$b$ to the latch 146 in the normal operation while supplying an output of the EXOR circuit 238 to the latch 146 in the test operation. The signals ODQ1$a$ to ODQ3$a$ are output signals from the receivers 143 of the input/output circuits 64 provided in correspondence to the data terminals DQ1 to DQ3 respectively. The signals ODQ1$b$ to ODQ3$b$ are output signals from the receivers 142 included in the input/output circuits 64 provided in correspondence to the data terminals DQ1 to DQ3 respectively.

The output circuit 232 includes switching circuits 242 to 244 supplying a signal IDQ0$a$ as signals IDQ1$a$ to IDQ3$a$ in the test operation and switching circuits 246 to 248 supplying a signal IDQ0$b$ as signals IDQ1$b$ to IDQ3$b$.

The signal IDQ0$a$ is an output signal from the latch 156 of the input/output circuit 641 provided in correspondence to the data terminal DQ0, and the signals IDQ1$a$ to IDQ3$a$ are input signals of the bus drivers 158 in the input/output circuits 64 provided in correspondence to the data terminals DQ1 to DQ3 respectively. The signal IDQ0$b$ is an output signal of the latch 154 included in the input/output circuit 641 provided in correspondence to the data terminal DQ0, and the signals IDQ1$b$ to IDQ3$b$ are input signals of the bus drivers 158 in the input/output circuits 64 provided in correspondence to the data terminals DQ1 to DQ3 respectively.

Figure 17:
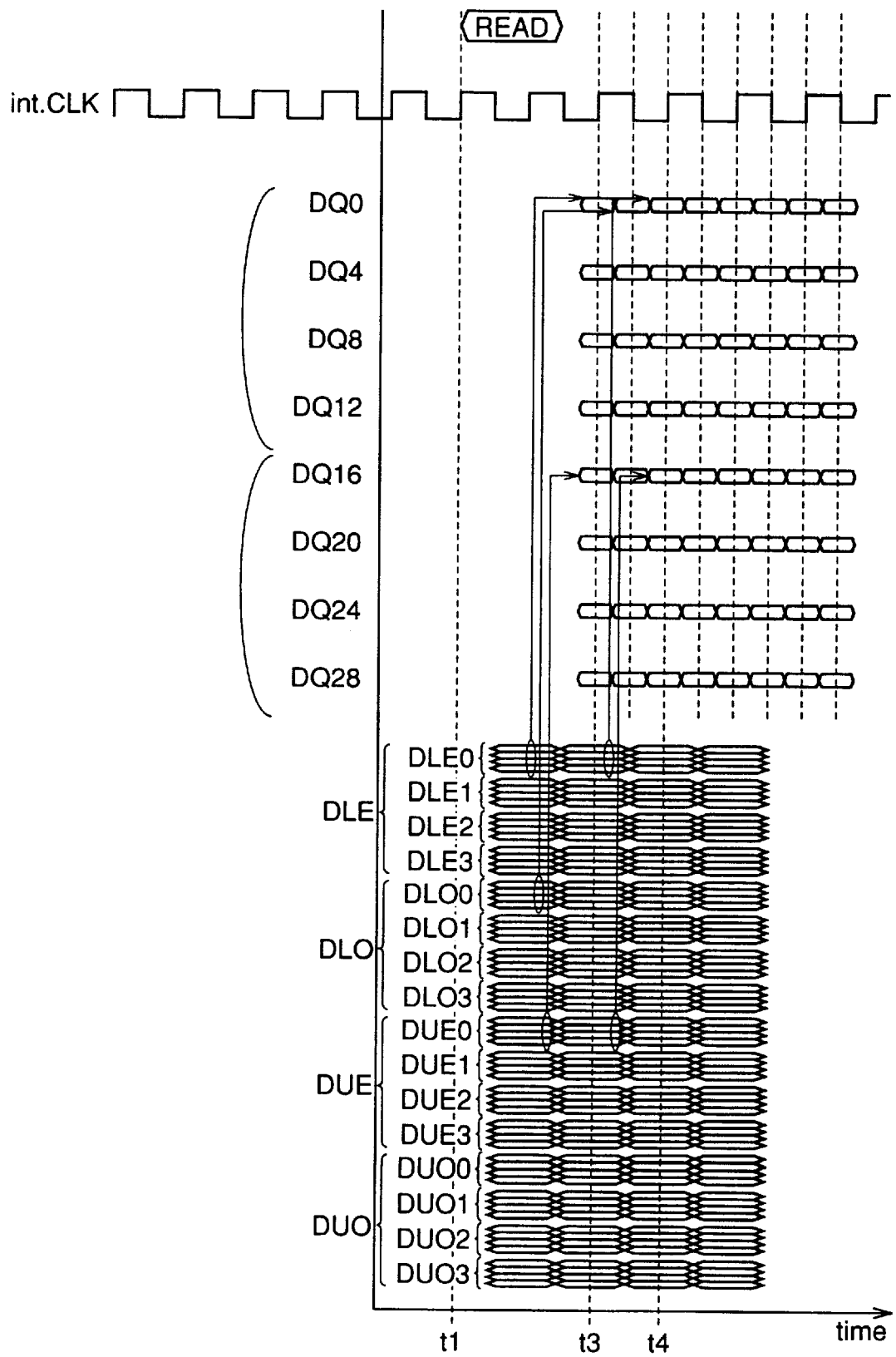
FIG. 17 is an operating waveform diagram showing the operation of the data read test in the embodiment 1.

FIG. 17 is an operating waveform diagram for illustrating the operation in the data read test of the embodiment 1.

Referring to FIG. 17, the read command is inputted at a time t1 and data read from the data input/output terminals DQ0, DQ4, DQ8, DQ12, DQ16, DQ20, DQ24 and DQ28 respectively are outputted.

At a time t3, data DLE0 of an even address area read on the data input/output terminals DQ0 to DQ3 in the normal operation is compressed in the match detection circuit and outputted from the data input/output terminal DQ0.

After 0.5 clocks, data DLO0 of an odd address area outputted to the data input/output terminals DQ0 to DQ3 in the normal operation is compressed in the match detection circuit and outputted from the data input/output terminal DQ0. Similarly, data outputted to data input/output terminals DQ(4i+1), DQ(4i+2) and DQ(4i+3) in the normal operation is compressed and outputted from another data input/output terminal DQ(4i) (i: natural number of 1 to 7). Thereafter data of odd address areas and even address areas are alternately read.

By employing the aforementioned structure, the number of data input/output terminals necessary for monitoring data output can be reduced and the number of channels employed by a tester in testing of the semiconductor memory device can be reduced. Therefore, the cost for testing the semiconductor memory device can be reduced.

Figure 18:
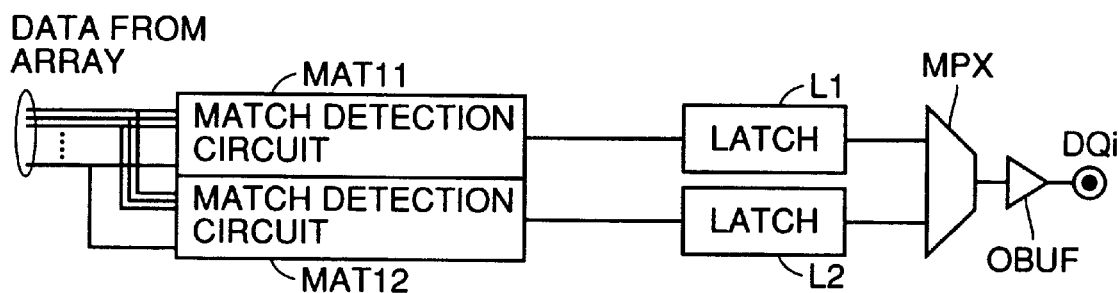
FIG. 18 is a conceptual diagram for illustrating the operation of the read test in the embodiment 1.

FIG. 18 is a conceptual diagram showing a structure for further improving a defective detection ratio in the read test in the embodiment 1.

Referring to FIG. 18, the structure is different from that shown in FIG. 15 in a point that the same includes match detection circuits MAT11 and MAT12 in place of the match detection circuits MAT1 and MAT2 in the embodiment 1. The remaining structure is similar to that shown in FIG. 15 and hence redundant description is omitted.

Figure 19:
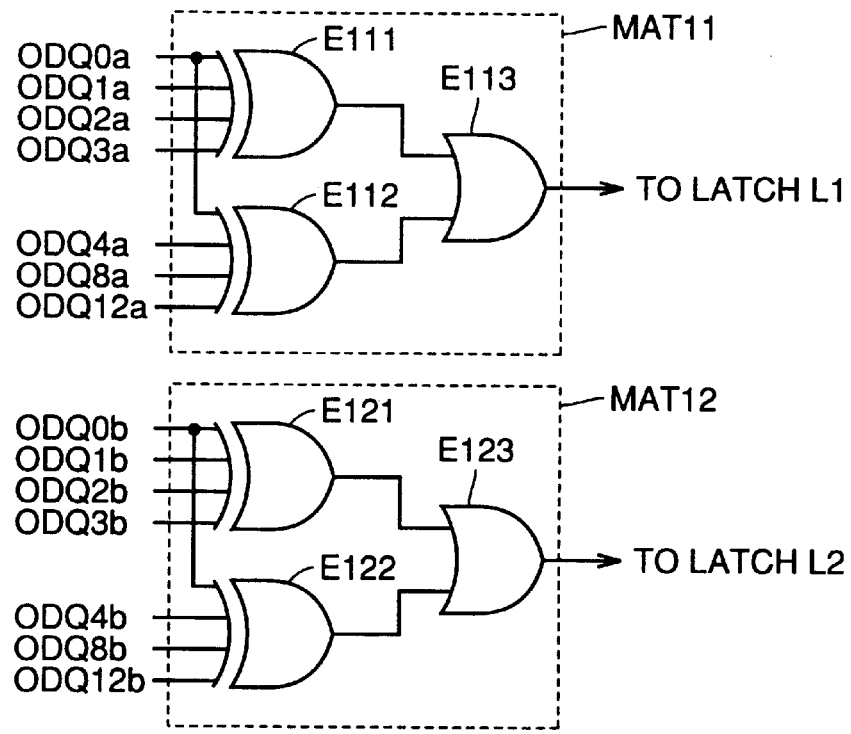
FIG. 19 is a circuit diagram showing the structure of match detection circuits MAT11 and MAT12 shown in FIG. 18.

FIG. 19 is a circuit diagram showing the structures of the match detection circuits MAT11 and MAT12 shown in FIG. 18.

Referring to FIG. 19, the match detection circuit MAT11 includes an EXOR circuit E111 receiving the signals ODQ0a to ODQ3a, an EXOR circuit E112 receiving the signals ODQ0a, ODQ4a, ODQ8a and ODQ12a, and an OR circuit E113 receiving outputs of the EXOR circuits E111 and E112. An output of the OR circuit E113 is outputted to the latch L1 shown in FIG. 18.

The match detection circuit MAT12 includes an EXOR circuit E121 receiving the signals ODQ0b to ODQ3b, an EXOR circuit E122 receiving the signals ODQ0b, ODQ4b, ODQ8b and ODQ12b, and an OR circuit E123 receiving outputs of the EXOR circuits E121 and E122. An output of the OR circuit E123 is outputted to the latch L2 shown in FIG. 18.

A signal ODQia is an output signal of the receiver 143 included in the input/output circuit 64 provided in correspondence to the data input/output terminal DQi, and a signal ODQib is an output signal of the receiver 142 (i=0 to 12).

When all data read from the data input terminals DQ0 to DQ3 output erroneous values, for example, the match detection circuits according to the embodiment 1 detect match and determine that normal reading has been executed.

When the circuits shown in FIG. 19 are employed, match results of the data outputted to the adjacent data input/output terminals (DQ0 to DQ3) are confirmed while match of the data outputted to the non-adjacent data terminals (DQ0, DQ4, DQ8 and DQ12) is also confirmed for outputting a low level when match is confirmed in both cases. Therefore, the probability of making erroneous determination is remarkably reduced as compared with the match detection circuits in the embodiment 1.

Modification 1 of Embodiment 1

Figure 20:
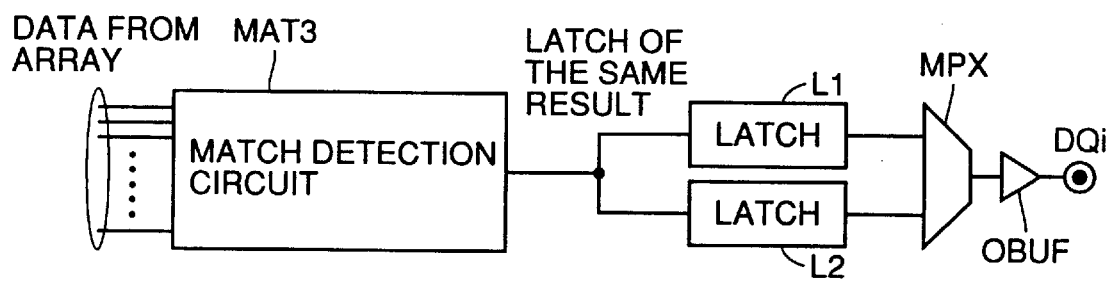
FIG. 20 is a conceptual diagram showing the concept of a read test in a modification 1 of the embodiment 1.

FIG. 20 is a conceptual diagram showing the concept of a read test in a modification 1 of the embodiment 1.

Referring to FIG. 20, a match detection circuit MAT3 receiving a plurality of read data from a memory array and detecting match is provided and an output of the match detection circuit MAT3 is inputted in latches L1 and L2 in the modification 1 of the embodiment 1, dissimilarly to the structure shown in FIG. 15. The remaining structure is similar to that shown in FIG. 15, and therefore description is not repeated.

Figure 21:
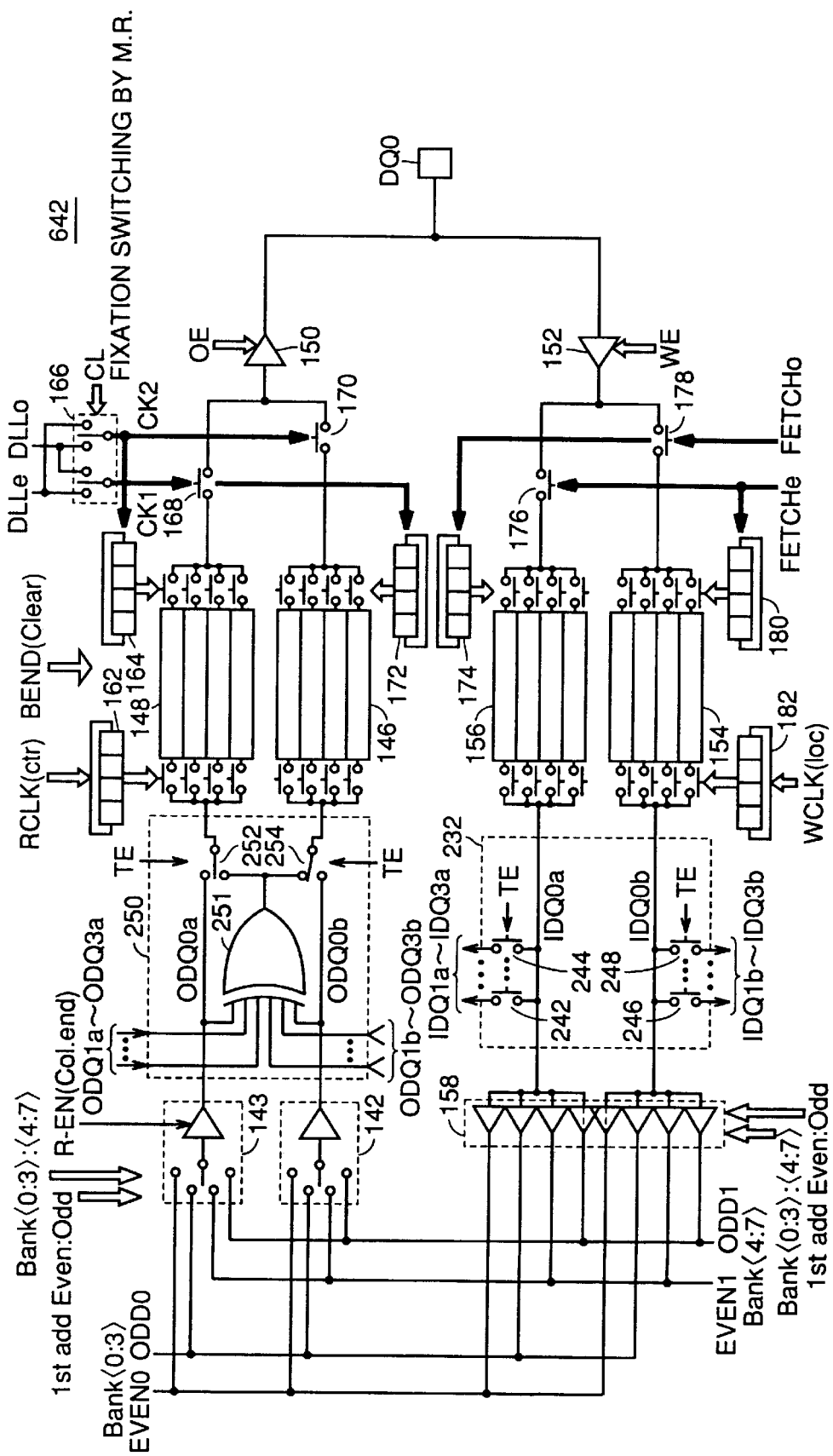
FIG. 21 is a circuit diagram showing the structure of an input/output circuit 642 in the modification 1 of the embodiment 1.

FIG. 21 is a circuit diagram showing the structure of an input/output circuit 642 in the modification 1 of the embodiment 1.

Referring to FIG. 21, the input/output circuit 642 includes a match detection circuit 250 in place of the match detection circuit 230, dissimilarly to the input/output circuit 641 shown in FIG. 16. The remaining structure is similar to that of the input/output circuit 641, and therefore description is not repeated.

The match detection circuit 250 includes an EXOR circuit 251 receiving signals ODQ0a to ODQ3a and ODQ0b to ODQ3b, a switching circuit 252 supplying the signal ODQ0a to a latch 148 in an normal operation while supplying an output of the EXOR circuit 251 to the latch 148 in a test operation, and a switching circuit 254 supplying the signal ODQ0b to a latch 146 in the normal operation while supplying the output of the EXOR circuit 251 to the latch 146 in the test operation.

Figure 22:
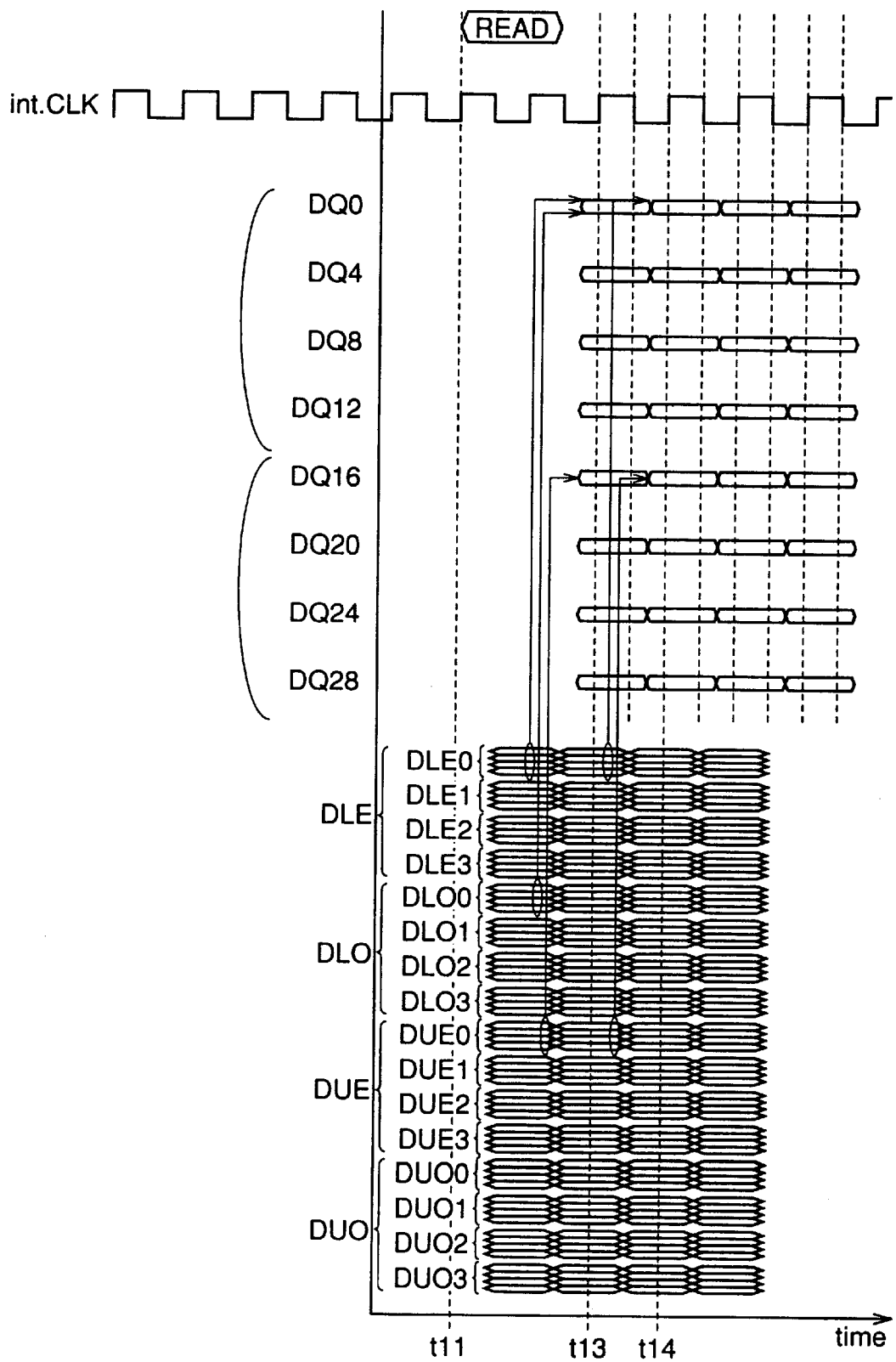
FIG. 22 is an operating waveform diagram for illustrating the operation of the read test in the modification 1 of the embodiment 1.

FIG. 22 is an operating waveform diagram for illustrating the operation in the read test in the modification 1 of the embodiment 1.

Referring to FIGS. 21 and 22, a read command is inputted at a time t11 and thereafter data input/output terminals DQ0, DQ4, DQ8, DQ12, DQ16, DQ20, DQ24 and DQ28 output read data respectively after a time t3. As these data, results obtained by attaining match of all data of even and odd address areas outputted in correspondence to the data input/output terminals DQ0 to DQ3 by the EXOR circuit 251 are outputted. Therefore, the data output rate is reduced to half as compared with the case described with reference to FIG. 17.

By employing the aforementioned structure, the number of observation terminals connected to a tester can be reduced. Therefore, the number of chips measurable with a single tester can be increased to reduce the test cost. Further, the data rate of observed data can be reduced to enable testing by a tester having relatively low performance.

Modification 2 of Embodiment 1

The input/output circuit 641 according to the embodiment 1 shown in FIG. 16 determines match of the data outputted to the data input/output terminals DQ0 to DQ3 in the normal operation in the EXOR circuit in the test operation, to output the same. However, the data are not compared with expected values but merely the read data are compared with each other, and hence the EXOR circuit outputs the same values as those in a normal state if all read data are erroneous.

Figure 23:
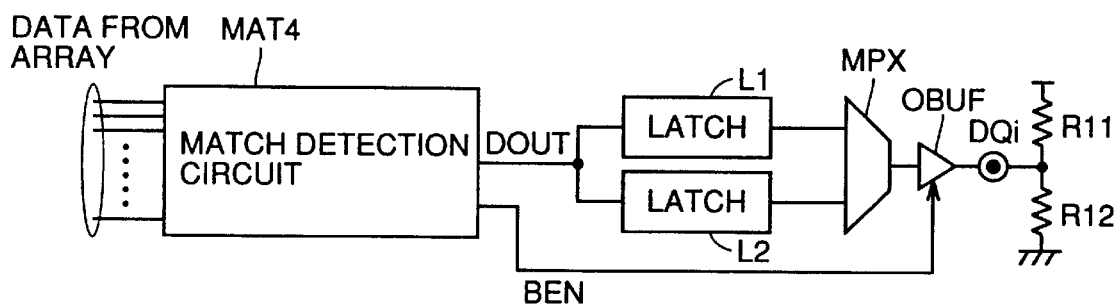
FIG. 23 is a conceptual diagram showing the concept of a data read test in a modification 2 of the embodiment 1.

FIG. 23 is a conceptual diagram showing the concept of a data read test in a modification 2 of the embodiment 1.

A match detection circuit MAT4 receiving a plurality of data from a memory array, latches L1 and L2 receiving an output signal DOUT from the match detection circuit MAT4, a multiplexer MPX alternately outputting outputs of the latches L1 and L2, and an output buffer OBUF inactivated when an output signal BEN of the match detection circuit MAT4 is at a high level while amplifying the output of the multiplexer MPX and outputting the same to a data input/output terminal DQi when the signal BEN is at a low level are provided. When executing the data read test, the data input/output terminal DQi is coupled with a power supply potential through a resistance R11 and coupled with a ground potential through a resistance R12 outside the semiconductor memory device.

When the output of the output buffer OBUF is in a high impedance state, therefore, the potential of the input/output terminal DQi reaches an intermediate level.

Figure 24:
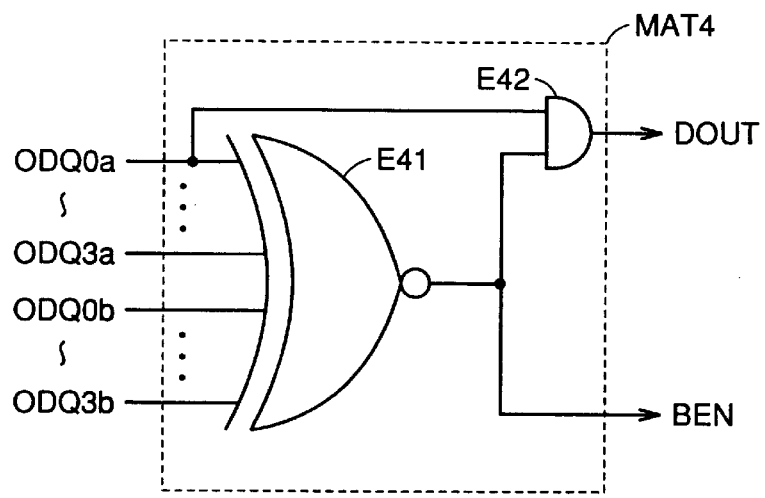
FIG. 24 is a circuit diagram showing the structure of a match detection circuit MAT4 in FIG. 23.

FIG. 24 is a circuit diagram showing the structure of the match detection circuit MAT4 shown in FIG. 23.

Referring to FIG. 24, the match detection circuit MAT4 includes a gate circuit E41 receiving signals ODQ0a to ODQ3a and ODQ0b to ODQ3b and outputting a high level if all signals match with each other while otherwise outputting a low level, and an AND circuit E42 receiving the signal ODQ0a and the output of the gate circuit E41.

The AND circuit E42 outputs the signal DOUT. The gate circuit E41 outputs the signal BEN.

Figure 25:
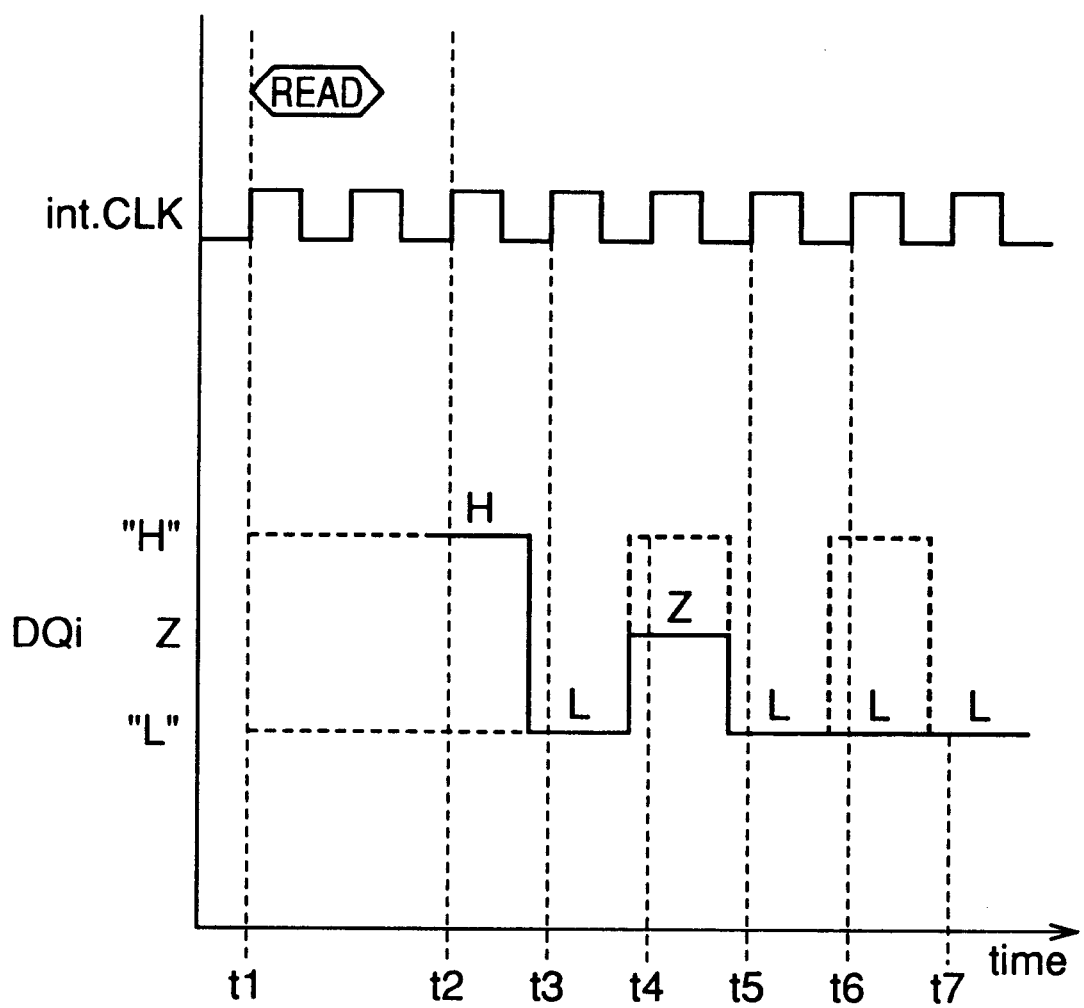
FIG. 25 is an operating waveform diagram for illustrating the read test in the modification 2 of the embodiment 1.

FIG. 25 is an operating waveform diagram for illustrating the read test in the modification 2 of the embodiment 1.

Referring to FIGS. 23 and 25, a read command is inputted at a time t1, and the data input/output terminal DQi responsively outputs a read result after a time t2. If all data from the memory array match with each other, the match detection circuit MAT4 outputs the data from the memory array as the read result. If the match detection circuit MAT4 detects no match of the data form the memory array, the output buffer OBUF is set in a high impedance state and hence the potential of the data input/output terminal DQi reaches an intermediate level.

Consider that expected values of outputs at times t2, t3, t4, t5, t6 and t7 are high, low, high, low, high and low respectively.

It is understood that the output results match with the expected values at the times t2, t3, t5 and t7 and corresponding memory cells have normally performed reading.

At the time t4, the potential of the data input terminal DQi is at the intermediate level and hence it is observable that any of the data signals ODQ0a to ODQ3a and ODQ0b to ODQ3b read from the array shown in FIG. 24 reads erroneous data.

At the time t6, the output result is low although the expected value is high, and it is observable that all signals ODQ0a to ODQ3a and ODQ0b to ODQ3b shown in FIG. 24 have read erroneous data values (low levels).

By employing the aforementioned structure and doubly making determination of the read data by the match detection circuit and determination on comparison of the read data and external expected values by a tester, the defective detection ratio can be further improved.

Modification 3 of Embodiment 1

Also in a modification 3 of the embodiment 1, a structure reducing the probability of erroneous determination and further improving the defective detection ratio is described similarly to the modification 2 of the embodiment 1.

Figure 26:
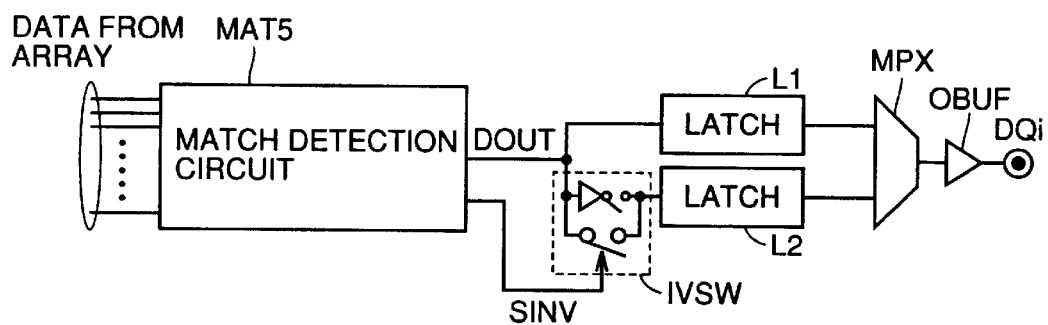
FIG. 26 is a conceptual diagram showing the concept of a data read test in a modification 3 of the embodiment 1.

FIG. 26 is a conceptual diagram showing the concept of a data read test in the modification 3 of the embodiment 1.

Referring to FIG. 26, a match detection circuit MAT5 receiving a plurality of data from a memory array is provided in the modification 3 of the embodiment 1, with further provision of a latch L1 receiving an output signal DOUT of the match detection circuit MAT5, an inversion switching circuit IVSW receiving output signals DOUT and SINV of the match detection circuit MAT5 and outputting corresponding values, a latch L2 receiving the output of the inversion switching circuit IVSW, a multiplexer MPX alternately outputting outputs of the latches L1 and L2, and an output buffer OBUF amplifying the output of the multiplexer MPX and outputting the same to a data input/output terminal DQi are provided.

Figure 27:
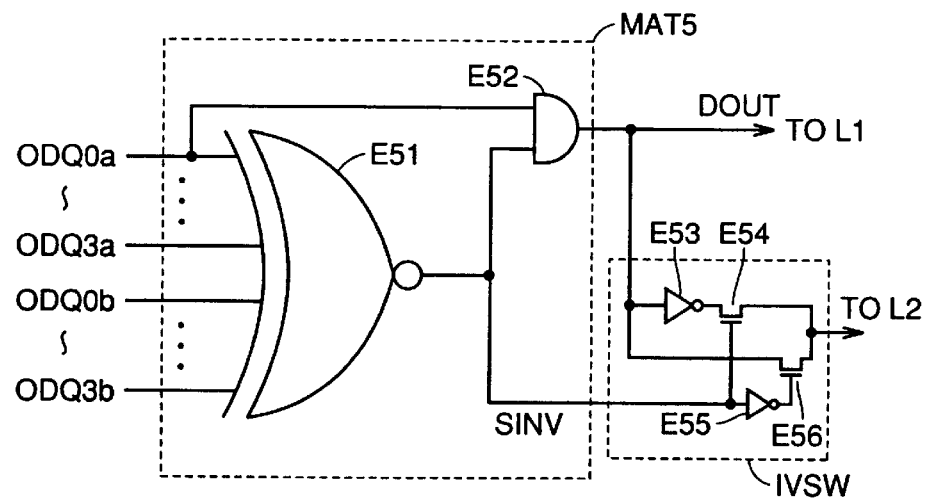
FIG. 27 is a circuit diagram showing the structures of a match detection circuit MAT5 and an inversion switching circuit IVSW.

FIG. 27 is a circuit diagram showing the structures of the match detection circuit MAT5 and the inversion switching circuit IVSW.

Referring to FIG. 27, the match detection circuit MAT5 includes a gate circuit E51 receiving signals ODQ0a to ODQ3a and ODQ0b to ODQ3b and outputting a high level when all signals match with each other while otherwise outputting a low level, and an AND circuit E52 receiving the signal ODQ0a and the signal SINV outputted from the gate circuit E51 and outputting the output signal DOUT.

The inversion switch IVSW includes an invertor E53 receiving and inverting the output signal DOUT, an invertor E55 receiving and inverting the output signal SINV, an N-channel MOS transistor E54 supplying an output of the invertor E53 to the latch L2 when the output signal SINV is at a high level, and an N-channel MOS transistor E56 supplying the output signal DOUT to the latch L2 when the output of the invertor E55 is at a high level.

Figure 28:
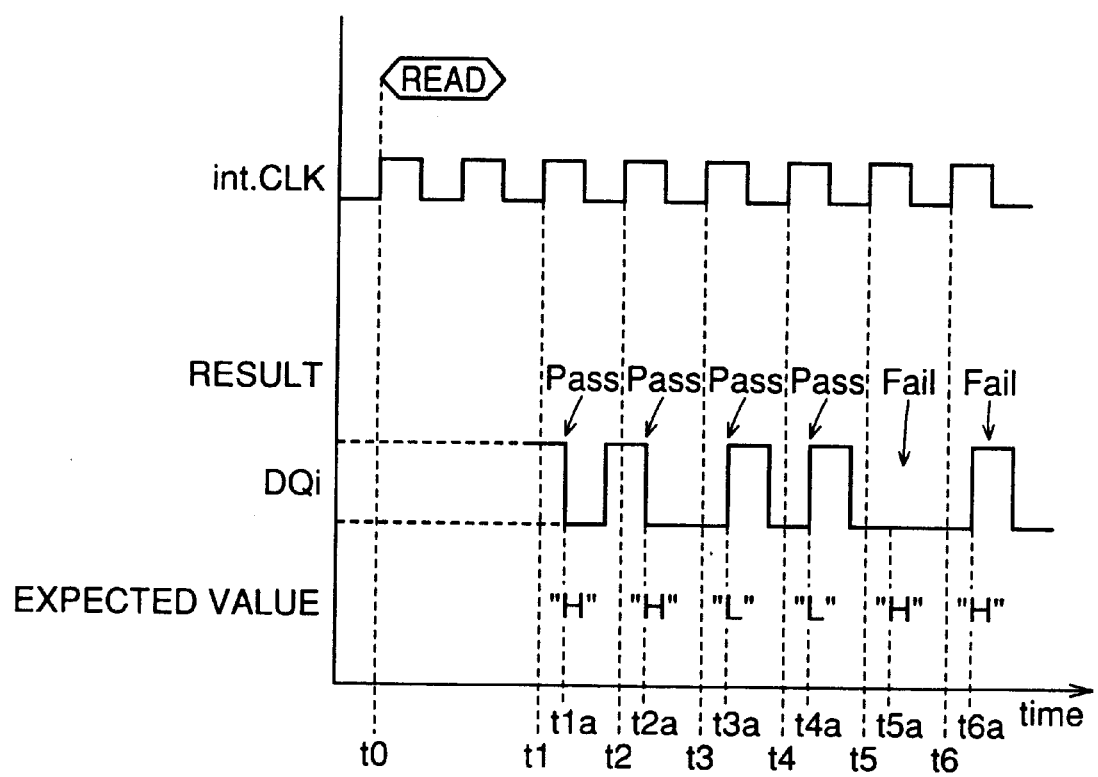
FIG. 28 is an operating waveform diagram for illustrating the read test in the modification 3 of the embodiment 1.

FIG. 28 is an operating waveform diagram for illustrating the read test in the modification 3 of the embodiment 1.

Referring to FIGS. 26 and 28, a read command is supplied at a time t0. In response to this, the data input/output terminal DQi outputs data read results after a time t1. It is assumed that expected values of output data from the memory array corresponding to times t1a, t2a, t3a, t4a, t5a and t6a are high, high, low, low, high and high respectively.

When the data read value from the memory array is at a high level and the match detection circuit MAT5 detects match, a high level is loaded in the latch L1 as data, while the inversion switch IVSW inverts data so that a low level is loaded in the latch L2 as data. Thus, the data input/output terminal DQi outputs data in order of that of the latch L1 and that of the latch L2, and hence a trailing edge falling from a high level to a low level is externally observed.

When data from the memory array is at a low level and the match detection circuit MAT5 detects match, a leading edge rising from a low level to a high level is observed on the contrary. Therefore, trailing edges are observed at the times t1a and t2a while leading edges are observed at the times t3a and t4a, and all results are passed by comparing the waveforms with the output expected values.

When the match detection circuit MAT5 detects no match, the same data are written in the latches L1 and L2 and hence no leading and trailing edges are detected but the determination fails at the time t5a.

Even if the match detection circuit MAT5 detects match when erroneous data are read as the signals ODQ0a to ODQ3a and ODQ0b to ODQ3b, the failure of the result can be determined by comparing the comparative value and the leading edge at the time t6a, for example.

In the modification 3 of the embodiment 1, therefore, the defective detection ratio can be further improved.

Embodiment 2

Figure 29:
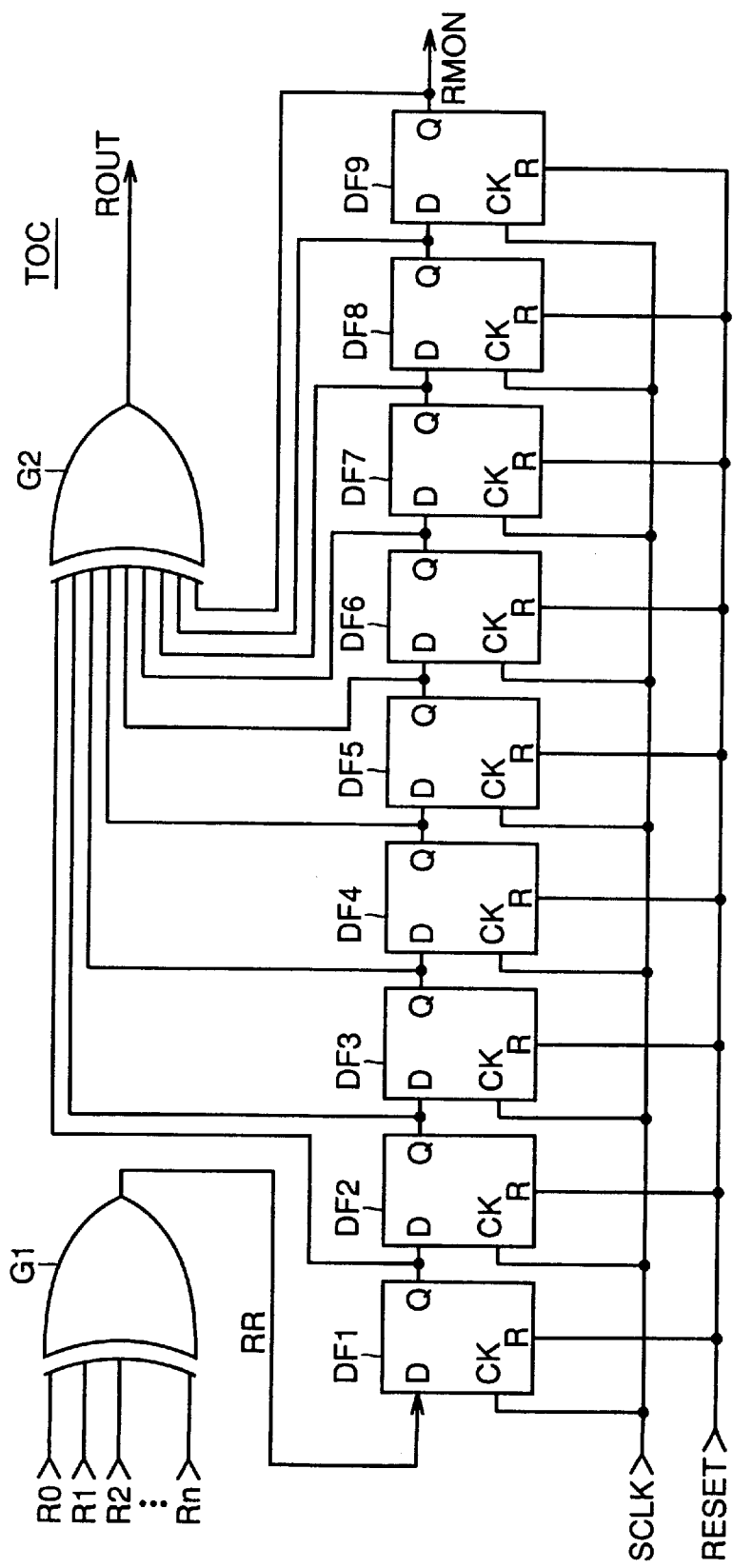
FIG. 29 is a circuit diagram showing the structure of a test result output circuit TOC employed in a synchronous semiconductor memory device according to an embodiment 2 of the present invention.

FIG. 29 is a circuit diagram showing the structure of a test result output circuit TOC employed in a synchronous semiconductor memory device according to an embodiment 2 of the present invention.

Referring to FIG. 29, the test result output circuit TOC includes an EXOR circuit G1 receiving read result signals R0 to Rn batch-read from a memory array, serially connected flip-flops DF1 to DF9 having outputs reset by a reset signal RESET, fetching data and outputting held data in synchronization with a shift clock SCLK, and an EXOR circuit G2 receiving the outputs of the flip-flops DF1 to DF9 and outputting a test result output signal ROUT.

The flip-flops DF1 to DF9 form a shift register receiving an output signal RR of the EXOR circuit G1 and shifting the same in synchronization with the shift dock SCLK. The shift register is formed by flip-flops of a number obtained by adding 1 to the burst length of the synchronous semiconductor memory device outputting data.

Figure 30:
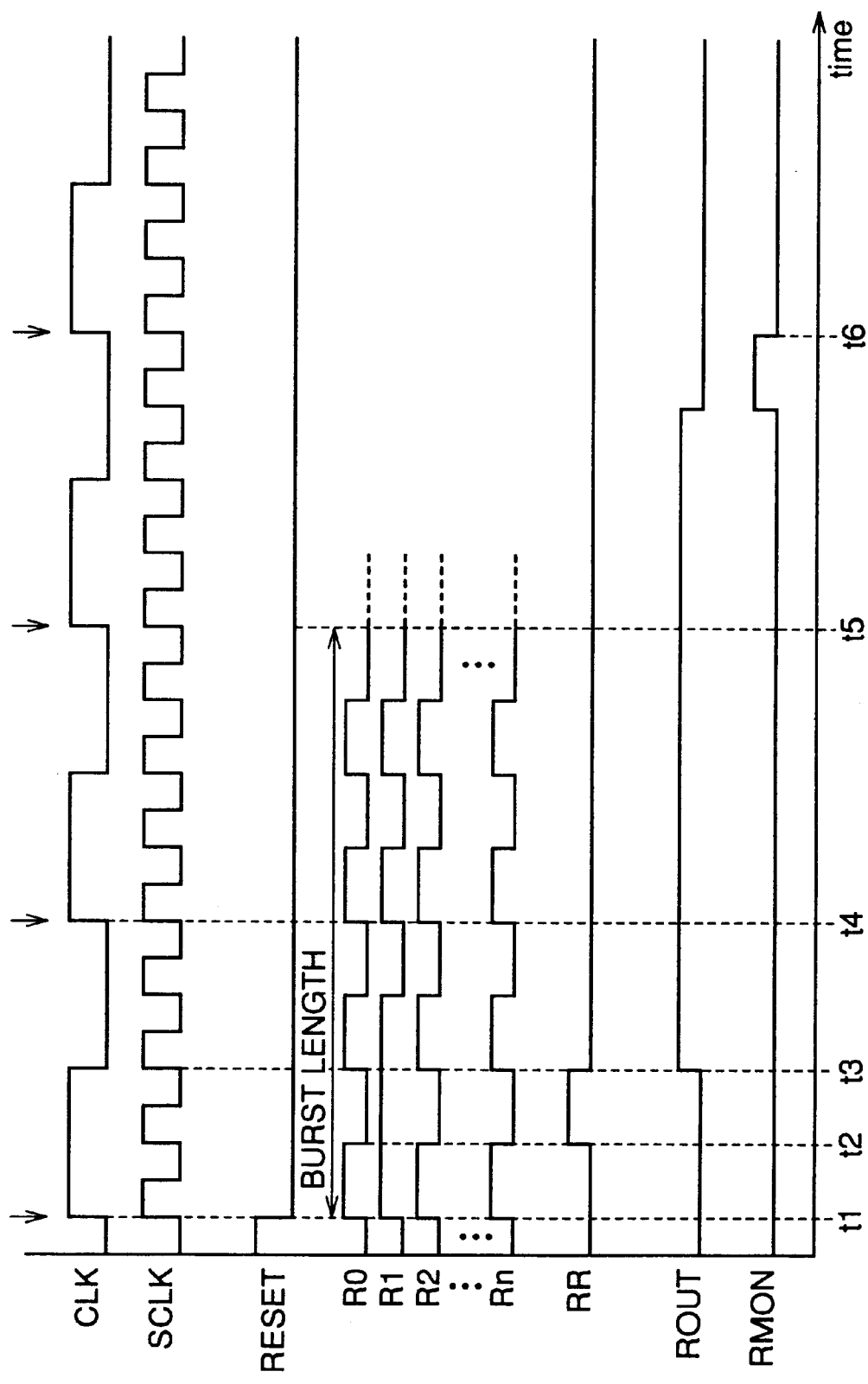
FIG. 30 is an operating waveform diagram for illustrating the operation of the test result output circuit TOC.

FIG. 30 is an operating waveform diagram for illustrating the operation of the test result output circuit TOC.

Referring to FIGS. 29 and 30, a clock signal CLK is inputted in the synchronous semiconductor memory device from an externally connected tester, and the shift dock SCLK is a clock signal generated in the synchronous semiconductor memory device by a phase locked loop (PLL) circuit or the like, for example, on the basis of the clock signal CLK.

The synchronous semiconductor memory device outputs data in the cycle of the shift clock SCLK in an normal operation.

At a time t1, the reset signal RESET falls from a high level to a low level. In response to this, the flip-flops DF1 to DF9 are released from reset states to start fetching the signal RR indicating a compressed test result.

Read result signals R0 to Rn are data read results outputted to a plurality of data input/output terminals respectively. When including a test mode of simultaneously writing data in a plurality of banks and simultaneously reading data from the plurality of banks, for example, the read result signals R0 to Rn may be read results from the plurality of banks.

At times t1 to t5, read results (eight data in this case) corresponding to the burst length are continuously read.

If a memory cell is partially defective and the read result signal R1 is different from the remaining ones, the compressed signal RR goes high between the times t2 and t3. In order to detect this change of the signal RR, a tester responsive to the frequency of the internal operation clock SCLK is necessary. In a tester having low performance, the output signal can be observed only at one point in one cycle of the basic clock signal CLK supplied by the tester to the device. As shown by arrows at the times t1, t4, t5 and t6, for example, data signals can be observed only on the leading edges of the clock signal CLK.

At the time t3, the shift register formed by the flip-flops DF1 to DF9 fetches the signal RR. In response to this, the externally observed test result output signal ROUT goes high for a constant period. In the circuit shown in FIG. 29, the constant period corresponds to nine clocks of the shift clock SCLK. In this case, a high level of the test result output signal ROUT is observable at the times t4 and t5, and hence a tester of low performance can detect abnormality of the read result.

For simply determining non-defectiveness/defectiveness of products, it is sufficient to observe that the test result output signal ROUT is at a low level, and a tester of low performance can determine non-defectiveness/defectiveness of the synchronous semiconductor memory device.

When analysis is necessary to specify a defective part, an output signal RMON of the shift register is outputted to an external terminal in a test mode. At which timing a read error is caused in the read result signals R0 to Rn can be analyzed by observing the signal RMON, to obtain a clue for recognizing the corresponding address.

In other words, the synchronous semiconductor memory device according to the embodiment 2 detects whether or not reading has been erroneous halfway when continuously outputting read results from the memory array in an operation confirmation test and outputs the results with an increased pulse width. The shift register is initially reset and stores data corresponding to those in a normal state, and read data from the memory array is compressed and inputted in the shift register every read cycle. The test result output signal ROUT, which maintains a low level so far as a normal value is inputted, goes high if a read error is caused.

The test result output signal ROUT may be observed once at the minimum with respect to the number of input of the shift clock corresponding to the burst length, and non-defectiveness/defectiveness of the synchronous semiconductor memory device can be determined with such a small number of observation. It is also possible to obtain a clue for recognizing a defective address by observing the output signal of the shift register when determination is made on the defective address.

Embodiment 3

In relation to an embodiment 3 of the present invention, an exemplary synchronous semiconductor device containing a BIST (built-in self test) circuit.

Figure 31:
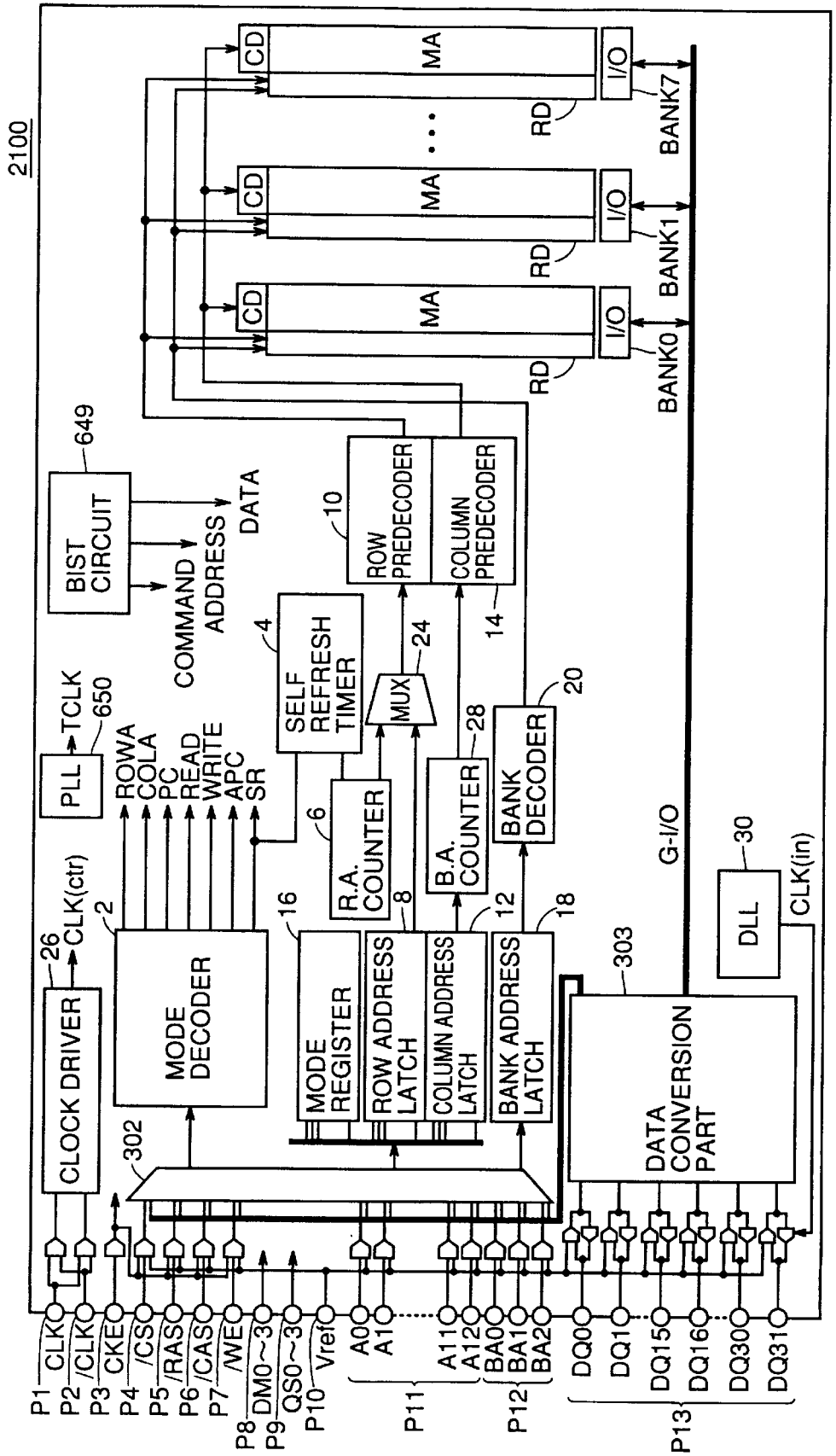
FIG. 31 is a schematic block diagram showing the overall structure of a synchronous semiconductor memory device 2100 according to an embodiment 3 of the present invention.

FIG. 31 is a schematic block diagram showing the overall structure of a synchronous semiconductor memory device 2100 according to the embodiment 3.

Referring to FIG. 31, the synchronous semiconductor memory device 2100 includes a multiplexer 302 multiplexing data inputted from a data conversion part 303 latching data from a data input/output terminal P13 and data inputted from control terminals P4 to P7 and address terminal groups P11 and P12 and transmitting the same to an internal block, a PLL circuit 650 receiving an external clock and generating a test clock TCLK having a shorter cycle than the external clock in a test operation, and a BIST circuit 649 in addition to the structure of the synchronous semiconductor memory device 1000 shown in FIG. 1, dissimilarly to the synchronous semiconductor memory device 1000 shown in FIG. 1. The remaining structure is similar to that of the synchronous semiconductor memory device 1000, and therefore description is not repeated.

When a test start command is externally inputted, the BIST circuit 649 automatically generates signals of a command, an address, data and the like necessary for a test, executes an operation test of the synchronous semiconductor device, determines correctness/incorrectness of the test result from an output result of read data etc. and outputs the determination to a prescribed output terminal.

Therefore, pins necessary for the operation test of the synchronous semiconductor memory device containing the BIST circuit are only a clock terminal for ensuring synchronization with a tester and a data terminal employed for outputting the determination result. In other words, the necessary pins are only a single clock terminal and a single data terminal, i.e., two pins in total at the minimum.

Figure 32:
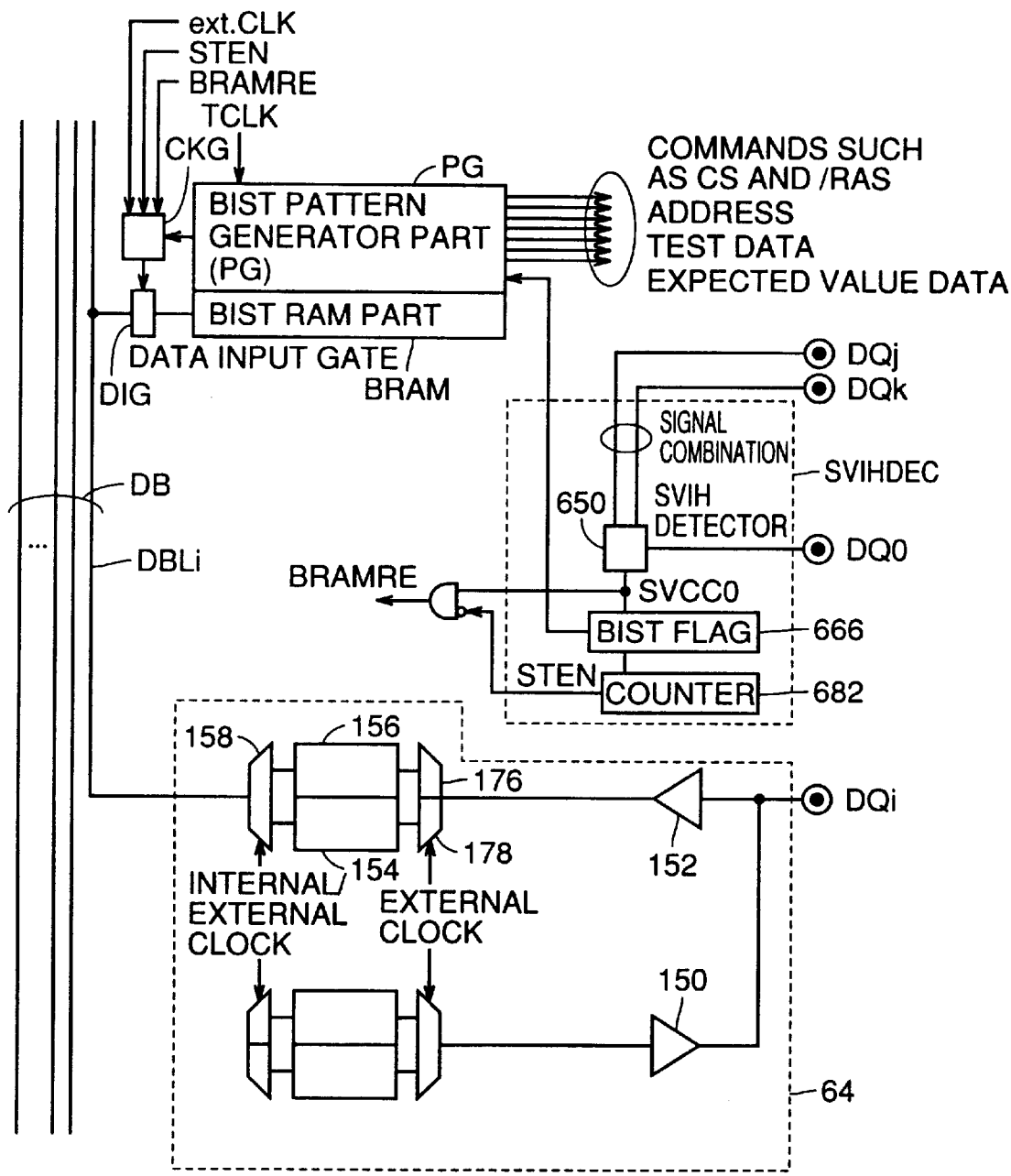
FIG. 32 is a diagram for illustrating data input through an input/output buffer in execution of BIST of the synchronous semiconductor memory device 2100.

FIG. 32 is a diagram for illustrating data input through an input/output buffer in execution of a BIST of the synchronous semiconductor memory device 2100.

Referring to FIG. 32, a pattern generator part PG executing the BIST, a RAM part BRAM holding the test procedure for the BIST, a clock gate circuit CKG supplying the clock to the RAM part BRAM, an input gate DIG fetching data from a data bus into the RAM part BRAM, and an input/output circuit 64 for inputting data transferred to the RAM part BRAM are provided. A circuit block for executing the BIST is split into the pattern generator part PG and the RAM part BRAM. The BIST is executed by reading and decoding data previously stored in the RAM part and generating a pattern responsive to the decoded result.

Therefore, data must be written in the RAM part BRAM before executing the BIST. The data, obtained by coding the content of the test sequence to a prescribed numerical value, is expressed in a form called a vector form.

A detection circuit SVIHDEC is provided for detecting application of a prescribed potential exceeding a power supply potential to a specific pin (DQ0 in this case) and outputting an execution flag for the BIST to the pattern generator part PG when arbitrary input pins (DQj and DQk in this case) of the chip are in a prescribed combination. Following this setting of the flag, an internal test clock generator (not shown) starts an operation of generating a test clock TCLK (synchronous clock). In accordance with this test clock, the data serving as the test vector for the BIST is written in the RAM part BRAM.

The RAM part BRAM forms shift registers as described later, for sequentially internally shifting the data inputted from the data input gate DIG. When a period of the cycle number of a shift clock SCK corresponding to the number of the shift registers included in the RAM part BRAM elapses, therefore, input of the data in the RAM part is completed.

This data writing is performed from a prescribed data input/output terminal DQi through the input/output circuit 64 through a data line DBLi included in the data bus DB. The input/output circuit 64 is similar in structure to that shown in FIG. 10, and therefore description is not repeated.

In an normal operation, the data inputted from the data input/output terminal DQi is fetched in the latches 156 and 154 in synchronization with the external clock, and transmitted to the data bus DB in synchronization with the internal clock.

When initial data input in the RAM part BRAM for executing the BIST, however, the clock generation circuit generating the internal clock is insufficiently stabilized. This is because the external clock must be inputted in the clock generation circuit for a constant period in order to stabilize the internal clock.

In data input in the RAM part BRAM in the initial stage of the BIST, therefore, the latch circuits 156 and 154 of the input/output circuit 64 transmit the data to the data bus on the basis of the external clock. The data outputted to the data bus are sequentially fetched in the shift registers of the RAM part BRAM through the data input gate DIG in response to the shift clock generated on the basis of the external clock.

When a series of data are inputted in the shift registers of the RAM part BRAM, the data are read from the RAM part BRAM in accordance with the order of a program counter and decoded for executing the BIST.

Figure 33:
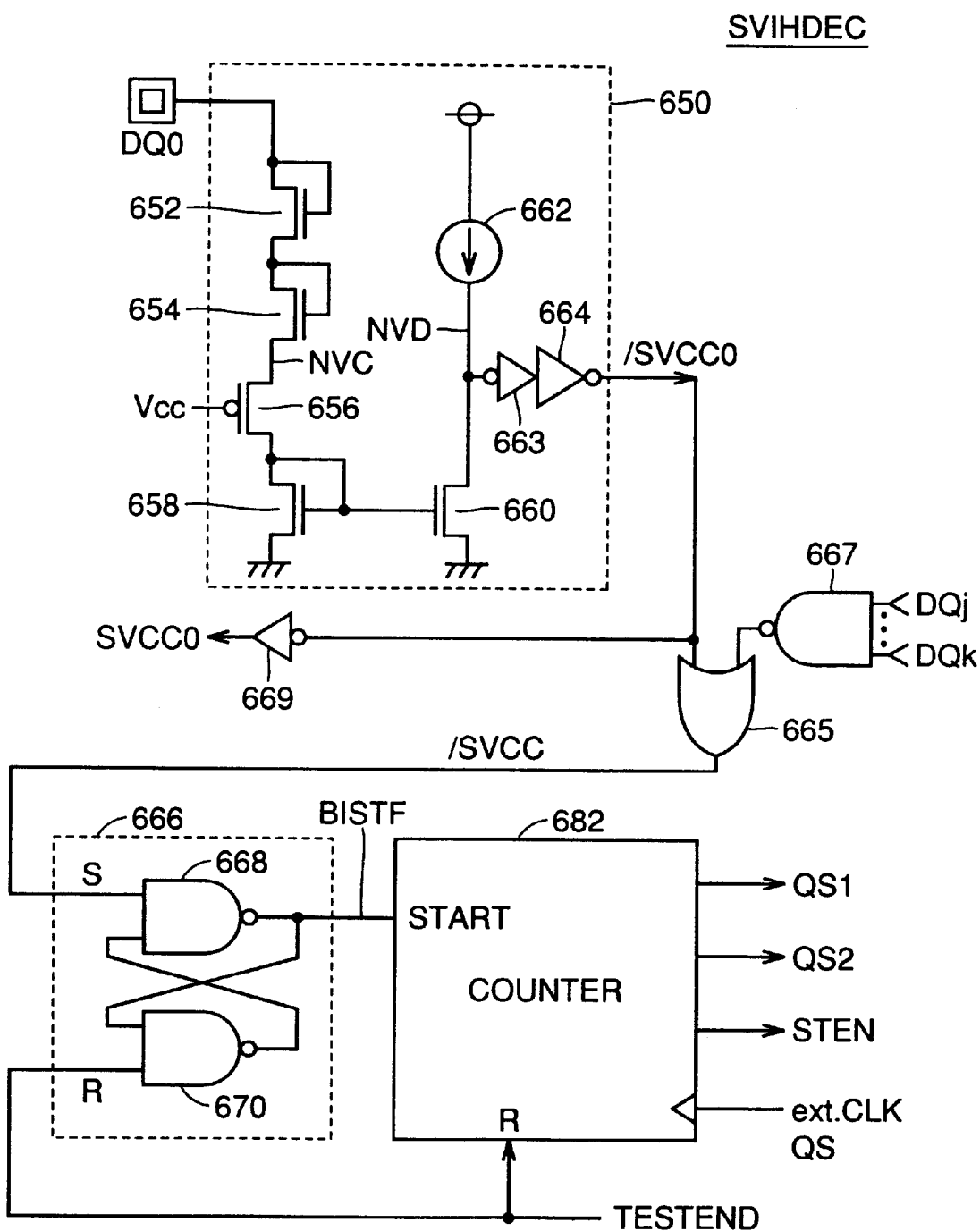
FIG. 33 is a circuit diagram showing a structure related to a detection circuit SVIHDEC in FIG. 32.

FIG. 33 is a circuit diagram showing a structure related to the detection circuit SVIHDEC shown in FIG. 32.

Referring to FIG. 33, provided are a high voltage detection circuit 650 detecting that the level of the data input/output terminal DQ0 exceeds a prescribed voltage value, a decode circuit 667 decoding whether or not signals inputted in the data input/output terminals DQj to DQk are in a prescribed combination, an OR circuit 665 receiving an output signal /SVCC0 from the high voltage detection circuit 650 and an output of the decode circuit 667 and outputting a signal /SVCC, an invertor 669 receiving and inverting the signal /SVCC0 and outputting a signal SVCC0, a latch circuit 666 set by the signal /SVCC and reset by a signal TESTEND indicating that the test is ended, and a counter 682 starting counting in response to an output of the latch circuit 666 and outputting signals QS1 and QS2 while outputting an enable signal STEN for a constant period after a prescribed time.

The high voltage detection circuit 650 includes N-channel MOS transistors 652 and 654 serially diode-connected between the data input/output terminal DQ0 and a node NVC, an N-channel MOS transistor 658 having a source connected to a ground node and a gate and a drain connected with each other, a P-channel MOS transistor 656 connected between a drain of the N-channel MOS transistor 658 and the node NVC with a gate supplied with a power supply potential Vcc, a constant current source 662 connected between a power supply node and a node NVD, an N-channel MOS transistor 660 connected between the node NVD and a ground node with a gate connected to a drain of the N-channel MOS transistor 658, an invertor 663 having an input connected with the node NVD, and an invertor 664 receiving and inverting an output of the invertor 663 and outputting the high voltage detection signal /SVCC0.

The latch circuit 666 includes a NAND circuit 668 receiving the signal /SVCC in one input node and a NAND circuit 670 receiving an output of the NAND circuit 668 and the signal TESTEND. An output of the NAND circuit 670 is connected to another input of the NAND circuit 668. The NAND circuit 668 outputs a BIST flag BISTF.

Figure 34:
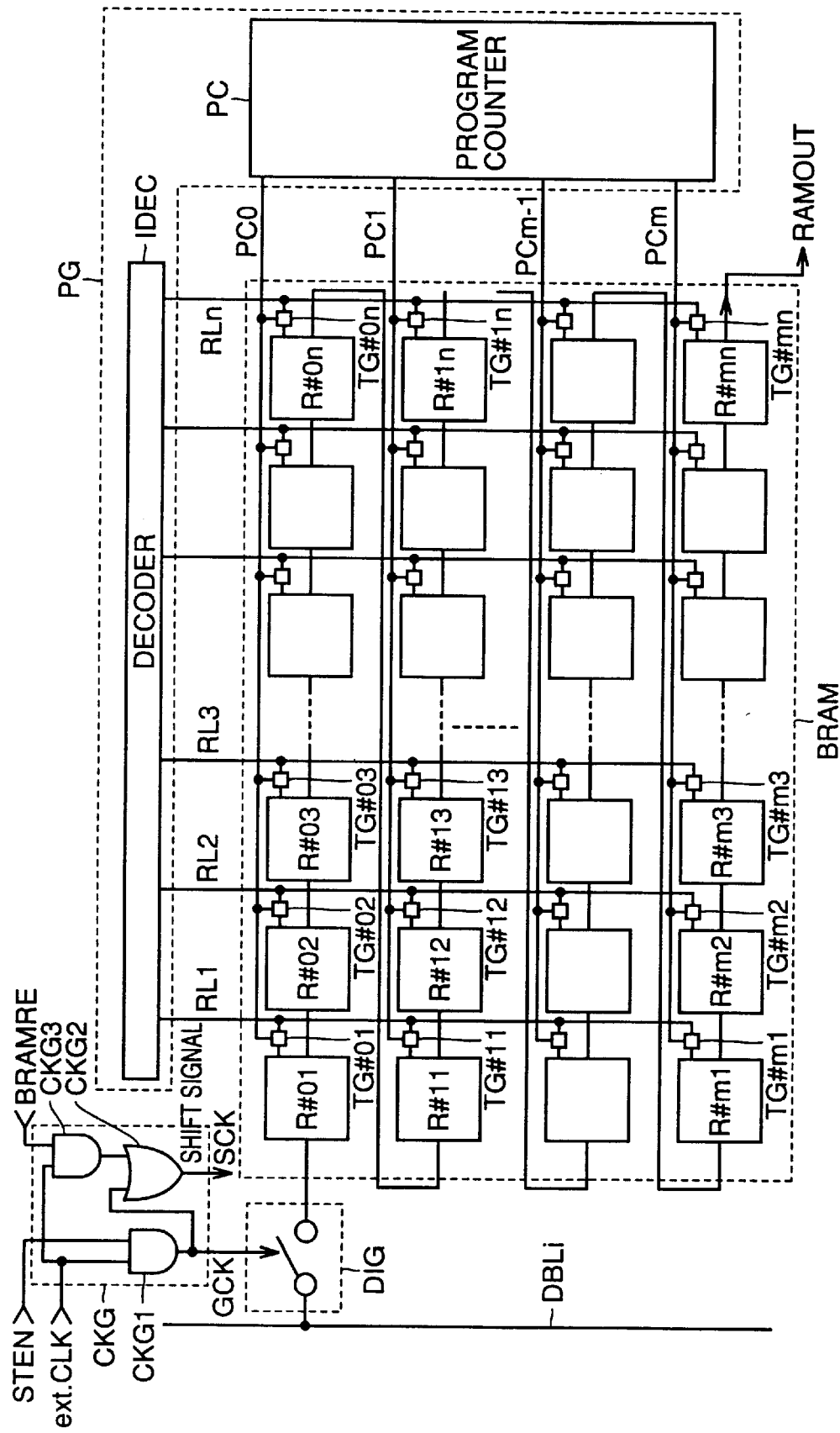
FIG. 34 is a block diagram for illustrating an exemplary structure of a RAM part BRAM.

FIG. 34 is a block diagram for illustrating an exemplary structure of the RAM part BRAM.

Referring to FIG. 34, the RAM part BRAM is connected with a decoder IDEC included in the pattern generator part PG by read signal lines RL1 to RLn, and further connected with the program counter PC included in the pattern generator part PG by selection signal lines PC0 to PCm.

An input part is provided with the clock gate circuit CKG generating the clock for writing data in the RAM part BRAM before starting the BIST. The clock gate circuit CKG includes an AND circuit CKG1 receiving an external clock signal ext.CLK and the enable signal STEN and outputting a clock signal GCK for fetching data, an AND circuit CKG3 receiving the external clock signal ext.CLK and an enable signal BRAMRE, and an OR circuit CKG2 receiving an output of the AND circuit CKG3 and the clock signal GCK. The OR circuit CKG2 outputs the shift clock SCK for shifting the shift registers included in the RAM part BRAM.

The data input gate DIG is provided between a data bus line DBLi and the RAM part BRAM. The data input gate DIG fetches data in response to the clock signal GCK for data fetching.

The RAM part BRAM includes serially connected n flip-flops R#01 to R#0n receiving the data inputted from the data input gate DIG. Transfer gates TG#01 to TG#0n are provided in correspondence to the flip-flops R#01 to R#0n respectively.

The transfer gates TG#01 to TG#0n are activated by the signal line PC0 to connect the flip-flops R#01 to R#0n and the read signal lines RL1 to RLn respectively.

The RAM part BRAM further includes serially connected n flip-flops R#11 to R#1n receiving outputs of the flip-flops R#01 to R#0n, and transfer gates TG#11 to TG#1n activated by the signal line PC1 to connect the flip-flops R#11 to R#1n and the read signal lines RL1 to RLn respectively.

In the RAM part BRAM, serially connected n flip-flops receiving an output of the final stage flip-flop on an i–1-th row are similarly provided in correspondence to an i-th row.

In this embodiment, m such rows are provided. An output of a flip-flop R#mn forming the final stage of the shift registers can be read out as a signal RAMOUT.

By employing this structure, a RAM can be tested with a small number of terminals.

Figure 35:
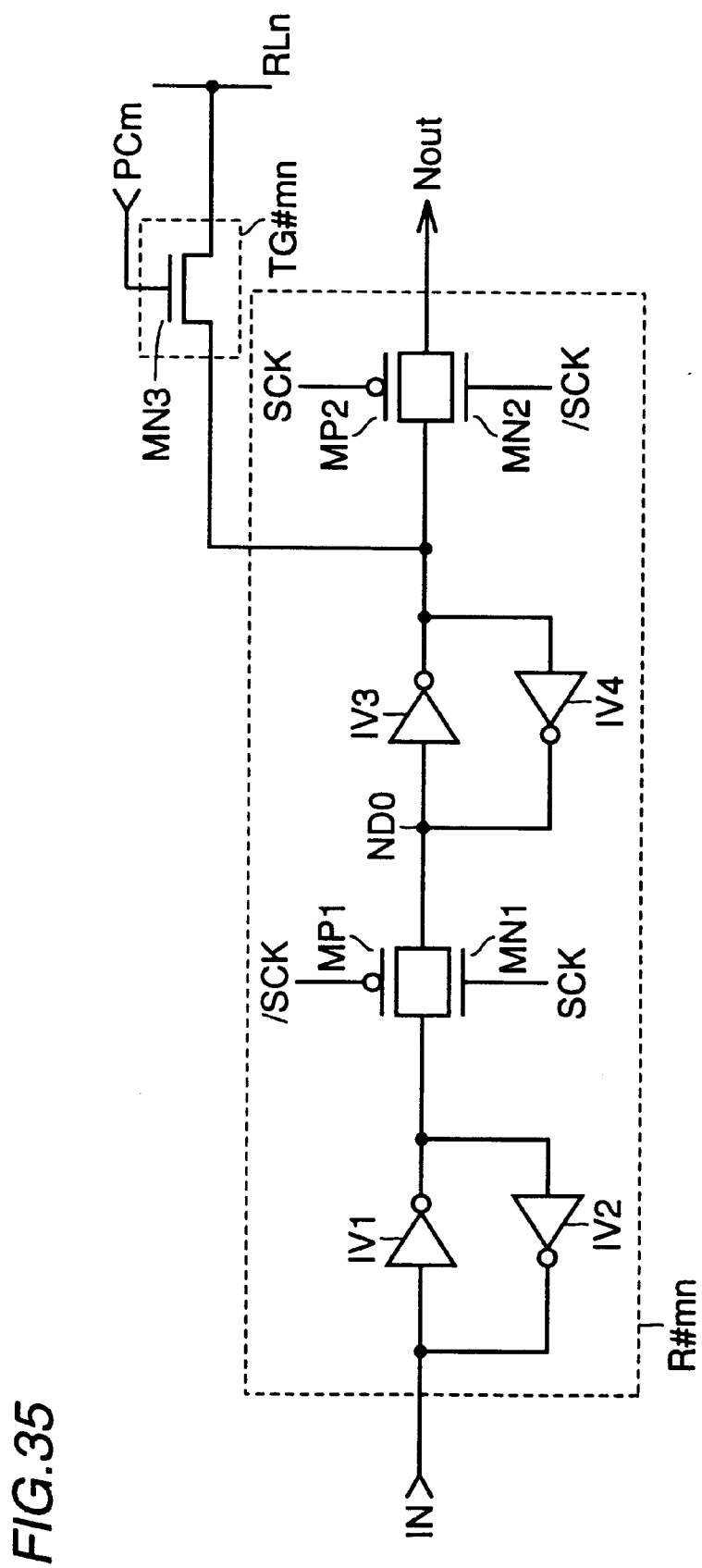
FIG. 35 is a circuit diagram showing the structures of a flip-flop R#mn and a transfer gate TG#mn in FIG. 34.

FIG. 35 is a circuit diagram showing the structures of the flip-flop R#mn and a transfer gate TG#mn shown in FIG. 34.

The flip-flop R#mn includes an invertor IV1 receiving and inverting an input signal IN, an invertor IV2 receiving and inverting an output of the invertor IV1 and supplying the inverted output to an input of the invertor IV1, a P-channel MOS transistor MP1 connected between the output of the invertor IV1 and a node ND0 with a gate receiving a shift clock /SCK, an N-channel MOS transistor MN1 connected between the output of the invertor IV1 and the node ND0 with a gate receiving the shift clock SCK, an invertor IV3 having an input connected to the node ND0, an invertor IV4 inverting an output of the invertor IV3 and outputting the inverted output to the node ND0, a P-channel MOS transistor MP2 connected between the output of the invertor IV3 and an output node Nout with a gate receiving the shift clock SCK, and an N-channel MOS transistor MN2 connected between the output of the invertor IV3 and the output node Nout with a gate receiving the shift clock /SCK.

The transfer gate TG#mn includes an N-channel MOS transistor MN3 connected between the output of the invertor IV3 and the read signal line RLn with a gate supplied with a signal PCm.

Data set in the RAM part BRAM is inputted from the data input terminal serving also as a data bus employed for ordinary data input. The enable signal STEN is generated by the counter 682. This enable signal supplies clock pulses to the data input gate by the number of the shift registers included in the RAM part BRAM. Data is fetched by the count of the counter and sequentially shifted, to be completely stored in the RAM part BRAM.

Referring again to FIG. 34, the shift clock SCK is also inputted in execution of a read test by the OR circuit CKG2 since the data must be fetched when executing a test for confirming the operation of the RAM part BRAM.

The data of the RAM part are selected by signals PC0 to PCm outputted by the program counter PC and transmitted to the decoder IDEC through the read signal lines RL1 to RLn. The decoder IDEC decodes the transmitted data and executes the corresponding operation.

[Test of BIST Execution Circuit Itself]

Figure 36:
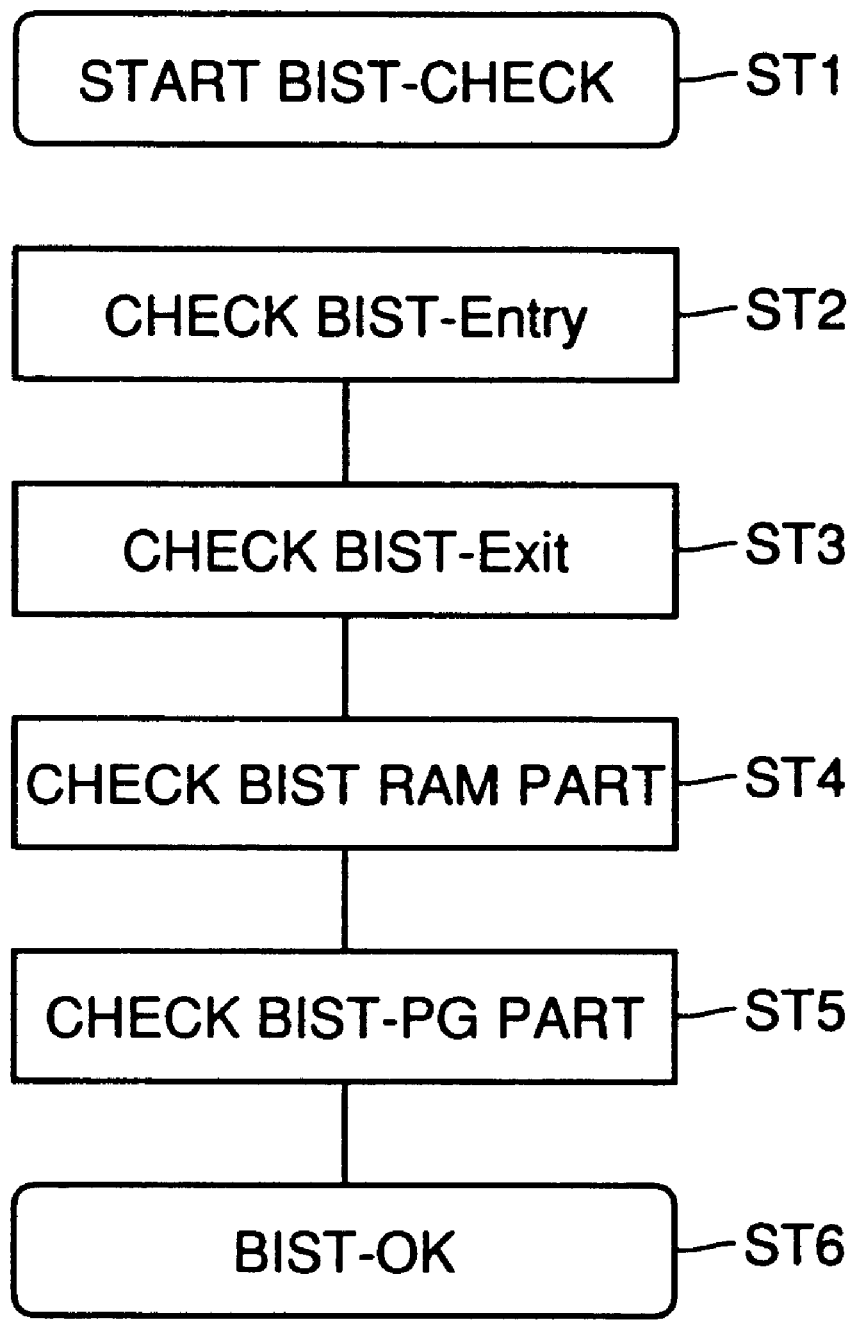
FIG. 36 illustrates a sequence related to a test for a circuit for executing BIST.

FIG. 36 illustrates the sequence related to a test for the circuit for executing the BIST.

Referring to FIG. 36, checking of the circuit executing the BIST is started at a step ST1. Then, at a step ST2, an entry check for entering a mode for executing the BIST is performed. Then, at a step ST3, a check is performed for ending the BIST and going out from the test mode.

Then, at a step ST4, the RAM part BRAM storing the test content for the BIST is checked. Then, at a step ST5, the pattern generator part PG of the circuit for executing the BIST is checked.

When all steps are normal, the test for the test circuit for executing the BIST is completed at a step ST6.

After such a test is executed, the BIST is executed with the circuit for executing the BIST.

First, structures for executing the entry check and the check for going out from the mode at the steps ST2 and ST3 are described.

Figure 37:
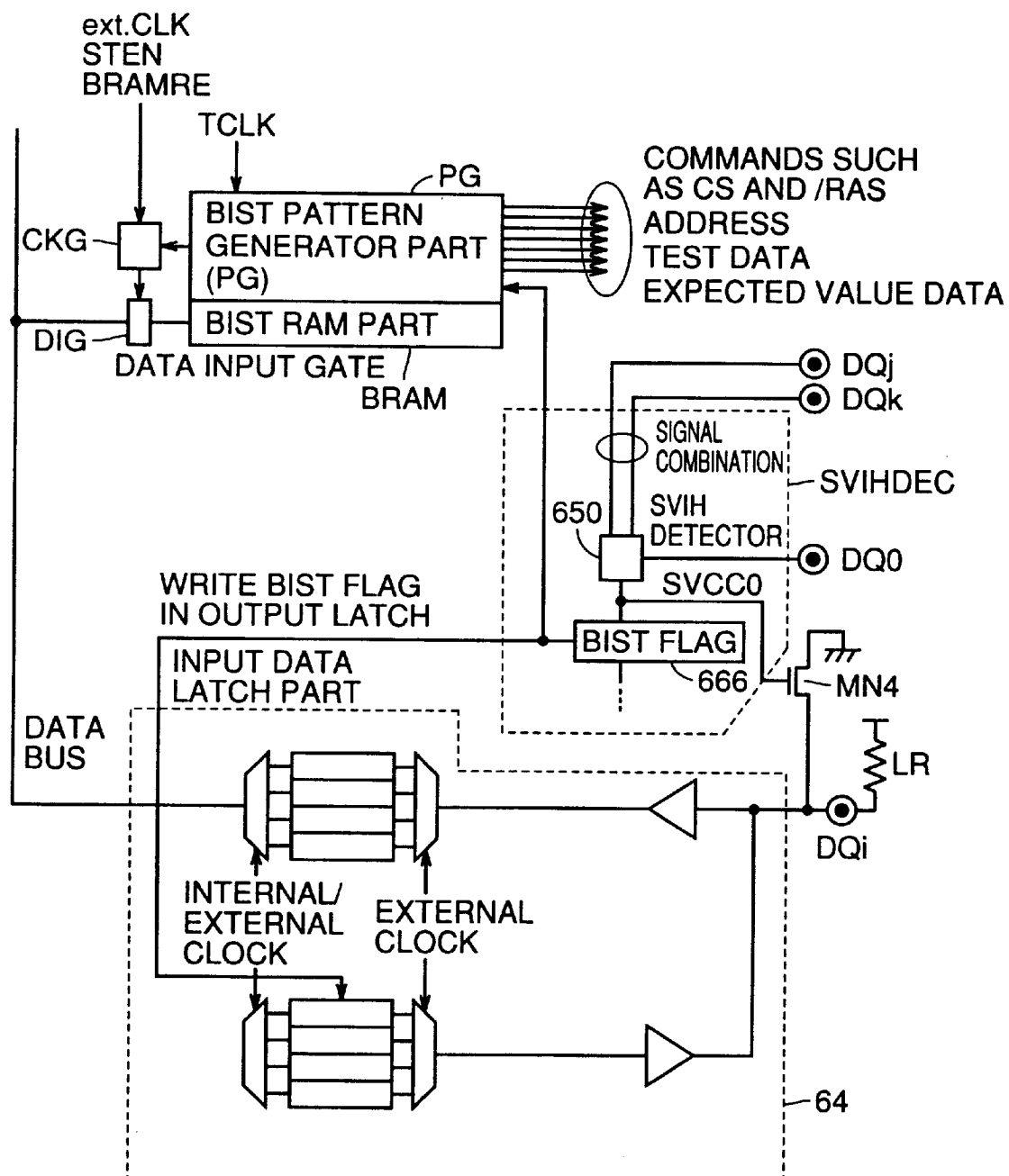
FIG. 37 is a block diagram for illustrating a structure for executing an entry test.

FIG. 37 is a block diagram for illustrating the structure for executing the entry test.

Referring to FIG. 37, an N-channel MOS transistor MN4 connected between the data input terminal DQi and a ground node with a gate receiving the detection signal SVCC0 outputted from the SVIH detection circuit SVIHDEC is provided for executing the entry test. When a prescribed voltage exceeding the power supply potential is applied to the data input/output terminal DQ0, the detection signal SVCC0 is activated and the N-channel MOS transistor MN4 is rendered conductive. The data input/output terminal DQi, which is generally at a high level since the same is externally connected to a negative resistance LR and pulled up in a test time, goes low while the prescribed potential exceeding the power supply potential is supplied to the data input/output terminal DQ0.

By externally observing this level, it is possible to determine whether or not the detection circuit SVIHDEC normally operates.

In order to check whether or not the BIST flag selected by detection of a high voltage by the detection circuit SVIH-DEC is normally set, the BIST flag is written in an output data latch part in the input/output circuit 64. Whether or not the BIST flag is normally set can be determined by reading the data written in the latch.

Figure 38:
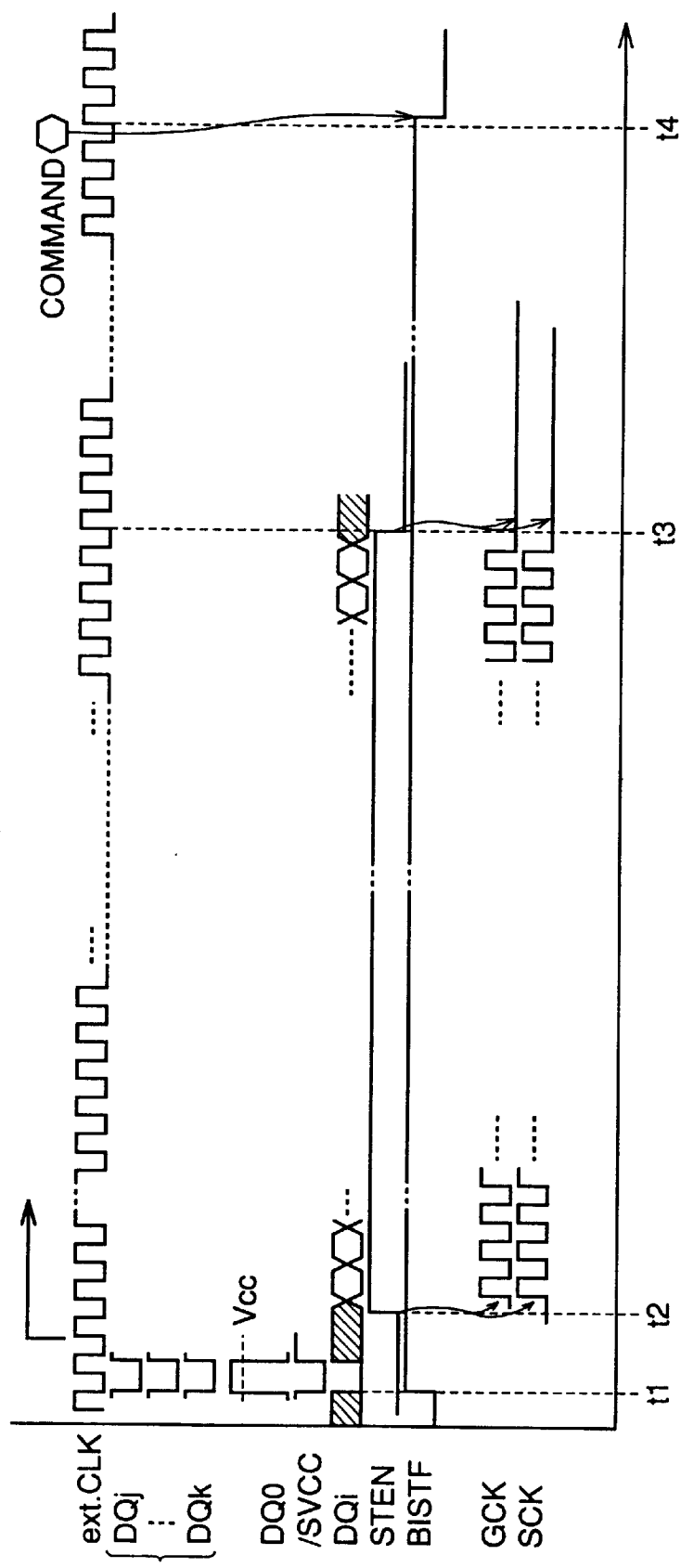
FIG. 38 is an operating waveform diagram for illustrating the entry test and data writing in the RAM part.

FIG. 38 is an operating waveform diagram for illustrating the entry test and data writing in the RAM part.

Referring to FIGS. 37 and 38, when an arbitrary combination of the terminals (all data input/output terminals DQj to DQk are at low levels in this case) is set and the potential of the data input/output terminal DQ0 is set at a constant level exceeding the power supply potential Vcc at a time t1, the detection circuit SVIHDEC detects the high voltage. In response to this, the detection signal SVCC0 goes low, the BIST flag BISTF is set, and the N-channel MOS transistor MN4 connected to the data input/output terminal DQi is rendered conductive. The potential of the data input/output terminal DQi responsively goes low. When externally confirming that the data input/output terminal DQi goes low, it is possible to confirm that the operation of a voltage detection part of the detection circuit SVIHDEC is normal.

At a time t2, a counter included in the detection circuit SVIHDEC starts counting in response to setting of the BIST flag BISTF, and the enable signal STE goes high. In response to the high level of the enable signal STEN, the fetch clock signal GCK and the shift clock signal SCK are generated from the external clock signal ext.CLK.

On the basis of these clocks, test data written in the RAM part BRAM is inputted from the data input/output terminal DQi.

When the shift clock SCK is inputted by a prescribed clock number at a time t3, the enable signal STEN goes low. In response to this, generation of the shift clock SCK is stopped and the data of the RAM part BRAM is fixed. The clock inputted in the pattern generator part PG is switched from the external clock to a high-speed clock internally generated by a PLL circuit or the like for executing the BIST.

When setting to a self refresh mode or a mode register set cycle is externally performed at a time t4, the BIST flag BISTF is canceled to end the BIST.

Figure 39:
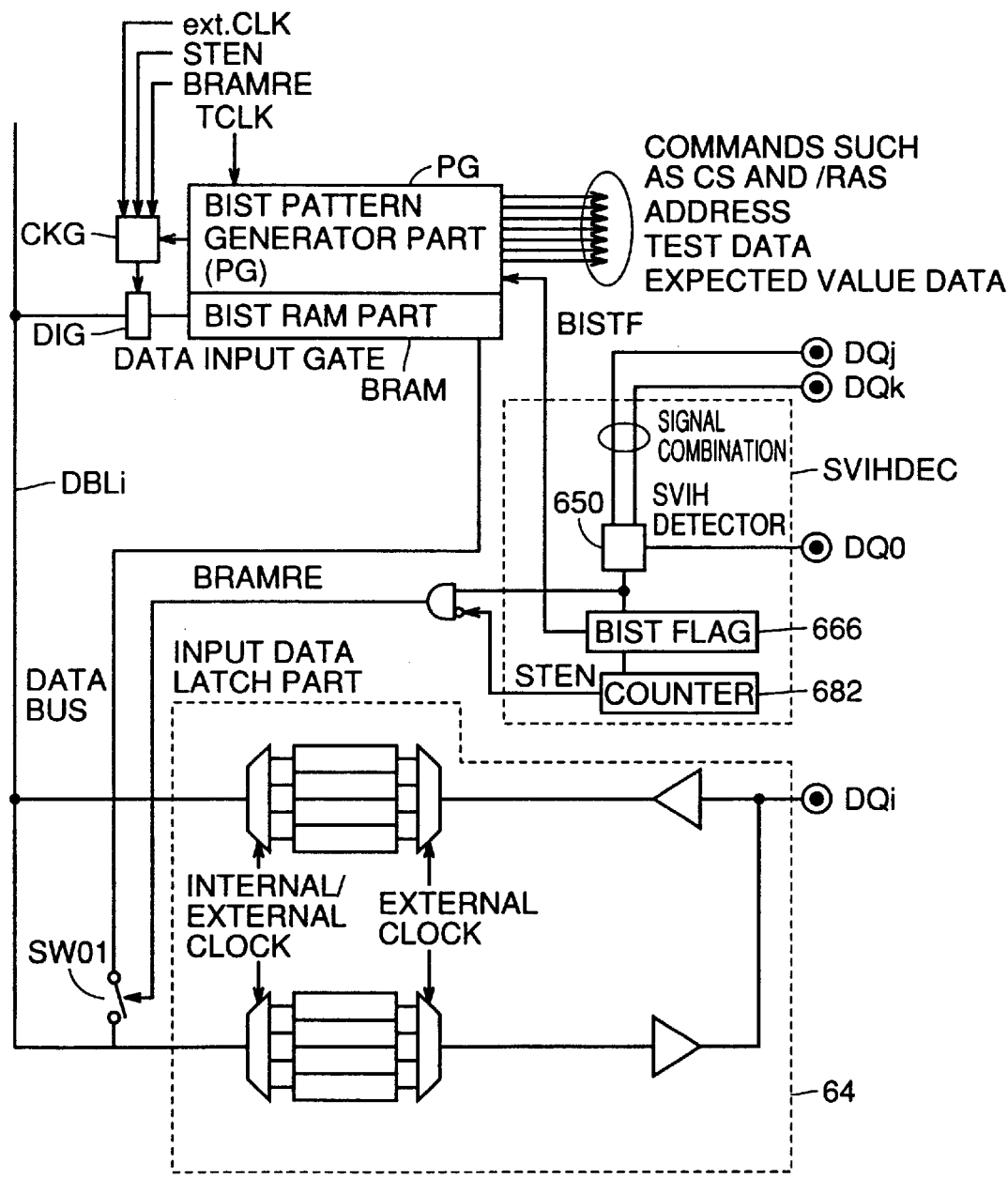
FIG. 39 is a block diagram for illustrating a test of the RAM part BRAM.

FIG. 39 is a block diagram for illustrating the test of the RAM part BRAM.

Referring to FIG. 39, a switch SW01 is rendered conductive after the test content is set, to form a path for transmitting the data of the RAM part BRAM to the data output latch in the input/output circuit 64. This path is formed after external data is inputted in the RAM part BRAM.

If application of the high voltage to the data input/output terminal DQ0 is still continued after the BIST flag is set and the prescribed combination of the data input/output terminals DQj to DQk is canceled, the enable signal BRAMRE goes high and the switch SW01 is rendered conductive to form the path while the application of the high voltage is continued. The input/output circuit 64 performs an output buffer operation during this period.

Figure 40:
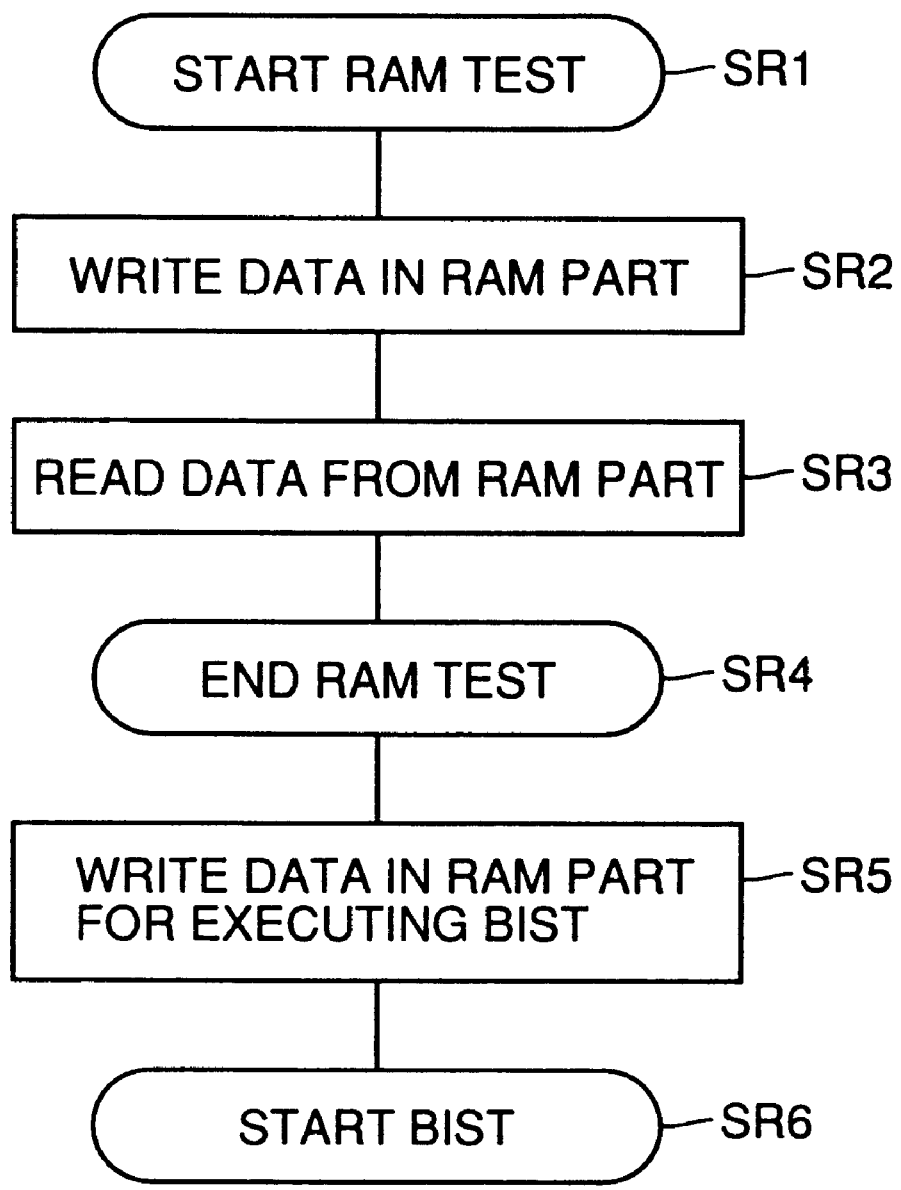
FIG. 40 is a flow chart for illustrating the test of the RAM part BRAM.

FIG. 40 is a flow chart for illustrating the test of the RAM part BRAM.

Referring to FIG. 40, the test of the RAM part BRAM is first started at a step SR1, and data is written in the RAM part BRAM at a step SR2, as described with reference to FIG. 38.

Then, the written data is read out at a step SR3. The read data is externally compared with the written data. If the written data is normally read, it is understood that the RAM part BRAM normally operates. Thus, the BIST can be executed.

The test of the RAM is ended at a step SR4, and then data corresponding to the procedure for executing the BIST is written at a step SR5. The BIST is executed at a step SR6. On the basis of the data corresponding to this procedure, a test for a checker pattern, a march pattern or the like is executed, for example.

Figure 41:
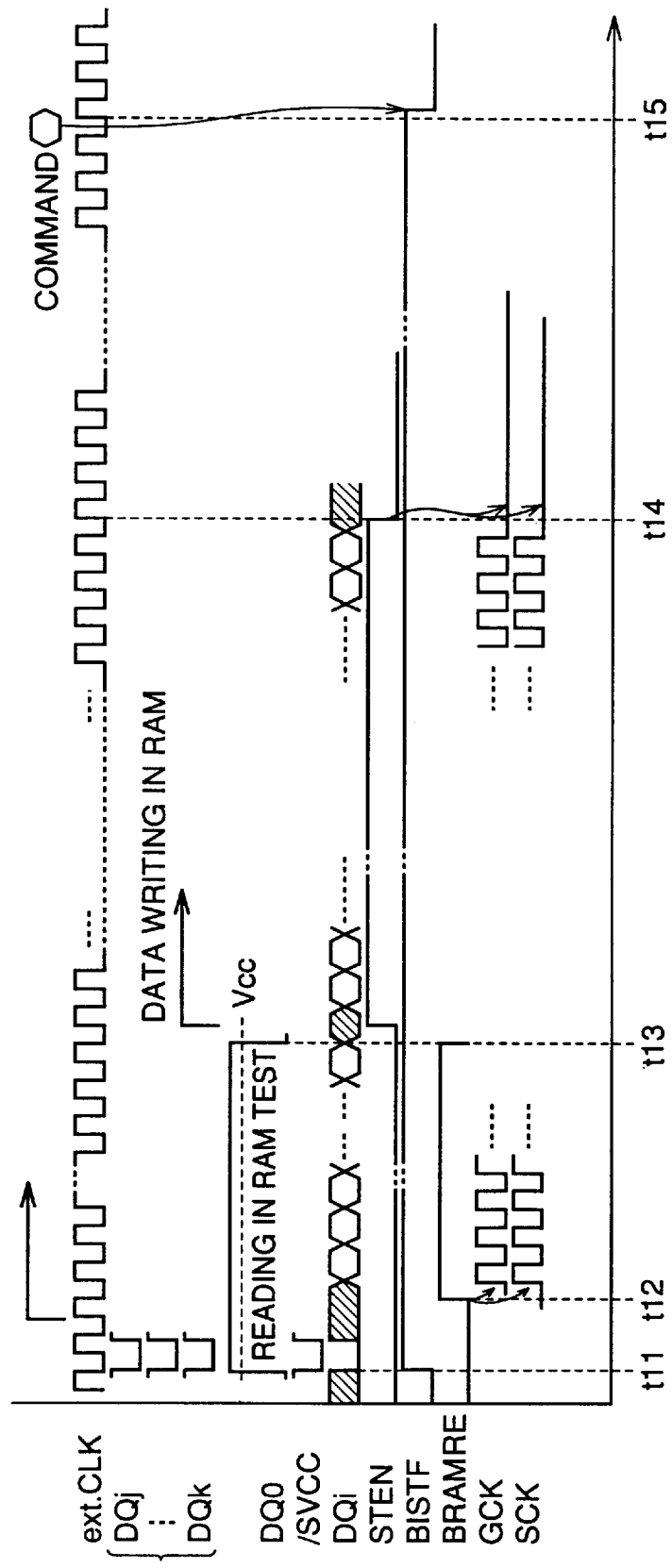
FIG. 41 is an operating waveform diagram for illustrating execution of a read test of the RAM part BRAM.

FIG. 41 is an operating waveform diagram for illustrating execution of the read test of the RAM part BRAM.

Referring to FIGS. 39 and 41, it is assumed that test data is completely written in the RAM part BRAM before a time t11.

When the data input/output terminals DQj to DQk are set in a prescribed combination and the data input/output terminal DQ0 is set at a prescribed potential exceeding the power supply potential Vcc at a time t11, the detection signal /SVCC goes low and the data input/output terminal DQi responsively goes low.

If the data input/output terminal DQ0 is still supplied with the prescribed high potential after the prescribed combination of the data input/output terminals DQj to DQk is canceled, the read test for the RAM part BRAM is executed. In this case, the enable signal BRAMRE goes high at a time t12, and the shift clock signal SCK is responsively generated on the basis of the external clock signal ext.CLK. By input of the shift clock SCK, the data set in the RAM part BRAM is read from the data input/output terminal DQi.

When the high potential level of the data terminal DQ0 is canceled at a time t13, the enable signal BRAMRE falls to a low level and data reading from the RAM part BRAM is ended. The counter of the detection circuit SVIHDEC starts counting, and the enable signal STEN goes high by a prescribed clock number. In response, the test data is written in the RAM part BRAM up to a time t14.

When the BIST is executed after the time 14 and the self refresh mode or the mode register set cycle is set at a time t15, the BIST flag BISTF is canceled and the BIST is ended.

[Monitor of Internal Data during BIST Execution]

Only a test result is generally outputted during execution of the BIST, and hence whether or not the BIST is normally executed may be unclear, and it is convenient if internal data can be outputted also during execution of the BIST, in order to analyze a failure of the chip.

Figure 42:
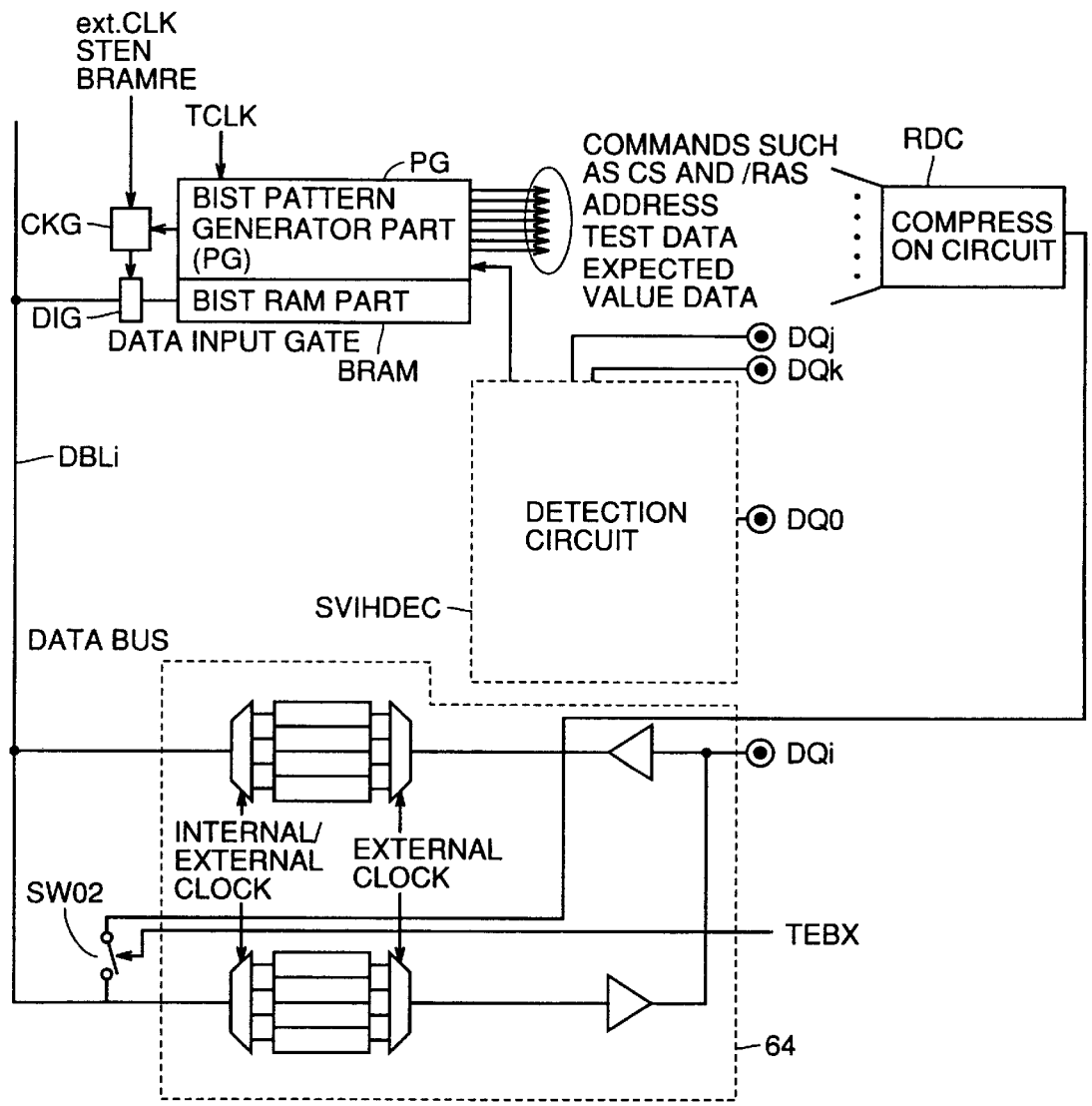
FIG. 42 illustrates a structure outputting internal data in execution of BIST.

FIG. 42 illustrates a structure for outputting internal data during execution of the BIST.

Referring to FIG. 42, a compression circuit RDC compressing commands such as CS and /RAS, an address, test data, expected value data and the like and a switch SW02 supplying an output of the compression circuit RDC as output data to be outputted to the data input/output terminal DQi in response to a test signal TEBX are provided.

The remaining structure is similar to that shown in FIG. 39, and hence redundant description is omitted.

Figure 43:
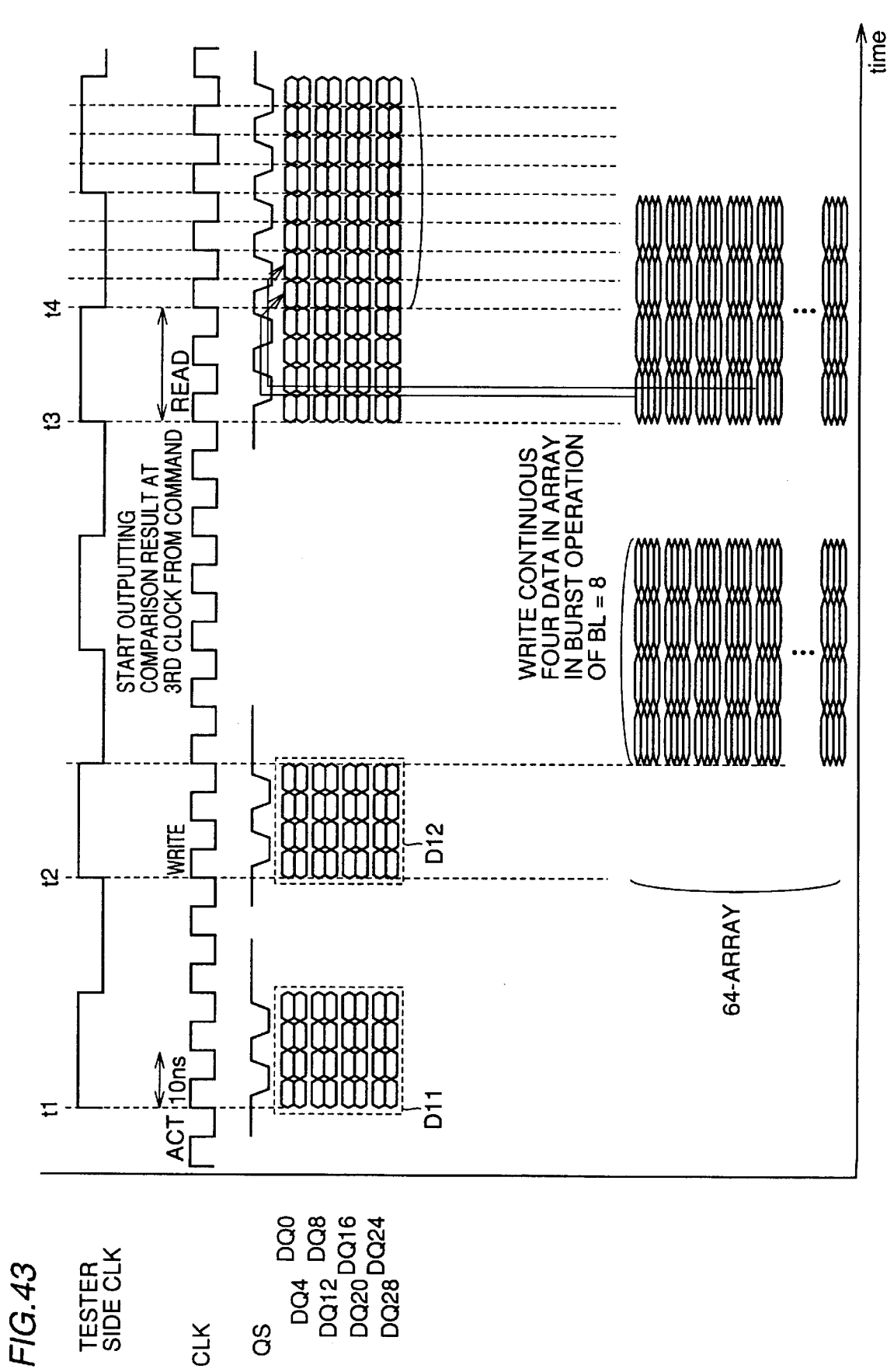
FIG. 43 is an operating waveform diagram for illustrating the manner of outputting a test execution situation from a data input/output terminal.

FIG. 43 is an operating waveform diagram for illustrating the manner of outputting the test execution situation from the data input/output terminal.

When executing the BIST, the BIST circuit 649 shown in FIG. 31 internally automatically generates the commands, the address and the data. It outputs the information so that the same can be externally monitored.

Referring to FIG. 43, it is assumed that setting for starting the BIST operation is performed before a time t1. When an active command ACT is internally executed in the BIST at the time t1, data such as internally set command and address is outputted from each data input/output terminal as a data string D11.

At a time t2, a write command is internally executed. In response to this, data of the executed command and the used address is outputted as a data string D12.

At a time t3, a read command is executed, whereby data corresponding to the internally used command and address is outputted from the data input/output terminal.

After a time t4, each data input/output terminal outputs data read from an internal memory array.

When thus reading internal information from the data input/output terminal also in a BIST mode, the internal state can be observed also in the BIST case. In other words, not correctness/incorrectness as to all test results, i.e., not only determination results are outputted but comparison results can also be outputted in units of repair by a redundant memory array for confirming whether or not repair with a spare memory array is correctly executed.

When letting the synchronous semiconductor memory device output data indicating the internal state, a strobe signal QS is also outputted so that the tester can recognize the data output period.

Thus, the internal state can also be monitored with the tester in execution of the BIST, whereby an operation confirmation result can be rendered further reliable and the cause for inconvenience or the like is easy to elucidate.

Figure 44:
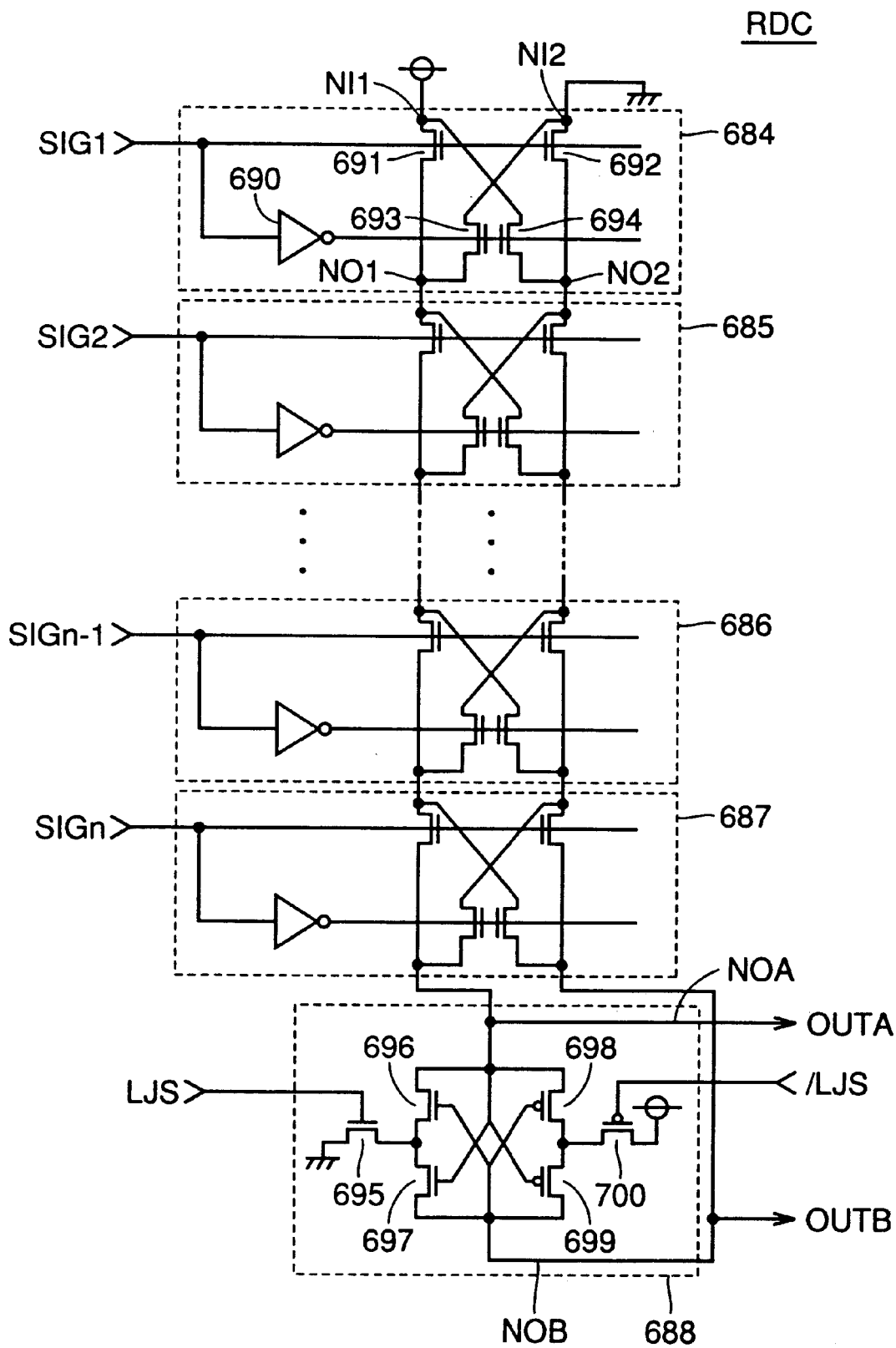
FIG. 44 is a circuit diagram showing the structure of a compression circuit RDC employed for outputting internal information of BIST.

FIG. 44 is a circuit diagram showing the structure of the compression circuit RDC employed for outputting the internal information of the BIST.

This data compression circuit is employed for reducing the cycle of output data or reducing the number of pins when outputting the internal state in execution of the BIST.

Referring to FIG. 44, a signal indicating an internal command, address data and the like are supplied to signals SIG1 to SIGn. This data compression circuit includes switching circuits 684 and 685, ..., 686 and 687 provided in correspondence to the signals SIG1 and SIG2, ..., SIGn−1 and SIGn respectively and a sense amplifier 688 receiving and amplifying an output of the switching circuit 687.

Input nodes NI1 and NI2 of the switching circuit 684 are supplied with the power supply potential and the ground potential respectively.

Output nodes NO1 and NO2 of the switching circuit 684 are connected to input nodes NI1 and NI2 of the switching circuit 685 respectively. Similarly, output nodes NO1 and NO2 of the switching circuit 686 are connected to input nodes NI1 and NI2 of the switching circuit 687 respectively. A plurality of switching circuits are serially connected between the switching circuits 685 and 686, and output nodes NO1 and NO2 of a switching circuit provided in correspondence to an m−1-th input signal are connected to input nodes NI1 and NI2 of a switching circuit provided in correspondence to an m-th (m: natural number) input signal SIGm respectively.

Output nodes NO1 and NO2 of the switching circuit 687 connected to the n-th signal, which is the final stage, are connected to input/output nodes NOA and NOB of the sense amplifier 688 respectively.

The switching circuit 684 includes an invertor 690 receiving and outputting the signal SIG1, an N-channel MOS transistor 691 connected between the input node NI1 and the output node NO1 with a gate receiving the signal SIG1, an N-channel MOS transistor 692 connected between the input node NI2 and the output node NO2 with a gate receiving the signal SIG1, an N-channel MOS transistor 694 connected between the input node NI1 and the output node NO2 with a gate receiving an output of the invertor 690, and an N-channel MOS transistor 693 connected between the input node NI2 and the output node NO1 with a gate receiving the output of the invertor 690.

The switching circuits 685 to 687 are similar in structure to the switching circuit 684, and therefore description is not repeated.

The sense amplifier 688 includes N-channel MOS transistors 696 and 697 serially connected between the input/output nodes NOA and NOB, P-channel MOS transistors 698 and 699 serially connected between the input/output nodes NOA and NOB, an N-channel MOS transistor 695 connected between a connection node of the N-channel MOS transistors 696 and 697 and a ground node for receiving a logic determination signal LJS, and a P-channel MOS transistor 700 connected between a connection node of the P-channel MOS transistors 698 and 699 and a power supply node with a gate receiving a logic determination signal /LJS.

Gates of the N-channel MOS transistors 697 and 699 are connected to the input/output node NOA. Gates of the N-channel MOS transistors 696 and 698 are connected to the input/output node NOB.

Briefly describing the operation of the data compression circuit, an output signal OUTA goes high and an output signal OUTB goes low when the number of signals having high logical levels is even among the inputted signals SIG1 to SIGn. If the number of signals having high logical levels is odd among the input signals SIG1 to SIGn, the output signal OUTA goes low and the output signal OUTB goes high.

The input nodes NI1 and NI2 of the first switching circuit 684 are supplied with data of high and low levels respectively to transmit the data to the corresponding output nodes NO1 and NO2 as such if the input signal SIG1 is at a high level. If the input signal SIG1 is at a low level, on the other hand, the data supplied to the input node NI1 is outputted to the output node NO2 while that supplied to the input node NI2 is outputted to the output node NO1.

In other words, the switching circuits 684 to 687 output input data to the corresponding output nodes as such when the inputted signal SIGn is at a high level, while exchanging the data supplied to the input nodes NI1 and NI2 and outputting the same to the output nodes NO1 and NO2 when the input signal SIGn is at a low level. Thus, it is possible to determine whether the number of the signals going high among the input signals SIG1 to SIGn is even or odd.

Signals indicating commands, address signals or the like can be inputted in the signals SIG1 to SIGn.

Therefore, when holding signals for four cycles in a latch and outputting the same through the compression circuit RDC, for example, data such as the data string D11 outputted in four cycles in FIG. 43 can be outputted in a single cycle.

Figure 45:
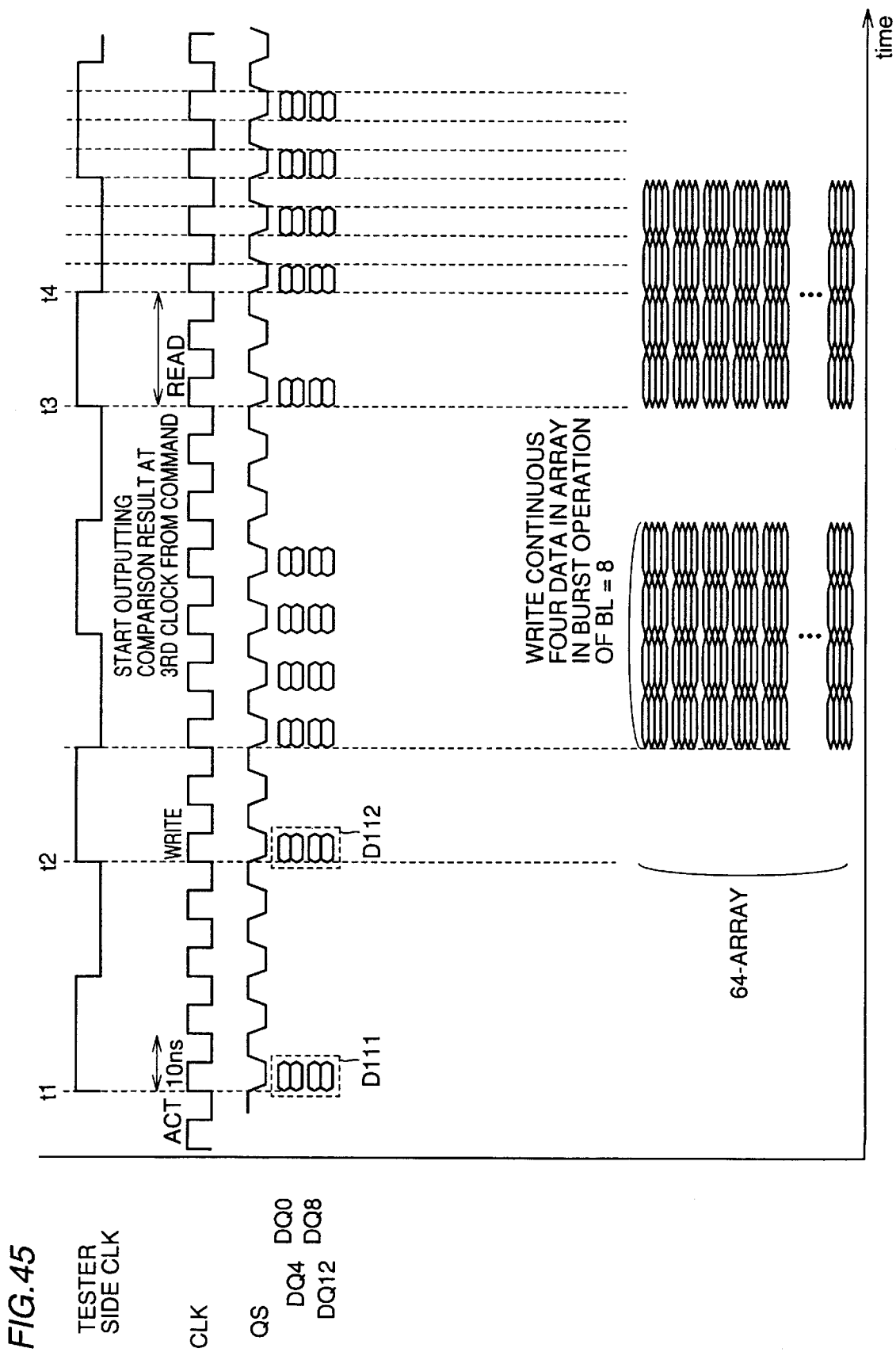
FIG. 45 is an operating waveform diagram for illustrating an operation in case of compressing and employing a command and address data.

FIG. 45 is an operating waveform diagram for illustrating an operation in case of compressing and using commands and address data.

Referring to FIG. 45, internal data information D111 corresponding to the active command ACT is outputted at a time t4. By employing the circuit shown in FIG. 44, the data string D11 shown in FIG. 43 can be thus compressed and outputted. Also at times t2 and t3, data corresponding to commands or the like are compressed and outputted. After a time t4, output data can be checked at a data rate half that in FIG. 43 by also compressing and outputting data.

Determination results of data are outputted by distributing 64 data in each cycle into 4DQ. The results are outputted while the strobe signal QS is at a low level. Thus, the number of data pins for output data can be reduced while the data rate for the output data can also be reduced, whereby the output can be monitored with a low-priced tester having low performance.

[Holding of Defective Address in BIST]

Figure 46:
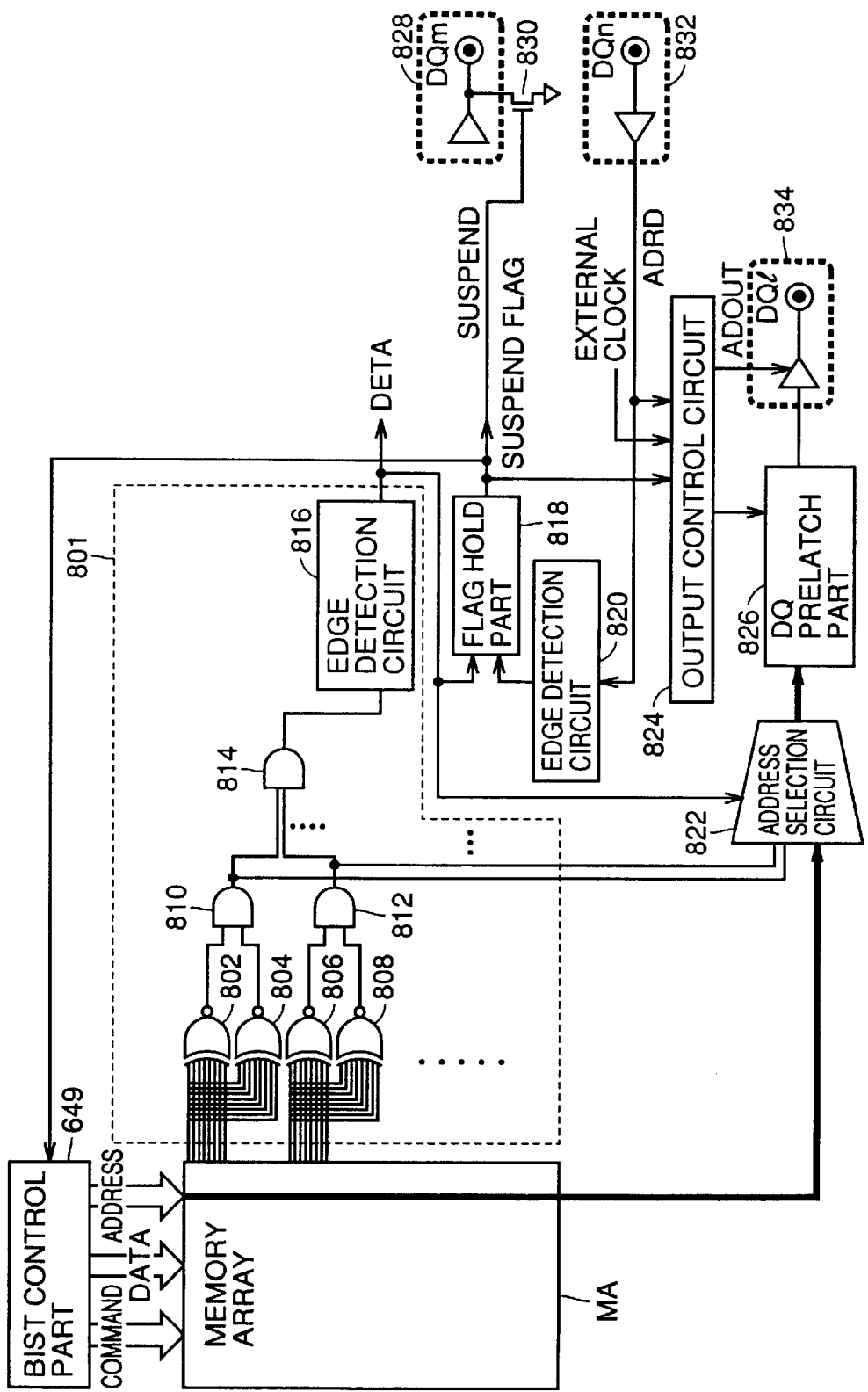
FIG. 46 is a block diagram showing a structure for reading out a defective address in execution of BIST.

FIG. 46 is a block diagram showing a structure for reading a defective address in execution of the BIST.

Referring to FIG. 46, this synchronous semiconductor memory device is provided with a BIST control part 649 automatically generating commands, data and addresses, a memory array MA receiving the commands, data and addresses generated by the BIST control part 649 and reading/writing data, and a defective detection circuit 801 detecting match of a plurality of data batch-read from the memory array MA and determining a defective.

The defective detection circuit 801 includes match detection circuits 802 to 808 detecting match of a plurality of read signals simultaneously read from the memory array MA, a gate circuit 810 receiving outputs of the match detection circuits 802 and 804, and a gate circuit 812 receiving outputs of the match detection circuits 806 and 808.

These match detection circuits have a structure similar to that described with reference to FIG. 19, and are improved in defective detection ratio. Outputs of the gate circuits 810 and 812 are ANDed by a gate circuit 814, whose output holds a high level if no defective memory cell is found out.

Although not shown, the match detection circuits and the gate circuits included in the defective detection circuit 801 are properly added in response to the number of the data batch-read from the memory array MA.

When a defective memory cell is found out, the output of the gate circuit 814 changes to a low level. The defective detection circuit 801 further includes an edge detection circuit 816 detecting this change and generating a one-shot pulse.

This synchronous semiconductor memory device further includes an address selection circuit receiving the one-shot pulse, detecting which output of the gate circuits 810 to 812 changes and outputting the corresponding address signal for the memory array MA to a DQ prelatch part 826.

This synchronous semiconductor memory device further includes a flag hold part 818 receiving the output of the edge detection circuit 816 and outputting a suspend flag, and an N-channel MOS transistor 830 rendered conductive in response to the suspend flag for fixing a data input/output terminal DQm which is an output node of an output buffer 828 to a low level.

This synchronous semiconductor memory device further includes an input buffer 832 receiving a signal from an input/output terminal DQn making specification of externally reading an address, and an output control circuit 824 outputting the address held in the DQ prelatch part 826 to the output buffer 834 in response to an output signal ADRD of the input buffer 832. A data terminal DQl outputs defective address data in response to a clock signal ADOUT.

Figure 47:
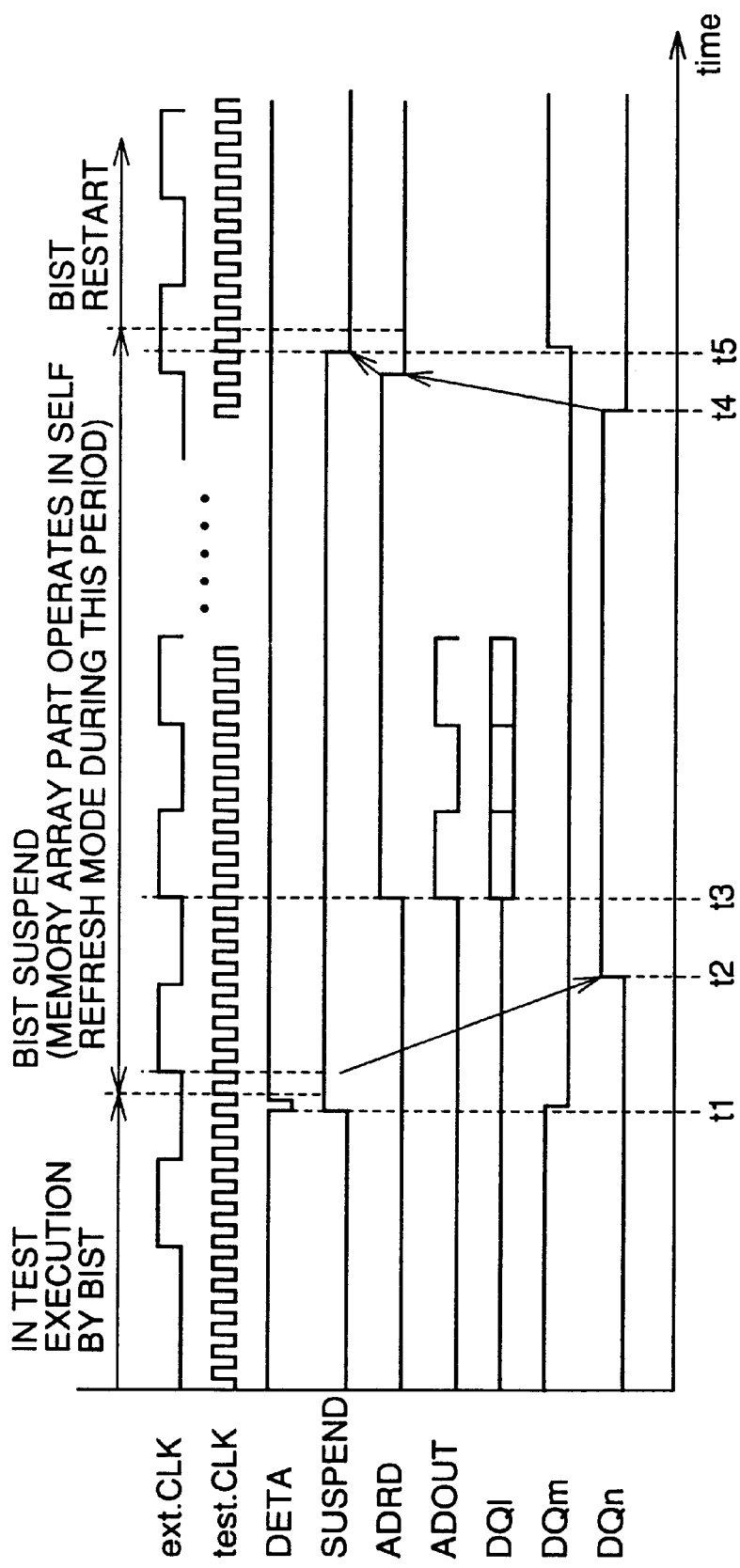
FIG. 47 is an operating waveform diagram for illustrating output of the address.

FIG. 47 is an operating waveform diagram for illustrating address output.

Referring to FIGS. 46 and 47, defectiveness of a memory cell is detected during execution of the BIST and a detection signal DETA changes at a time t1. In response to this, the suspend flag SUSPEND rises to a high level. The potential of the data input/output terminal DQm goes low.

When detecting the change of the suspend flag due to change of the data input/output terminal DQm, the externally connected tester raises the potential of the data input/output terminal DQn to a high level to output the address to the chip.

When the signal ADRD responsively changes to a high level at a time t3, the output control circuit 824 changes the signal ADOUT as an address output clock. The data input/output terminal DQ1 responsively outputs an address signal.

When completing address reading, the tester lowers the potential of the data input/output terminal DQn from the high level to a low level. The signal ADRD responsively falls to a low level, and the suspend flag SUSPEND is canceled.

At a time t5, the BIST control part 649 detects the cancellation of the suspend flag SUSPEND and restarts the BIST.

Also when executing the BIST in such a manner, an internally detected defective address can be outputted to the externally connected tester or the like, whereby redundant replacement can be executed with the outputted address.

Progress of automation of the redundant replacement is now described.

Figure 48:
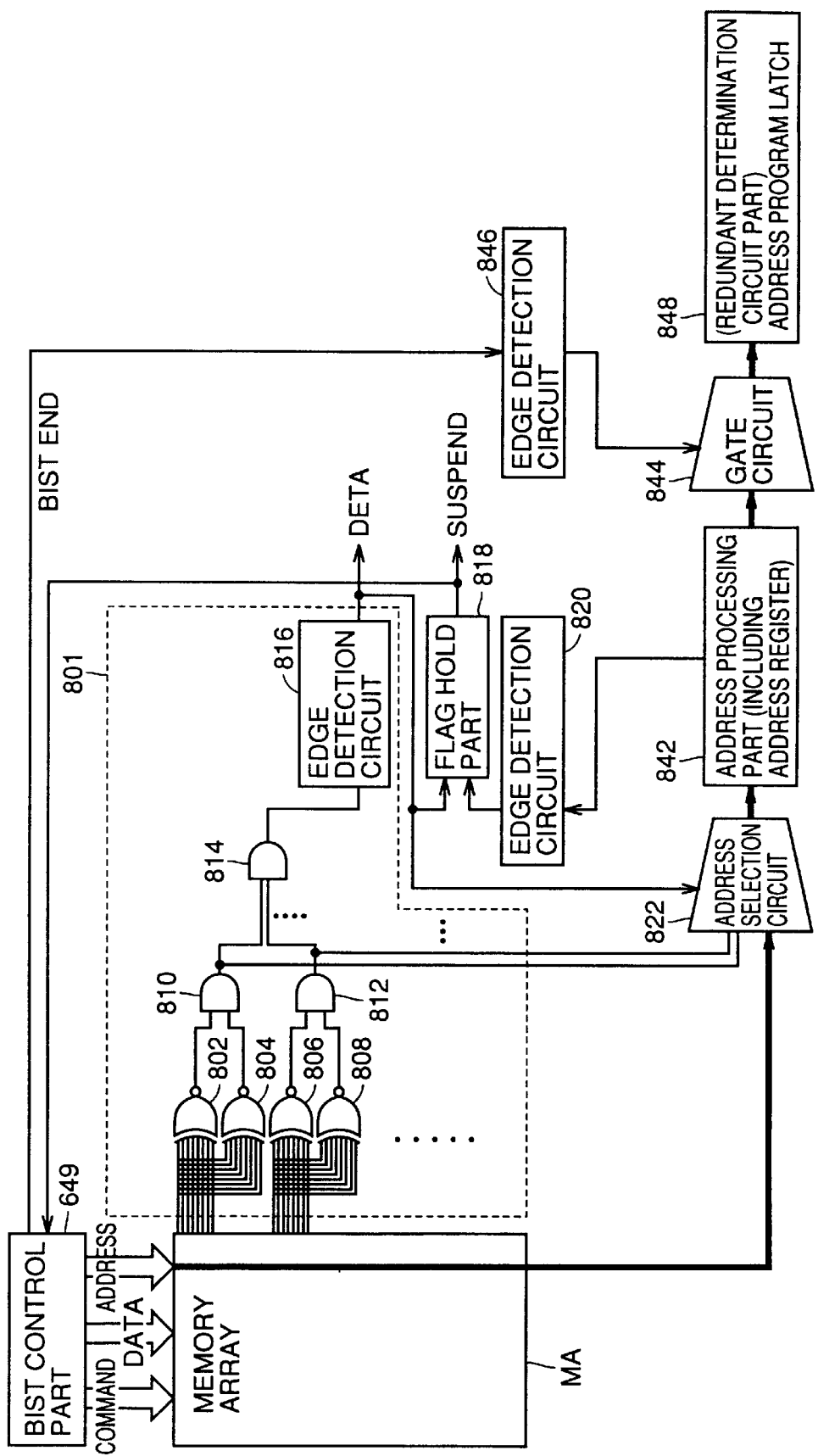
FIG. 48 illustrates a first structure of performing redundant replacement on the basis of the defective address detected in execution of BIST.

FIG. 48 illustrates a first structure performing redundant replacement on the basis of the defective address detected in execution of the BIST.

Referring to FIG. 48, this structure includes an address processing part 842 receiving an output of an address selection circuit 822, an edge detection circuit 846 detecting an edge of a signal indicating the end of the BIST outputted from the BIST control part 649, a gate circuit 844 outputting an address set in the address processing part 842 in response to an output of the edge detection circuit 846, and an address program latch 848 provided on a redundancy determination circuit part latching the address outputted from the gate circuit 844, dissimilarly to the structure shown in FIG. 46. The remaining structure is similar to that shown in FIG. 46, and therefore description is not repeated.

When receiving a detected defective address, the address processing part 842 executes prescribed address processing and outputs a high-level signal to the edge detection circuit 820 during this.

The edge detection circuit 820 detects that the address processing of the address processing part ends and the outputted signal falls to a low level, and cancels the suspend flag held in the flag hold part 818. The BIST control part 649 continuously executes the BIST.

When the BIST ends, the BIST control part 649 outputs a signal indicating the end to the edge detection circuit 846. In response to the end signal detected by the edge detection circuit 846, the gate circuit 844 transmits the defective address held in the address processing part to the address program latch of the redundancy determination circuit part so that the defective address is inputted therein as a replace address. An electrically reloadable nonvolatile memory, for example, is employed for the address program latch.

Figure 49:
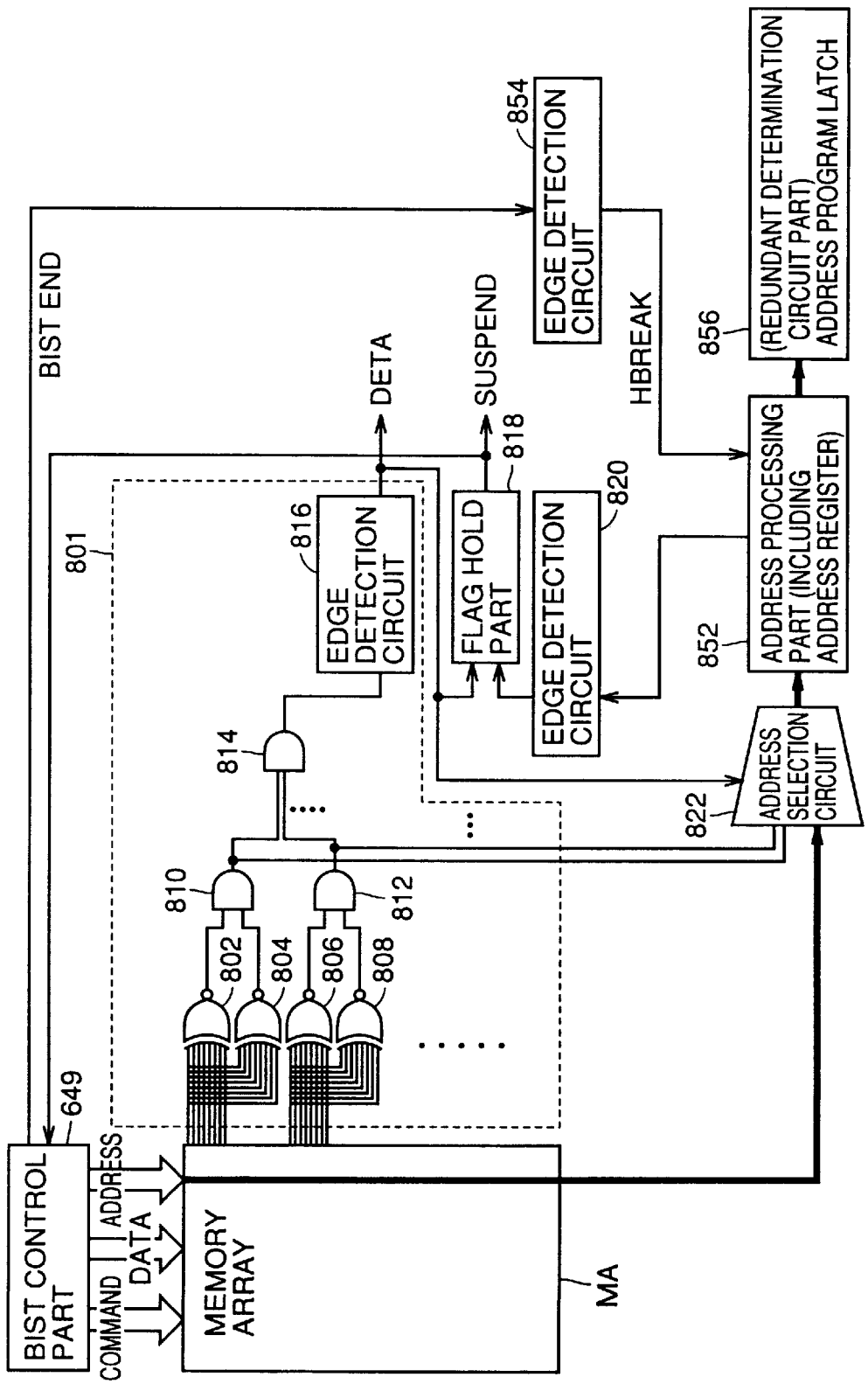
FIG. 49 is a block diagram showing a second structure performing redundant replacement after end of BIST.

FIG. 49 is a block diagram showing a second structure performing redundant replacement after the end of the BIST.

Referring to FIG. 49, an edge detection circuit 854 detecting a BIST end signal outputted from a BIST control part 649 outputs a signal HBREAK.

An address processing part 852 receiving and processing an address from the address selection circuit 822 contains an electric fuse, for fixing the held address by input of the signal HBREAK. The fixed address is transmitted to an address program latch 856 of a redundancy determination circuit part for replacement of a defective address.

This structure is different from that shown in FIG. 48 in the above point.

Figure 50:
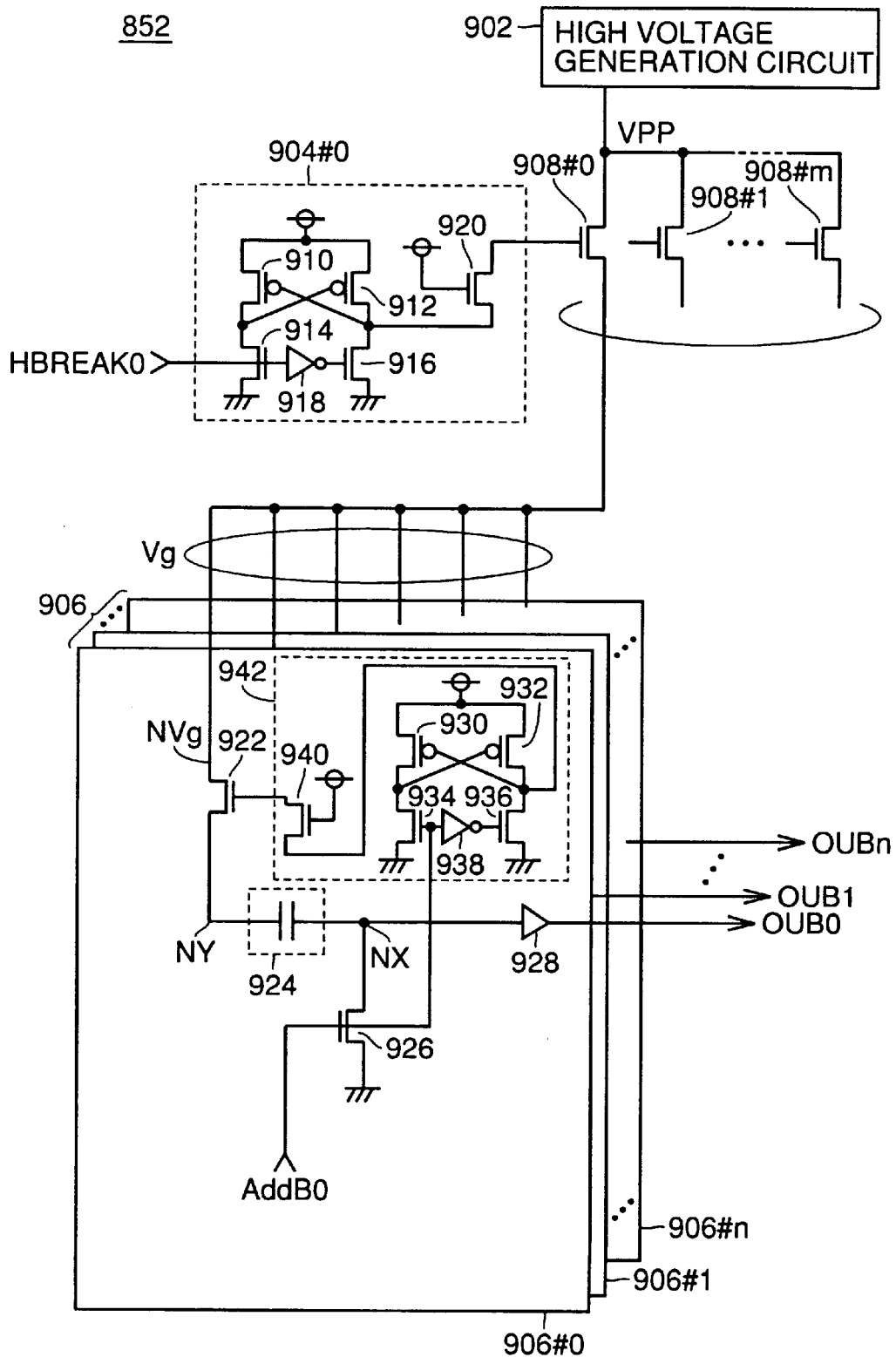
FIG. 50 illustrates a structure for performing address fixation included in an address processing part 852 shown in FIG. 49.

FIG. 50 illustrates a structure for performing address fixation included in the address processing part 852 shown in FIG. 49.

Referring to FIG. 50, the address processing part 852 includes a high voltage generation circuit 902 generating a high voltage employed for breaking the fuse in address fixation, a level conversion circuit 904#0 receiving a signal HBREAK0 in the end of the BIST and performing level conversion, an N-channel MOS transistor 908#0 having a gate receiving an output of the level conversion circuit 904#0, and an address fixation part 906 receiving the high voltage when the N-channel MOS transistor 908#0 is conductive for performing address fixation in response to prescribed address signals AddB0 to AddBn. The signal HBREAK in FIG. 49 includes signals HBREAK0 to HBREAKm corresponding to m address fixation parts (m: natural number), and FIG. 50 representatively shows a structure related to the signal HBREAK0.

The address fixation part 906 includes address fixation parts 906#0 to 906#n corresponding to the address signal bits AddB0 to AddBn, for outputting signals OUB0 to OUBn indicating a replace address to the address program latch 856 shown in FIG. 49 respectively.

Although not shown, the address processing part 852 further includes level conversion circuits 904#1 to 904#0 receiving the signals HBREAK1 to HBREAKm and performing level conversion, and outputs of the level conversion circuits 904#1 to 904#n are supplied to N-channel MOS transistors 908#1 to 908#m. Although not shown, circuits similar to the address fixation part 906 are provided in correspondence to the N-channel MOS transistors 908#1 to 908#m respectively.

The level conversion circuit 904#0 includes an N-channel MOS transistor 914 having a gate receiving the signal HBREAK0 and a source connected to a ground node, an invertor 918 receiving and inverting the signal HBREAK0, an N-channel MOS transistor 916 having a gate receiving an output of the invertor 918 and a source connected to a ground node, a P-channel MOS transistor 910 connected between a drain of the N-channel MOS transistor 914 and a power supply node with a gate connected with a drain of the N-channel MOS transistor 916, a P-channel MOS transistor 912 connected between the drain of the N-channel MOS transistor 916 and a power supply node with a gate connected to the drain of the N-channel MOS transistor 914, and an N-channel MOS transistor 920 connected between the drain of the N-channel MOS transistor 916 and an output node of the level conversion circuit 904#0 with a gate connected to a power supply node.

Although not shown, the level conversion circuits 904#1 to 904#m are similar in structure to the level conversion circuit 904#0.

The address fixation part 906#0 includes an N-channel MOS transistor 922 connected between a node NVg supplied with a high voltage in response to the signal HBREAK0 and a node NY, a fuse element 924 connected between the node NY and a node NX, an N-channel MOS transistor 926 connected between the node NX and a ground node with a gate receiving the signal AddB0, a level conversion circuit 942 receiving and level-converting the signal AddB0 and supplying the level-converted to the gate of the N-channel MOS transistor 922, and a buffer circuit 928 having an input connected with the node NX and outputting the signal OUB0.

The fuse element 924 is a capacitor whose electrodes are isolated in general, while the isolation is broken when a high voltage is applied between the nodes NX and NY.

The level conversion circuit 942 includes an N-channel MOS transistor 934 having a gate receiving the signal AddB0 and a source connected to a ground node, an invertor 938 receiving and inverting the signal AddB0, an N-channel MOS transistor 936 having a gate receiving an output of the invertor 938 and a source connected to a ground node, a P-channel MOS transistor 930 connected between a drain of the N-channel MOS transistor 934 and a power supply node with a gate connected to a drain of the N-channel MOS transistor 936, a P-channel MOS transistor 932 connected between the drain of the N-channel MOS transistor 936 and the power supply node with a gate connected to the drain of the N-channel MOS transistor 934, and an N-channel MOS transistor 940 connected between the drain of the N-channel MOS transistor 936 and an output node of the level conversion circuit 942 with a gate connected to a power supply node.

Figure 51:
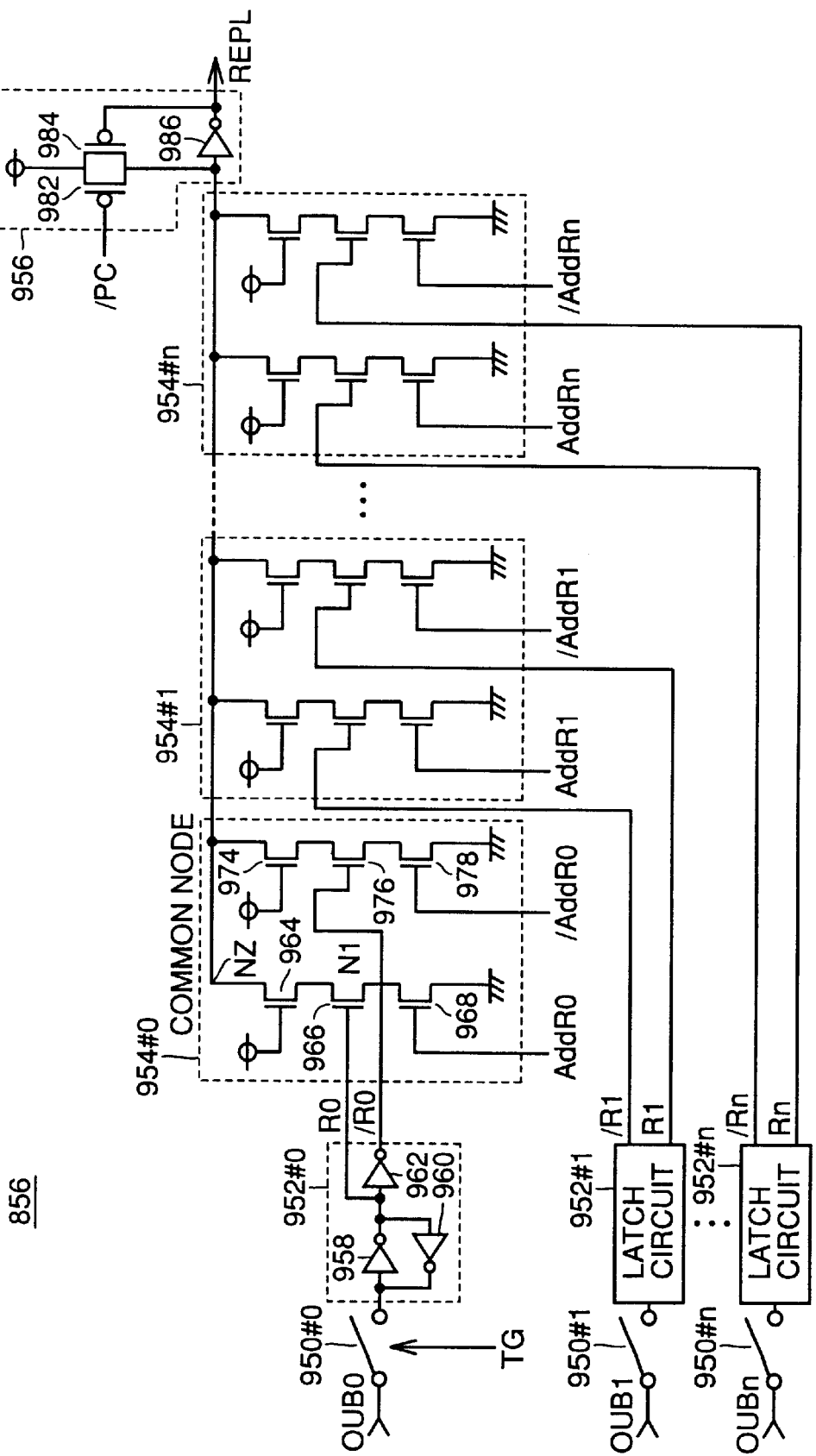
FIG. 51 is a circuit diagram showing the structure of an address program latch 856 shown in FIG. 49.

FIG. 51 is a circuit diagram showing the structure of the address program latch 856 shown in FIG. 49.

Referring to FIG. 51, the address program latch 856 includes a switch 950#0 transmitting the signal OUB0 supplied from the address processing part 852 in response to a signal TG, a latch circuit 952#0 latching the signal OUB0 supplied through the switch 950#0 and outputting signals R0 and /R0, and a bit compare part 954#0 connecting a common node NZ with a ground node in response to the combination of the signals R0 and /R0 and signals AddR0 and /AddR0.

The address program latch 856 further includes a switch 950#i transmitting a signal OUBi supplied from the address processing part 852 in response to the signal TG, a latch circuit 952#i latching the signal OUBi supplied through the switch 950#i and outputting signals Ri and /Ri, and a bit compare part 954#i connecting the common node NZ with the ground node in response to the combination of the signals Ri and /Ri and signals AddRi and /AddRi (i: natural number of 1 to n).

The latch circuit 952#0 includes an invertor 958 having an input connected to the switch 950#0 and outputting the signal /R0, an invertor 960 receiving the signal /R0 in its input, inverting the same and supplying the inverted signal to an input node of the invertor 958, and an invertor 962 receiving and inverting the signal /R0 and outputting the signal R0.

The latch circuits 952#1 to 952#n receive the signals OUB1 to OUBn through the switches 950#1 to 950#n respectively, and output the signals R1 to Rn, /R1 to /Rn. The latch circuits 952#1 to 952#n are similar in structure to the latch circuit 952#0, and therefore description is not repeated.

The bit compare part 954#0 includes N-channel MOS transistors 964, 966 and 968 serially connected between the common node NZ and the ground node. Gates of the N-channel MOS transistors 964, 966 and 968 receive the power supply potential, the signal /R0 and the signal /AddR0 respectively.

The bit compare part 954#0 further includes N-channel MOS transistors 974, 976 and 978 serially connected between the common node NZ and the ground node. Gates of the N-channel MOS transistors 974, 976 and 978 receive the power supply potential, the signal R0 and the signal AddR0 respectively.

The bit compare parts 954#1 to 954#n are similar in structure to the bit compare part 954#0, and therefore description is not repeated.

The address program latch 856 further includes a latch circuit 956 precharging the common node NZ in response to a precharge signal /PC and holding the potential of the common node.

The latch circuit 956 includes a P-channel MOS transistor 982 connected between the common node NZ and the power supply node with a gate receiving the precharge signal /PC, an invertor 986 having an input connected with the common node NZ and outputting a replace instruction signal REPL, and a P-channel MOS transistor 984 connected between the common node NZ and the power supply node with a gate receiving the replace instruction signal REPL.

Figure 52:
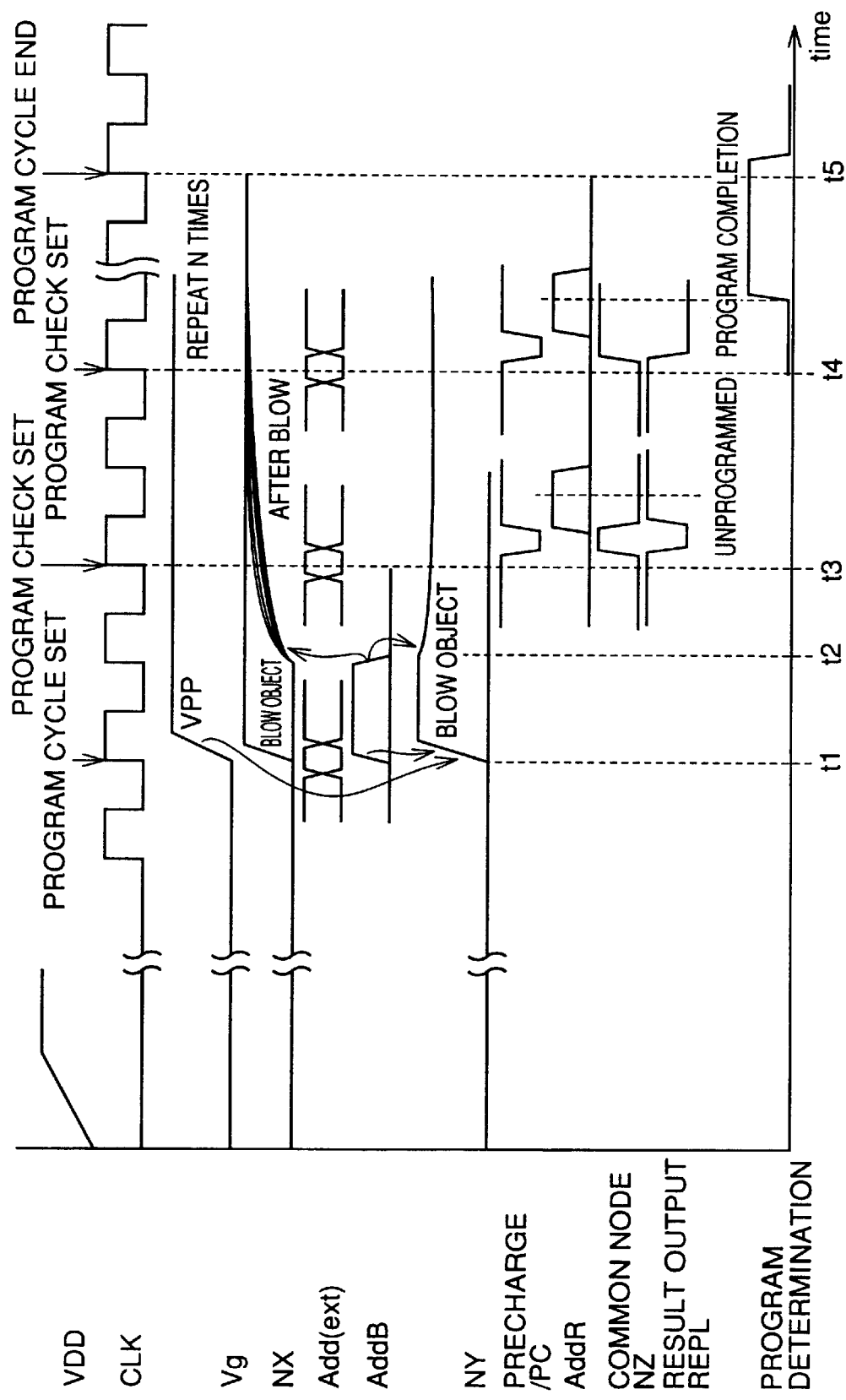
FIG. 52 is an operating waveform diagram for illustrating the manner of address fixation performed in the address processing part.

FIG. 52 is an operating waveform diagram for illustrating the manner of address fixation in the address processing part.

Referring to FIGS. 50 and 52, an address AddB of a redundant row and a redundant column to be replaced is decided on the basis of accumulation of the defective address detected in the BIST in a circuit part (not shown) in the address processing part 852. The address fixation part 906 is supplied with the signals AddB0 to AddBn corresponding to respective address bits of the address AddB. When the BIST ends and the signal HREAK0 is supplied to the address processing part 852, a high voltage VPP is supplied to the node NY at a time t1. If the corresponding signal AddB0 is at a high level at this time, the potential of the node NX goes low, the potential difference between the electrodes of the capacitor 924 which is the fuse element increases, dielectric breakdown takes place and the fuse element is rendered conductive.

When the address AddB0 is canceled at a time t2, the node NX rendered conductive to the node NY by the broken fuse (capacitor). The potential of the node NX reaches a prescribed potential.

At times t3 and t4, the address set by breaking the fuse is confirmed. A non-set address is inputted as Add(ext) at the time t3, and the set address matches with the address Add(ext) at the time t4. The address Add(ext) is generated by the BIST circuit in place of an externally inputted address.

Before a time t5, address setting and checking are repeated by the number of the address fixation parts corresponding to the N-channel MOS transistors 908#1 to 908#m. At the time t5, the program cycle ends and determination is finally made as to whether or not the address has been normally programmed, and if the result of determination indicates an unprogrammed state, the fuse may have been insufficiently broken and hence the program is repeated again.

Figure 53:
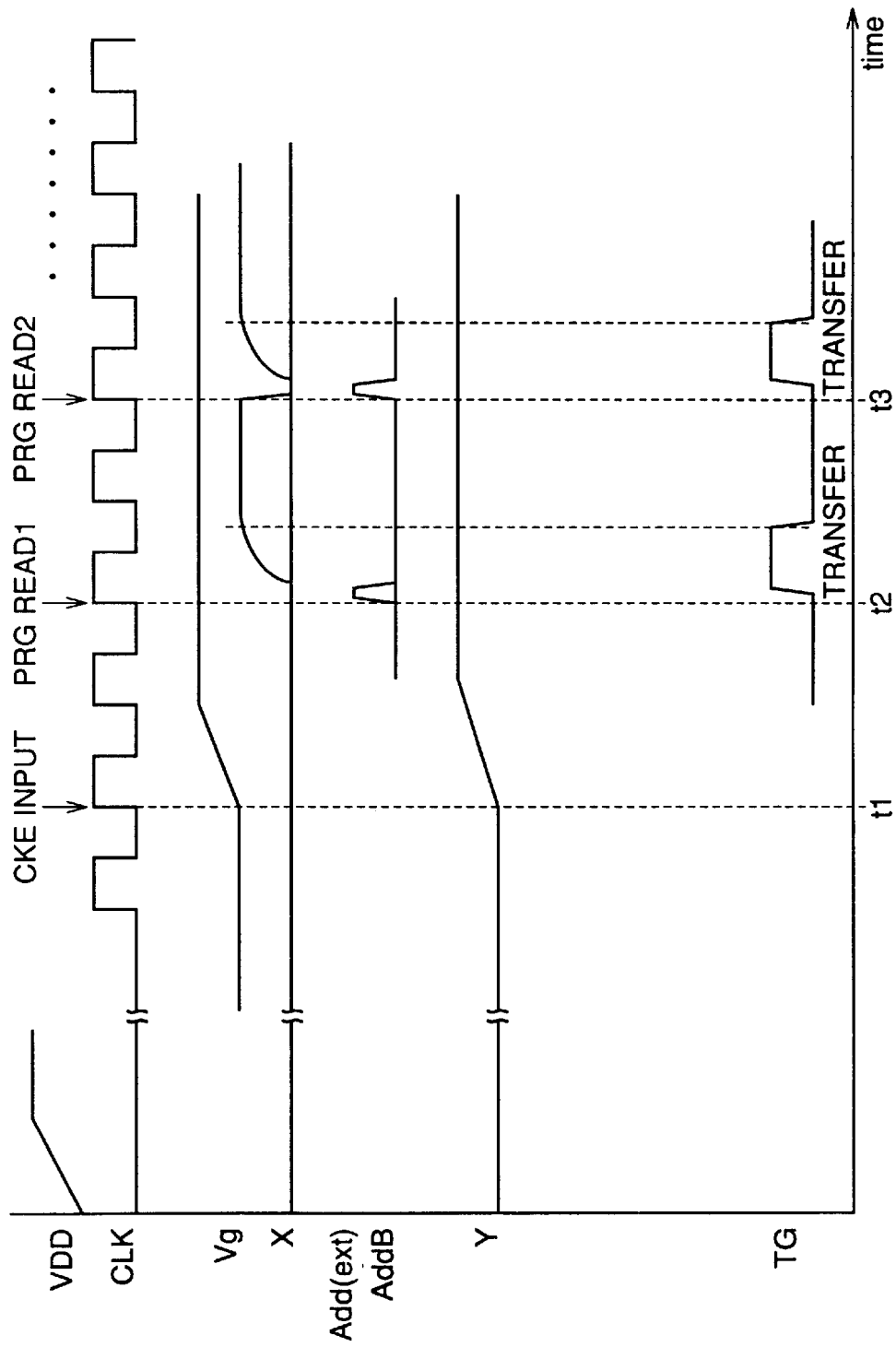
FIG. 53 is an operating waveform diagram for illustrating an operation following power supply after address fixation.

FIG. 53 is an operating waveform diagram for illustrating an operation following power supply after address fixation.

Referring to FIG. 53, a command CKE is inputted at a time t1 after a lapse of a prescribed time following power supply after address fixation. At this time, the node NX is initialized to a low level by temporarily bringing all signals AddB0 to AddBn into high levels.

After a time t2, the replace address held in the address processing part 852 in FIG. 49 by breaking of the fuse is sequentially transferred to and held in the address program latch 856. At the time t2, the address processing part 852 transfers a first replace address to the address program latch 856 by a transfer instruction PRGREAD1. Then, at a time t3, the address processing part 852 transfers a second replace address to the address program latch 856 by a transfer instruction PRGREAD2.

This transfer, which is performed a plurality of times with a set time of a clock recovery circuit such as a DLL circuit, may alternatively be performed once if the number of redundant rows and redundant columns is small. When performing the transfer once, a command register set cycle or the like is employed.

By employing the structure of performing redundant replacement itself after execution of the BIST as described with reference to FIGS. 48 to 53, the chip itself can execute detection of a defective address and redundant replacement with no high-priced tester, and hence the cost can be further reduced.

[Processing of Defective Address in BIST Execution]

A structure of performing holding of defective addresses and redundant replacement in the chip when executing the BIST is now described.

Figure 54:
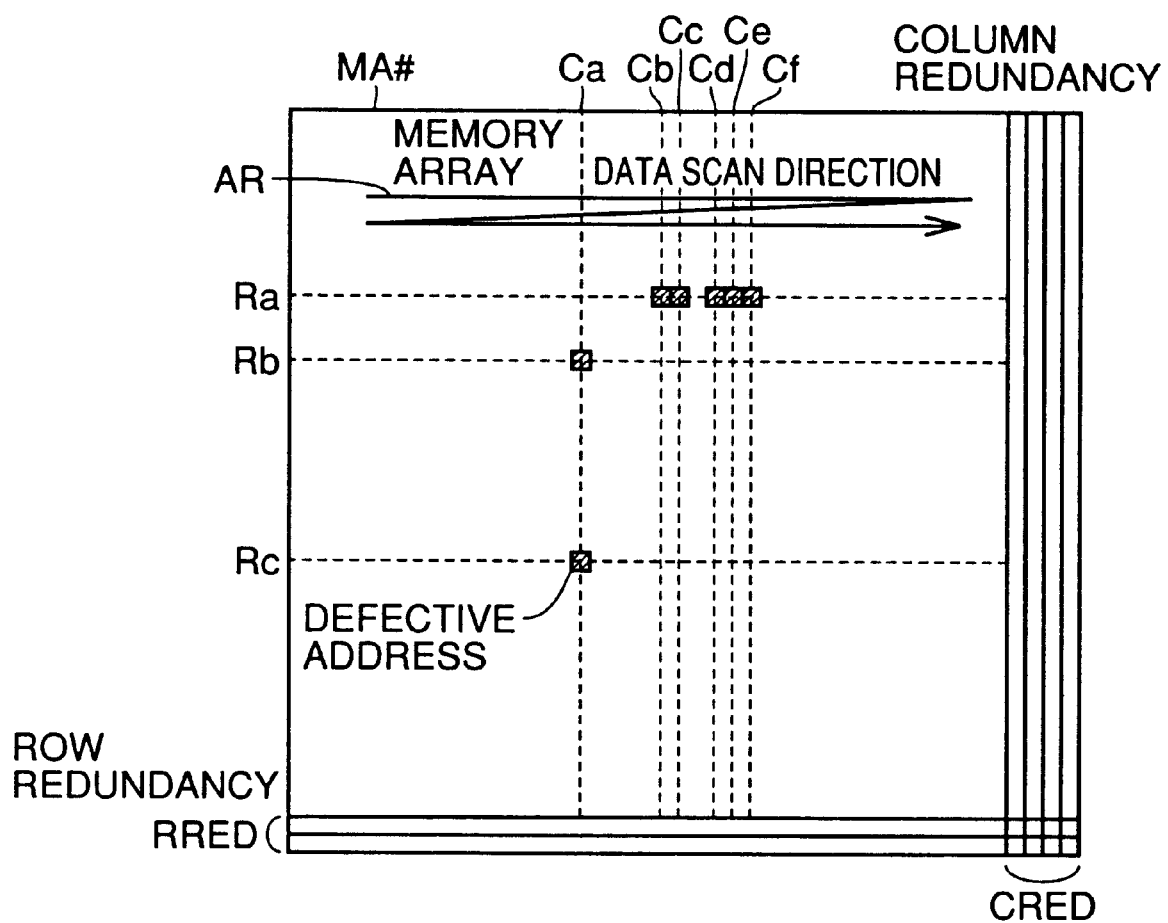
FIG. 54 is a diagram for illustrating a test of memory cells in a memory array.

FIG. 54 is a diagram for illustrating a test of memory cells in the memory array.

Referring to FIG. 54, a memory array MA# is provided with two redundant rows RRED and four redundant columns CRED.

As shown by arrow AR, the test of the memory cells is sequentially performed along the row direction to shift to the next row when completing the test of memory cells of one row. This memory array has seven defective memory cells. Assuming that the address of each defective memory cell is called a defective address, the memory array has seven defective addresses (row address, column address)=(Ra, Cb), (Ra, Cc), (Ra, Cd), (Ra, Ce), (Ra, Cf), (Rb, Ca) and (Rc, Ca).

In order to replace such defective addresses with redundant rows and redundant columns, a general tester stores the defective addresses when executing an operation test. The tester can display the defective bits on a fail bit memory. When testing a DRAM of 64 Mbits, for example, the tester can display a 64-Mbit space.

When executing the BIST with a test circuit contained in the chip, such a fail bit memory cannot be arranged on the chip and hence the defective addresses must be fully stored.

The difficult point in this case resides in that the combination of redundant rows and redundant columns employed for replacement of the defective memory cells vary with the arrangement of the defective addresses.

While the redundant rows or the columns may be sequentially allotted to generated defective addresses as the simplest method, the maximum number of repaired bits only corresponds to (number of redundant rows+number of redundant columns) in this case, leading to inferior repair efficiency.

For example, five defective memory cells are present on the row address Ra in FIG. 54 and hence five redundant columns are necessary for repairing all defective memory cells with redundant columns. When replacing the row address Ra with a redundant row, however, five defective memory cells can be repaired with a single redundant column. A contrivance is necessary for how to determine such efficient repair.

The semiconductor memory device according to the embodiment 3 enables this determination by providing counters counting the number of appearance of defective addresses.

Figure 55:
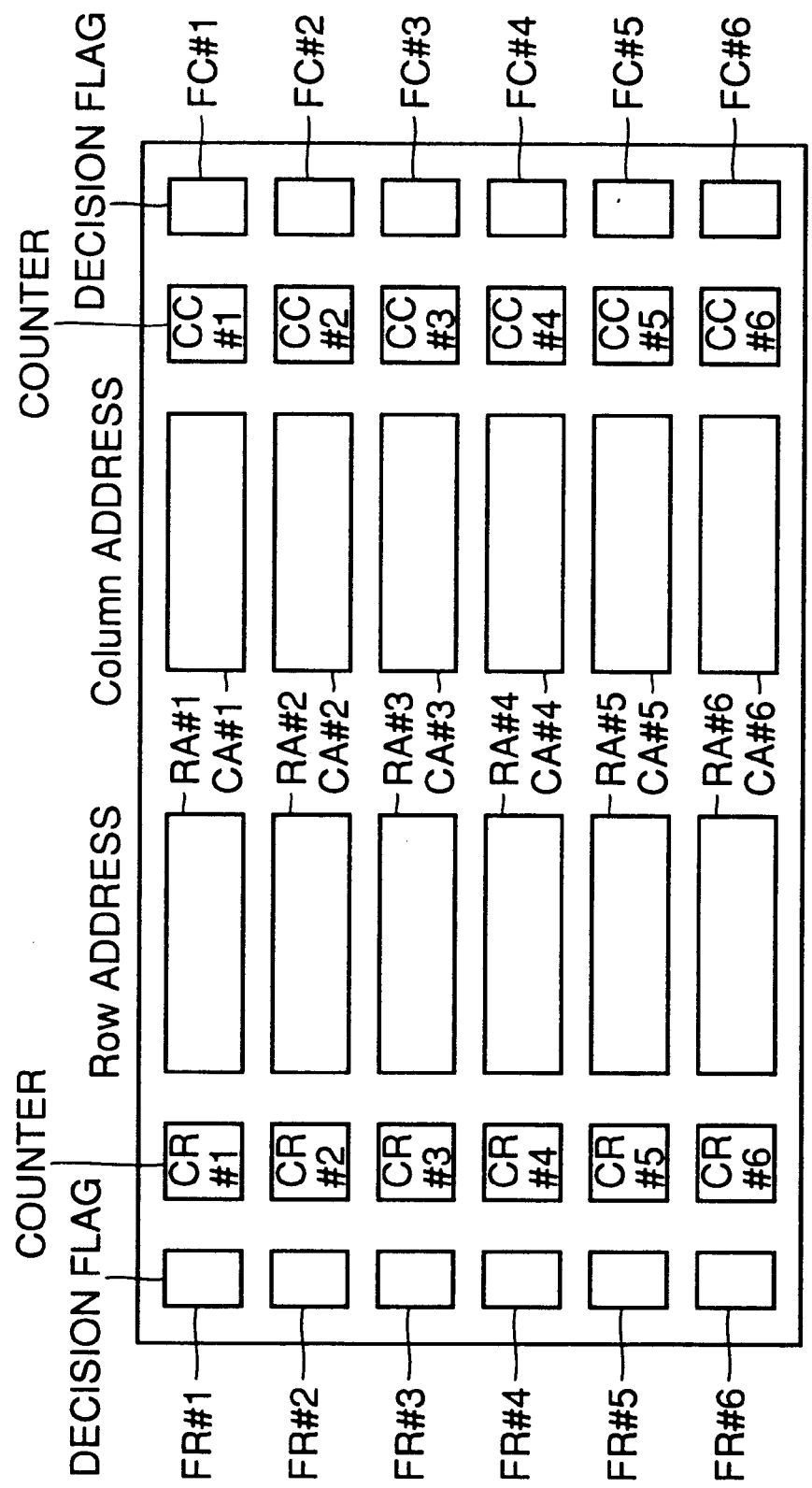
FIG. 55 is a schematic diagram for schematically illustrating the address processing part 842 shown in FIG. 48.

FIG. 55 is a schematic diagram for schematically illustrating the structure of the address processing part 842 shown in FIG. 48.

Referring to FIG. 55, provided are address registers RA#1 to RA#6 storing defective row addresses when defective memory cells are found, counters CR#1 to CR#6 provided in correspondence to the address registers RA#1 to RA#6 respectively for comparing the row addresses stored in the address registers RA#1 to RA#6 with inputted defective row addresses and incrementing the count values by 1 when the former match with the latter, and flag hold parts FR#1 to FR#6 provided in correspondence to the address registers RA#1 to RA#6 for indicating that the stored row addresses are replaced with a redundant row.

Similarly, provided for column addresses are address registers CA#1 to CA#6 storing defective column addresses corresponding to the defective memory cells, counters CC#1 to CC#6 provided in correspondence to the address registers CA#1 to CA#6 for comparing the column addresses stored in the address registers CA#1 to CA#6 with inputted defective column addresses and incrementing the count values by 1 when the former match with the latter, and flag hold parts FC#1 to FC#6 provided in correspondence to the address registers CA#1 to CA#6 for indicating that replacement of the stored row addresses with a redundant row is decided.

Thus, the address registers and the counters are arranged in sets to observe how many times an address appearing once repeatedly appears. When the count number exceeds a constant value, replacement of the address of the corresponding row or column is decided.

Referring again to FIG. 54, it is impossible to repair all defective addresses by a redundant column if five or more defective addresses are found along the column direction on the same row address Ra when four redundant columns are present. In such a case, a redundant column must be employed.

In other words, the value of the counter is monitored and repair of a row address with a redundant row is decided when the counter value reaches a level exceeding the number of the redundant columns, i.e., four, with respect to appearance of the same row address. When the same row address is thereafter confirmed, all are repaired with this redundant row. Therefore, the column address of a memory cell present on the row address for which repair with the redundant row has been decided is thereafter excluded from the object of address holding.

When employment of the redundant row is decided, it follows that the number of employable redundant rows is thereafter reduced by 1. Therefore, the limit value of the counter counting the number of defectives of the same column address is decreased by 1. Referring to FIG. 54, the number of employable redundant rows is (2−1=1) after repair of the row of the row address Ra with the redundant row is decided and it follows that the column address Ca can be repaired only with the redundant column when the counter value for the defective column address Ca reaches 2.

This operation is repeated to accumulate defective addresses. If observation of defective addresses is not performed in excess of the set (number of redundant rows+number of redundant columns) of the arranged address registers, i.e., (2+4=6) in FIG. 54 when the test is completed, the memory array is determined as repairable. If mutually different defective addresses are detected beyond the repairable number, however, determination of unrepairability is made at the point of time. The state of change of address storage in the arrangement of the defective memory cells shown in FIG. 54 is now described.

Figure 56:
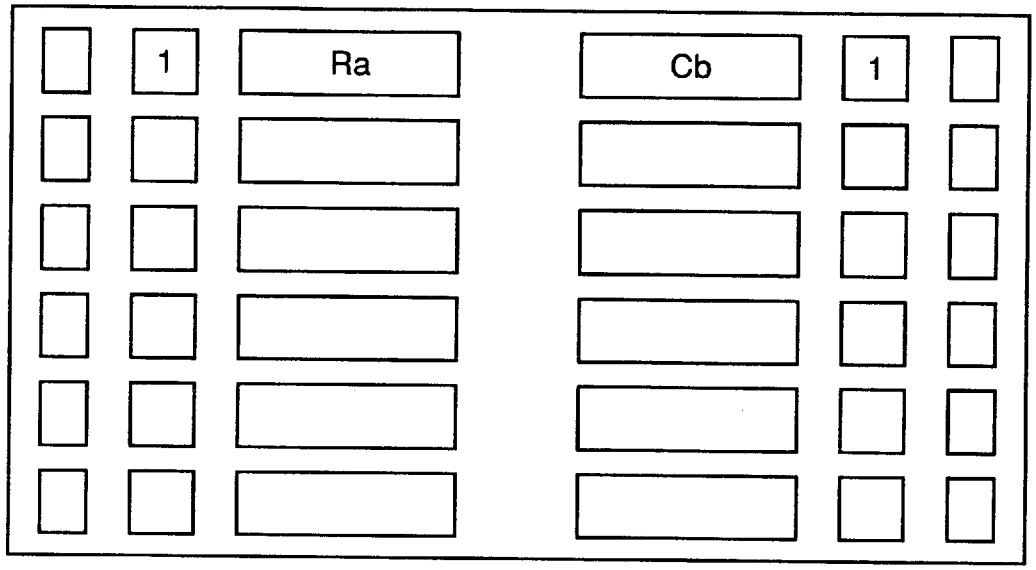

FIG. 56 illustrates the state of a first stage of address storage.

Referring to FIGS. 54 and 56, no defective memory cell is detected before reaching the address (Ra, Cb). When the memory cell corresponding to the address (Ra, Cb) is checked and regarded as defective, the address register RA#1 for the row address stores the row address Ra and a count number 1 is set in the defective address count part CR#1. Similarly, the address register CA#1 storing the column address stores the column address Cb, and the defective address count part CC#1 holds the count number 1.

Figure 57:
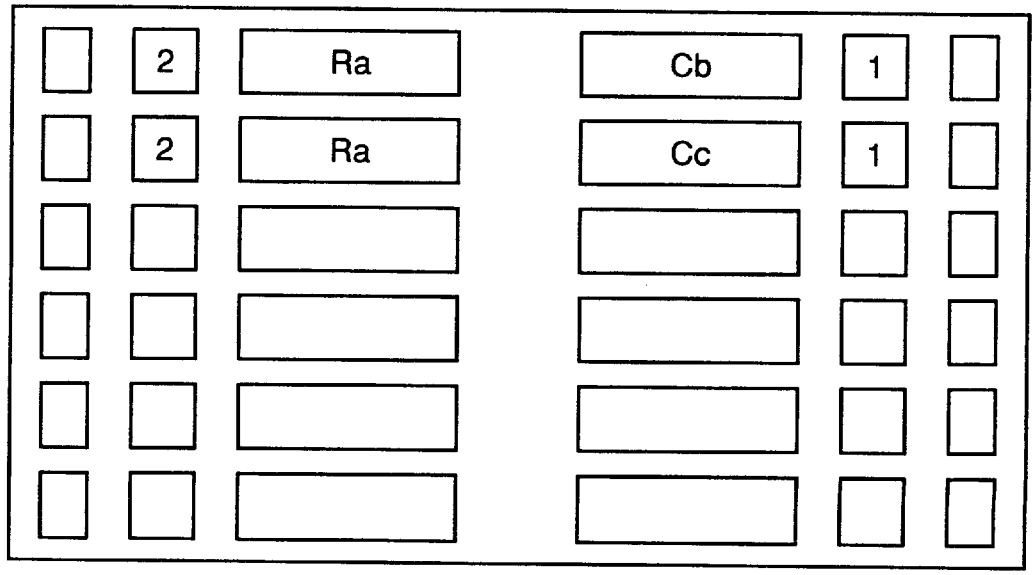

FIG. 57 illustrates the state of a second stage of address storage.

Referring to FIGS. 54 and 57, the memory cell corresponding to the address (Ra, Cc) is checked and regarded as defective, and hence the address register Ra#2 stores the row address Ra and the address register CA#2 stores the column address Cc. The count values of the defective address count parts CR#1 and CR#2 increase since the appearance of the row address Rw is the second time and hence count numbers 2 are held.

The count value of the defective address count part CC#1 remains unchanged, while the defective address count part CC#2 holds 1.

FIG. 58 illustrates the state of a third stage of address storage.

Referring to FIGS. 54 and 58, defectiveness of the memory cell of the address (Ra, Cd) is detected so that the address register RA#3 stores the row address Ra and the address register CA#3 stores the column address Cd. Since the appearance of the row address Ra is the third time, the count values of the defective address count parts CR#1 to CR#3 increase by 1 to three. The defective address count part CC#3 holds a count value 1.

FIG. 59 illustrates the state of a fourth stage of address storage.

Referring to FIGS. 54 and 59, the defective memory cell of the address (Ra, Ce) is detected so that the address register RA#4 stores the row address Ra and the address register CA#4 stores the column address Ce. The count values of the defective address count p arts CR#1 to CR#4 reach 4, and the defective address count part CC#4 holds a count value 1.

Figure 60:
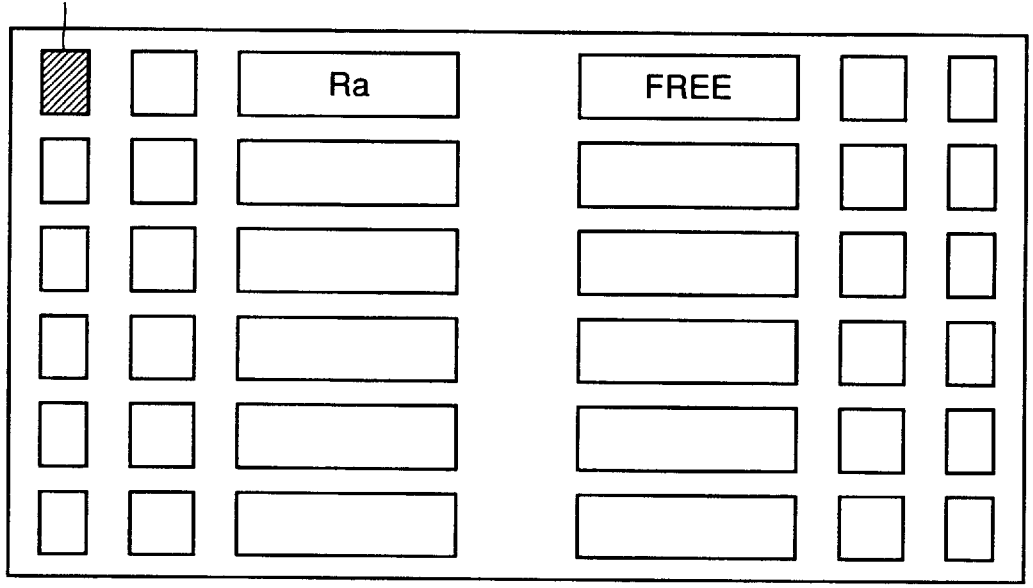

FIG. 60 illustrates the state of a fifth stage of address storage.

Referring to FIGS. 54 and 60, the number of detection of the row address Ra reaches 5 when a defective memory cell is detected on the address (Ra, Cf). This state cannot be replaced even if all redundant rows CRED are allocated, and hence it is decided that the row address Ra is replaced with any one of the redundant rows RRED.

A flag is set in the flag hold part FR#1, and the row address Ra stored in the address register RA#1 is fixed. Thereafter no column address may be held if the row address of the defective memory cell is Ra. Therefore, the address register CA#1 enters an address-free state. Further, the addresses set in the address registers RA#2 to RA#4 and CA#2 to CA#4 are cleared.

Figure 61:
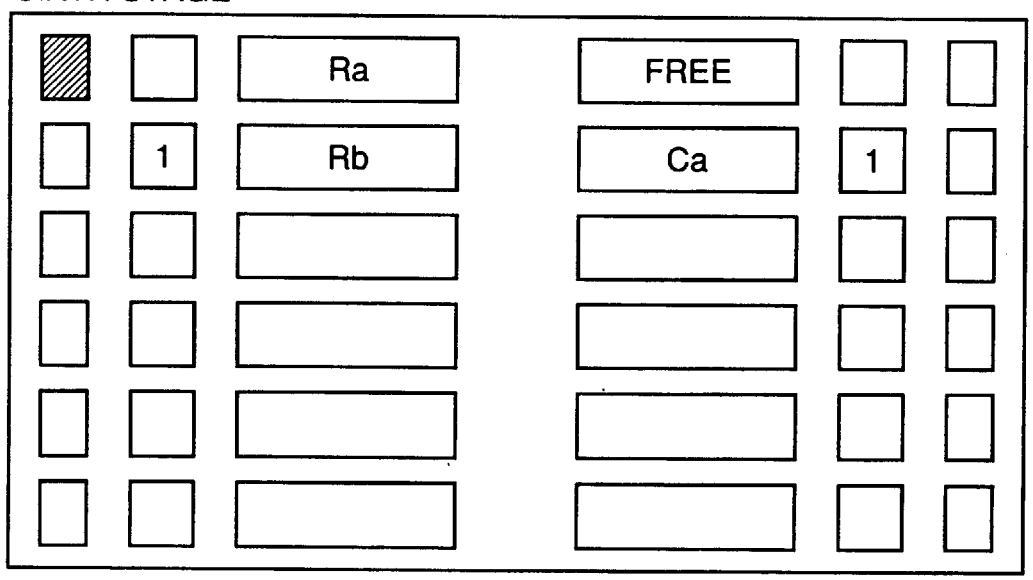

FIG. 61 illustrates the state of a sixth stage of address storage.

Referring to FIGS. 54 and 61, a defective memory cell is found on the address (Rb, Ca), the row address Rb is set in the address register RA#2, and the defective address count part CR#2 holds 1. Further, the address register CA#2 holds the column address Ca, and the defective address count part CC#2 holds a count value 1.

Figure 62:
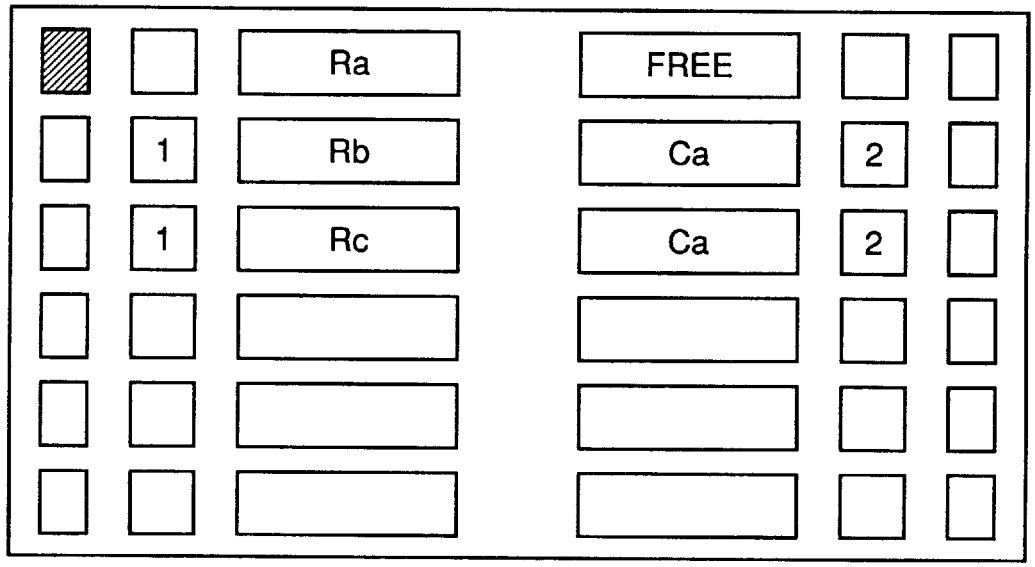

FIG. 62 illustrates the state of a seventh stage of address storage.

Referring to FIGS. 54 and 62, a defective memory cell is detected on the address (Rc, Ca), the address register RA#1 stores the row address Rc, and the defective address count part CR#3 holds 1. The address register CA#3 stores the column address Ca, and the count values of the defective address count parts CC#2 and CC#3 reach 2.

Figure 63:
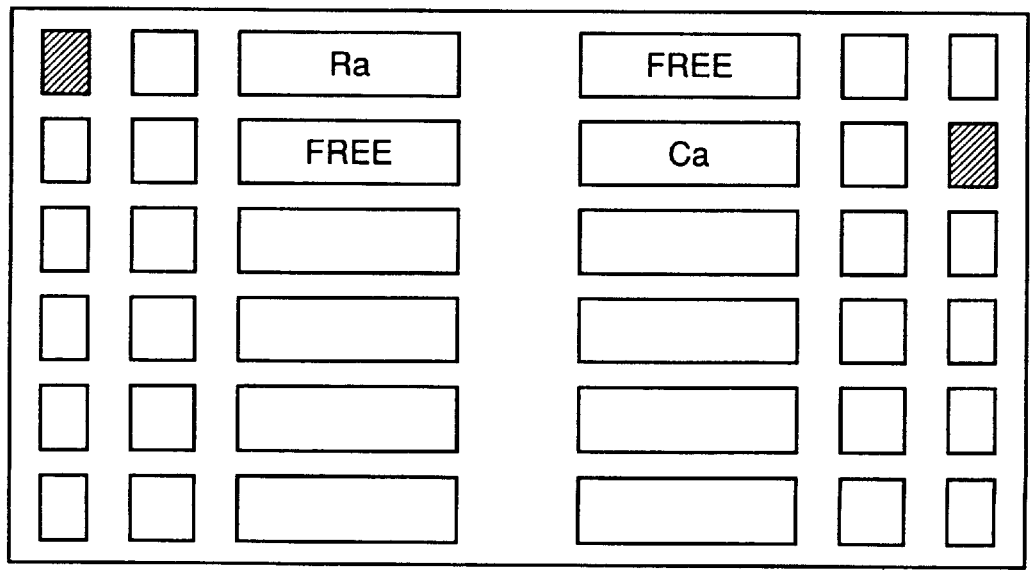
FIG. 63 illustrates a state of address storage after test completion.

FIG. 63 illustrates the state of address storage after test completion.

Referring to FIGS. 54 and 63, if the count value exceeds 1 after test completion, the row address Ca stored in the address registers CA#2 and CA#3 is finally set as the replaced column, the flag hold part FC#2 is flagged and the row address set in the address register RA#2 enters a free state, in order to attain efficient repair. Further, the addresses set in the address registers RA#3 and CA#3 are cleared.

How to replace redundant rows and redundant columns is finally decided in the aforementioned manner.

The operation of the address processing part described above is described again with reference to flow charts.

Figure 64:
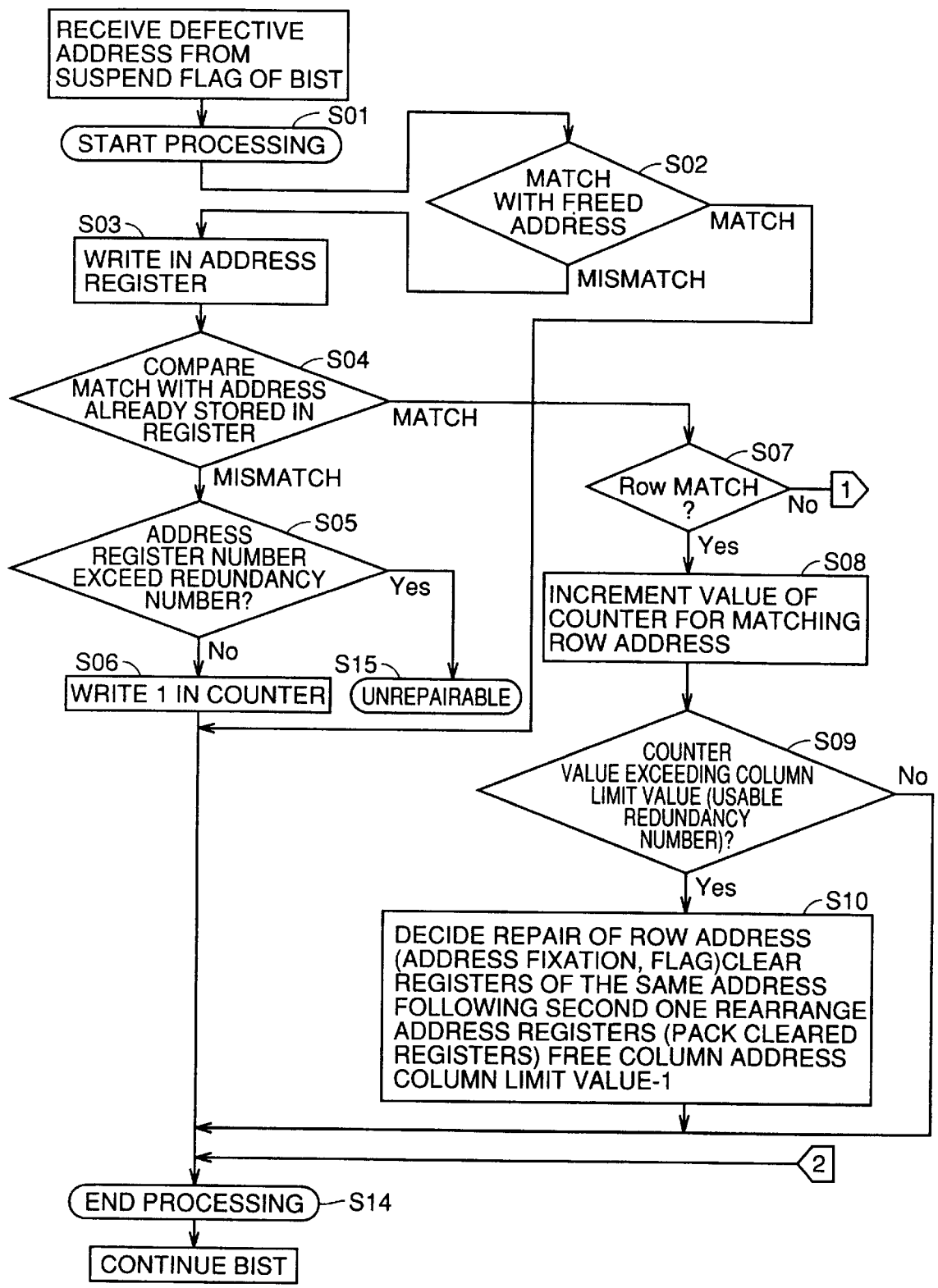
FIG. 64 is a flow chart showing the flow of storage of defective addresses in testing and a repair determination after end of the test.
Figure 65:
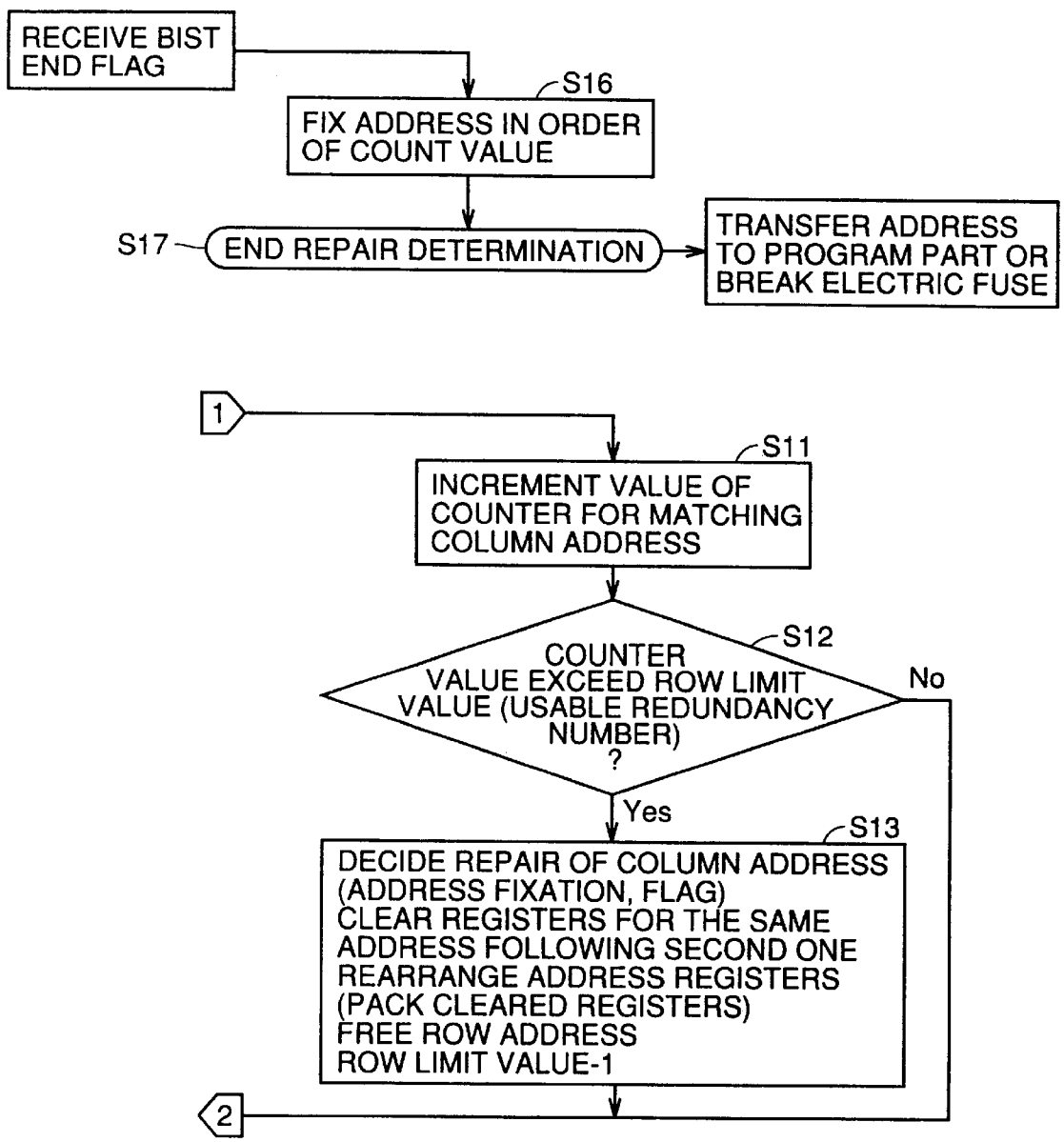
FIG. 65 is a flow chart showing the flow of storage of the defective addresses in testing and the repair determination after end of the test.

FIGS. 64 and 65 are flow charts showing the flow of the storage of defective addresses in testing and repair determination after test completion.

Referring to FIGS. 64 and 65, address storage processing starts at a step S01 when receiving a defective address from the suspend flag during execution of the BIST. Then, match of a freed address and the defective address is determined at a step S02. The freed address is the column address of a defective memory cell having a row address determined for row replacement which is thereafter further found or the row address of a defective memory cell having a column address determined for column replacement which is thereafter further found.

If the freed address mismatches with the defective address, the process advances to a step S03 for performing writing in the address register.

At a step S04, match with the address already stored in the address register is compared. The process advances to a step S07 if match is determined, while advancing to a step S05 if mismatch is determined.

At a step S05, determination is made as to whether or not the number of address registers storing addresses exceeds the numbers of redundant columns and redundant rows. If the former exceeds the latter, the process advances to a step S15 for determining that the tested chip is unrepairable. Then, the BIST is interrupted.

If the number of the address registers storing addresses does not exceed the numbers of the redundant columns and the redundant rows, the process advances to a step S06.

At the step S06, 1 is added to the value of the counter provided on correspondence to each address register. Then, the process advances to a step S14 to end the defective address storage processing and continue the BIST.

When match with the freed address is detected at the step S02, repair of the defective address has already been decided and hence no address may be stored. Thus, the process advances to the step S14 to end the address storage processing.

If the already stored defective address matches with the row address or the column address at the step S04, the process advances to a step S07. At the step S07, determination is made as to whether or not the matching address is a row address.

If the matching address is a row address, the process advances to a step S08 to increment the value of the counter corresponding to the matching row address.

Then, the process advances to a step S09.

At the step S09, determination is made as to whether or not the incremented value of the counter exceeds a column limit number (usable redundancy number). If the former exceeds the latter, the process advances to a step S10 to decide repair of the row address, fix the row address and flag the corresponding flag hold part. Overlapping registers of the same address are cleared and the contents of the address registers are rearranged. In other words, addresses are packed in the cleared register parts. A column address corresponding to the fixed row address is freed and the column limit number is decremented by 1.

When the result at the step S09 is negative, the process advances to the step S14 to end the address storage processing.

If the matching address is not a row address at the step S07, the process advances to a step S11.

In this case, the matching address is a column address. At the step S11, the value of the counter provided in correspondence to the matching column address is incremented. Then, at a step S12, determination is made as to whether or not the incremented value of the counter exceeds a row limit value (employable redundancy number). If the former does not exceed the latter, the process advances to the step S14 to end the address storage processing.

If the incremented value of the counter exceeds the row limit value, repair of the column address is decided, the column address is fixed and the corresponding flag hold part is flagged. The registers storing the same column address are cleared and the contents of the address registers are rearranged. The contents of the address registers are rearranged by sequentially packing uncleared addresses in cleared registers. The row address is freed and the row limit value is decremented by 1. The process advances to the step S14, to end the address storage processing and continue the BIST.

When the cycle of the address storage processing from the step S01 to the step S14 is repeated and the BIST is finally ended, a BIST end flag is outputted and the process advances to a step S16. At the step S16, the addresses are fixed. The addresses are fixed in order of the count values of the corresponding counters. Then, the repair determination ends at a step S17. In other words, the column address to be replaced with the redundant column and the row address to be replaced with the redundant row are decided. For the decided replace addresses, the process advances to a stage of transfer to the address program part or breaking of the electric fuse corresponding to replacement.

Figure 66:
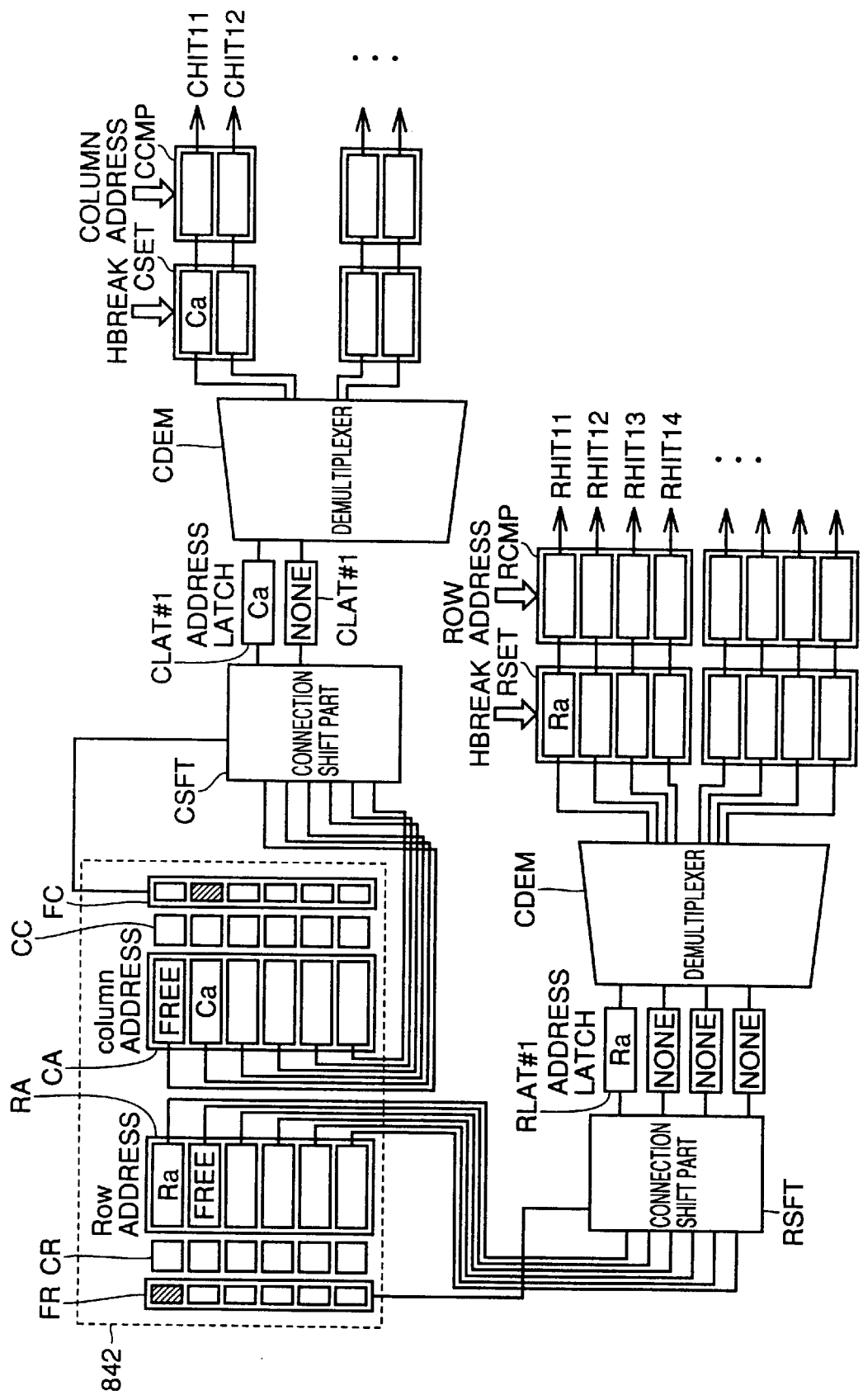
FIG. 66 is a diagram for illustrating the manner of selection of a repair address by a program processing part of each bank from the address processing part.
Figure 67:
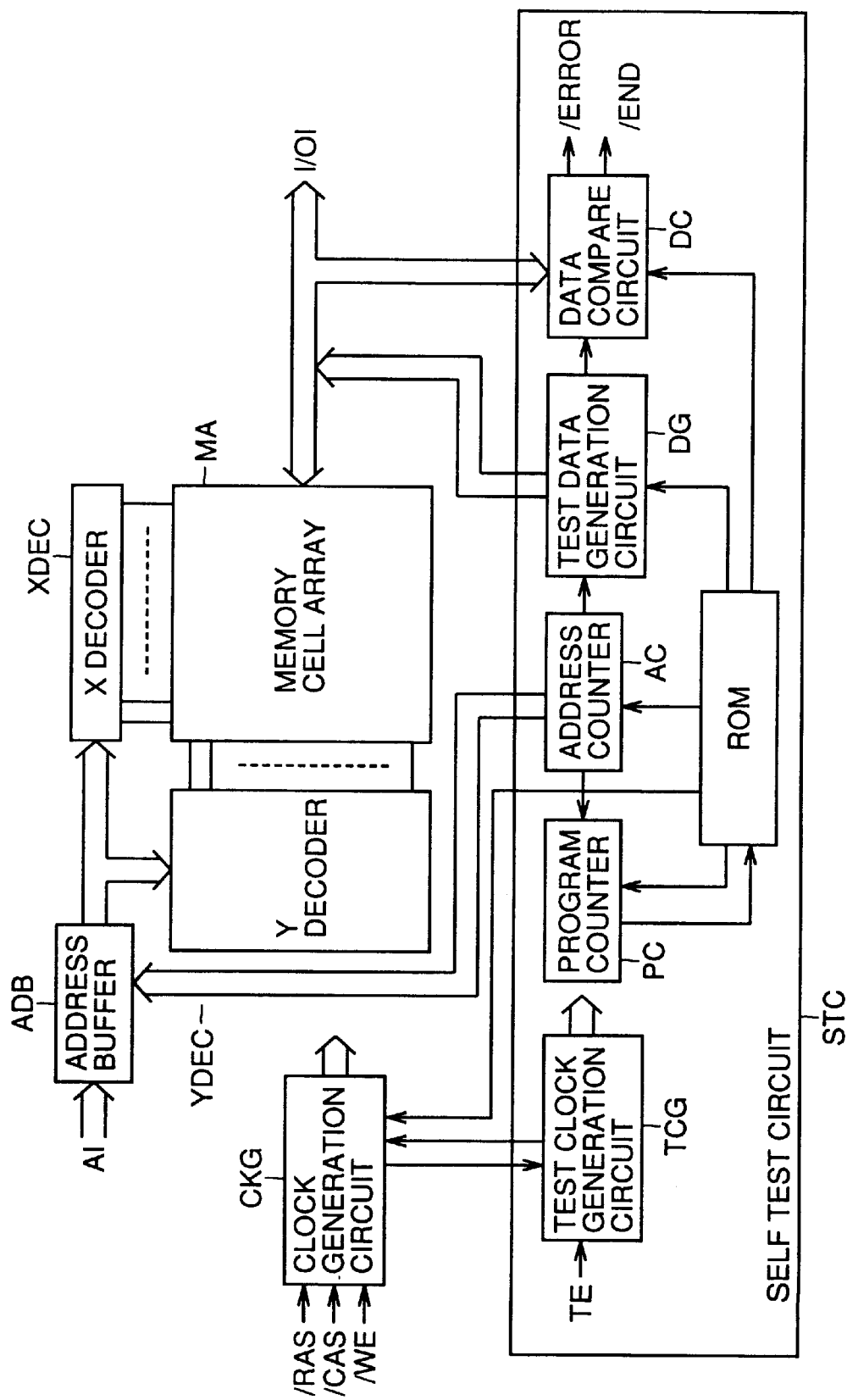
FIG. 67 is a block diagram showing the block structure of a conventional memory having a BIST (built-in self test) function.

FIG. 66 is a diagram for illustrating the manner of transfer of a repair address from the address processing part 842 to the program processing part of each bank.

Referring to FIG. 66, the address processing part 842 is provided with a flag hold part FR, a defective address count part CR and a row address register RA as a row address processing system, and a flag hold part FC, a defective address count part CC and a column address register CA as a column address processing system.

Further provided are a connection shift part RSFT sequentially receiving data related to a row address from the address processing part, address latches RLAT#1 to RLAT#4 and a demultiplexer RDEM as well as a set part RSET setting a row address for replacement and an address compare part RCMP determining whether or not the row address set in the set part RSET matches with a row address inputted in data reading in correspondence to each bank.

In addition, a connection shift part CSFT sequentially receiving data related to a column address from the address processing part, address latches CLAT#1 to CLAT#2 and a demultiplexer CDEM are provided.

In correspondence to each bank, a set part CSET setting a column address for replacement and an address compare part CCMP comparing the column address set in the set part CSET with a column address inputted in data reading and detecting match are provided.

Consider that the BIST ends, the flag hold part FR is flagged in a part corresponding to a row address RA, and the flag hold part FC corresponding to a column address CA is flagged. The connection shift part RSFT transfers only an address flagged in the flag hold part FR to the address latch RLAT#1. The demultiplexer RDEM transfers the address held in the address latch to the corresponding bank when the BIST is executed every bank. In coincidence with transmission of address information, a high voltage is applied to the set part RSET by the signal HBREAK, the fuse corresponding to the set row address is broken, and the replace address is fixed.

When setting of the replace address is thus ended, a match detection signal RHIT11 is activated if match with the set replace address is detected when the row address is inputted in the address compare part RCMP, the row including a defective memory cell is inactivated, and a redundant row is activated in place.

A similar operation is performed also in relation to column address processing.

As described above, the synchronous semiconductor memory device according to the embodiment 3 can output internal information when executing the BIST for operation analysis or obtain addresses for redundant replacement. The synchronous semiconductor memory device further can internally hold internal information of test results to execute redundant replacement or the like itself. Thus, the cost for testing the synchronous semiconductor memory device can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:
   a memory array;
   a read control circuit reading first and second storage data in a group from said memory array in response to an address signal;
   first and second data buses receiving said first and second storage data respectively;
   a first output circuit receiving said first and second storage data from said first and second buses, performing different conversions in an normal operation and in a test and thereafter outputting converted said first and second storage data; and
   a first output node receiving outputs of said first output circuit.

2. The synchronous semiconductor memory device according to claim 1, wherein
   said read control circuit further reads third and fourth storage data in a group along with said first and second storage data from said memory array in response to said address signal,
   said synchronous semiconductor memory device further comprises:
   third and fourth data buses receiving said third and fourth storage data respectively,
   a second output circuit receiving said third and fourth storage data from said third and fourth data buses in said normal operation, converting and holding said third and fourth storage data and thereafter alternately outputting converted said third and fourth storage data in response to a clock signal, and
   a second output node receiving outputs of said second output circuit, and
   said first output circuit holds a first test result based on at least said first storage data and said third storage data and a second test result based on at least said second and fourth storage data respectively and thereafter alternately outputs said first and second test results in response to said clock signal.

3. The synchronous semiconductor memory device according to claim 2, wherein
said first output circuit includes:
a first compression circuit generating said first test result in response to compression results of at least said first storage data and said third storage data,
a first hold circuit receiving and holding said first test result,
a second compression circuit generating said second test result in response to compression results of at least said second storage data and said fourth storage data;
a second hold circuit receiving and holding said second test result, and
a selection circuit alternately selecting and outputting outputs of said first and second hold circuits in response to said clock signal.

4. The synchronous semiconductor memory device according to claim 3, wherein
said read control circuit further batch-reads fifth and sixth storage data in a group along with said first to fourth storage data from said memory array in response to said address signal,
said synchronous semiconductor memory device further comprises:
fifth and sixth data buses receiving said fifth and sixth storage data respectively,
a third output circuit receiving said fifth and sixth storage data from said fifth and sixth data buses, performing different conversions in said normal operation and in said test, and holding and thereafter alternately outputting converted said fifth and sixth storage data in response to said clock signal, and
a third output node receiving outputs of said third output circuit,
said first compression circuit further receives said fifth storage data and generates said first test result, and
said second compression circuit further receives said sixth storage data and generates said second test result.

5. The synchronous semiconductor memory device according to claim 1, further comprising a clock generation circuit generating a second clock signal having a frequency twice that of a first clock signal, wherein
said read control circuit reads said first and second storage data in response to said first clock, and
said first output circuit holds a first test result based on at least said first and second storage data and thereafter outputs said first and second storage data by a time corresponding to two clocks of said second clock signal.

6. The synchronous semiconductor memory device according to claim 5, wherein
said first output circuit includes:
a compression circuit compressing at least said first storage data and said second storage data and outputting compressed data in said test,
a first hold circuit receiving and holding said first storage data in said normal operation while receiving and holding said compressed data in said test,
a second hold circuit receiving and holding said second storage data in said normal operation while receiving and holding said compressed data in said test, and
a selection circuit alternately selecting and outputting outputs of said first and second hold circuits in response to said second clock signal.

7. The synchronous semiconductor memory device according to claim 1, wherein
said first output circuit outputs a value based on said first storage data if a first test result based on at least said first storage data and said second storage data is correct while outputting a signal indicating abnormality if said first test result is abnormal in said test.

8. A synchronous semiconductor memory device comprising:
a memory array;
a BIST (built-in self test) control circuit controlling execution of a self test for said memory array, supplying an address signal and a command signal to said memory array and communicating storage data with said memory array; and
a first terminal outputting, in a pretest for testing whether or not said self test is executable, a result of said pretest.

9. The synchronous semiconductor memory device according to claim 8, further including:
a second terminal to which a first prescribed potential exceeding a first power supply potential is applied for specifying execution of said self test,
a detection circuit detecting application of said first prescribed potential to said second terminal,
a flag hold part setting a BIST execution flag in response to an output of said detection circuit and outputting said BIST execution flag to said BIST control circuit, and
an output circuit outputting said detection of said detection circuit to said first terminal in said pretest.

10. The synchronous semiconductor memory device according to claim 8, wherein
said BIST control circuit includes:
a RAM part storing test data corresponding to the procedure of said self test, and
a pattern generator part controlling said self test on the basis of said test data stored in said RAM part,
said result of said pretest includes:
said test data stored in said RAM part,
said RAM part includes:
first to n-th groups of storage units (n: natural number) being units selected by said pattern generator part in execution of said self test,
each said group of storage units have:
m storage units (m: natural number) batch-selected for outputting said test data to said pattern generator part in execution of said self test while serving as serially connected shift registers in said pretest,
said first group of storage units receive said test data from said first terminal and output the same to said second group of storage units in said pretest,
said i-th group (i: natural number of 2 to n−1) of storage units output said test data to said (i+1)-th group of storage units in said pretest, and
said n-th group of storage units output said test data to said first terminal in said pretest.

11. The synchronous semiconductor memory device according to claim 8, wherein
said BIST control circuit temporarily interrupts said self test if a defective portion is found in said memory cell in execution of said self test and sequentially outputs each bit of a defective address corresponding to said defective portion,
said synchronous semiconductor memory device further including:

a second terminal sequentially receiving each said bit and outputting each said bit to an external device.

12. The synchronous semiconductor memory device according to claim 11, further comprising:
a defective detection circuit detecting match of a plurality of read data from said memory array,
a flag hold part outputting a suspend flag temporarily interrupting said self test in response to an output of said defective detection circuit,
a third terminal outputting a recognition signal posting said external device output of said defective address in response to said suspend flag,
a fourth terminal in which a completion signal indicating complete receiving of said defective address from said external device, and
a completion detection circuit outputting a reset signal for said suspend flag to said flag hold part in response to said completion signal.

13. The synchronous semiconductor memory device according to claim 8, wherein
said memory array includes:
a plurality of regular memory cells arranged in rows and columns,
a plurality of redundant rows having a plurality of redundant memory cells respectively, and
a plurality of redundant columns having a plurality of redundant memory cells respectively,
said synchronous semiconductor memory device further comprising:
a defective detection circuit detecting match of a plurality of read data read in a group from said memory array having same expected value and detecting presence of a defective portion in said self test,
an address processing part receiving a defective address corresponding to said defective portion from said BIST control circuit every time said defective detection circuit makes said detection, performing address processing, updating/holding information corresponding to said defective address, and deciding a replace row address and a replace column address corresponding to a row for executing replacement to said redundant row and a column for executing replacement to said redundant column respectively on the basis of said information in response to a test end signal outputted from said BIST control circuit, and
a flag hold part outputting a suspend flag for temporarily interrupting said self test in response to an output of said defective detection circuit, receiving a processing completion signal indicating termination of said address processing from said address processing part and resetting said suspend flag.

14. The synchronous semiconductor memory device according to claim 13, wherein
said address processing part includes:
address hold parts of a first number being the sum of the number of said redundant rows and that of said redundant columns,
each said address hold part includes:
a row address register holding a row address of said defective address,
a row counter provided in correspondence to said row address register for counting the number of detection of a row address stored in said row address register,
a row flag set part provided in correspondence to said row address register for holding that said row address stored in said row address register has been decided as said replace row address,
a column address register holding a column address of said defective address,
a column counter provided in correspondence to said column address register for counting the number of detection of a column address stored in said column address register, and
a column flag set part provided in correspondence to said column address register for holding that said column address stored in said column address register has been decided as said replace column address, and
said address processing part decides said replace row address and said replace column address on the basis of count values of said row counter and said column counter.

15. The synchronous semiconductor memory device according to claim 13, further comprising a replace address set part receiving and holding said replace row address and said replace column address decided by said address processing part in response to said test end signal and outputting a replace instruction signal when a specified address in ordinary reading of said memory array matches with either said replace row address or said replace column address, wherein
said replace address set part includes:
a plurality of nonvolatile storage elements receiving and holding said replace row address and said replace column address in response to said test end signal.

16. The synchronous semiconductor memory device according to claim 13, further comprising a replace address set part receiving and holding said replace row address and said replace column address decided by said address processing part in response to said test end signal and outputting a replace instruction signal when a specified address in ordinary reading of said memory array matches with either said replace row address or said replace column address, wherein
said replace address set part includes:
a plurality of fuse elements to hold said replace row address and said replace column address whose conductive states are changed in correspondence to said replace row address and said replace column address in response to said test end signal.

17. The synchronous semiconductor memory device according to claim 8, further comprising:
a second terminal group, and
a data transmission circuit provided between said memory array and said second terminal group and activated in execution of said self test for outputting a data group indicating the state of said internal circuit to said second terminal group, wherein
said data group includes:
command data and address data employed for a storage operation of said memory array and test output data corresponding to storage data.

18. The synchronous semiconductor memory device according to claim 17, further comprising a compression circuit compressing any of said command data, said address data and said storage data and outputting said test output data.

19. A method of testing a synchronous semiconductor memory device including a memory array, a BIST (built-in self test) control circuit controlling execution of a self test for said memory array, supplying an address signal and a command signal to said memory array and transmitting/receiving storage data and a first terminal outputting, in a pretest for testing whether or not said self test is executable, a result of said pretest, wherein said BIST control circuit includes a RAM part storing test data corresponding to the procedure of said self test and a pattern generator part controlling said self test on the basis of said test data stored in said RAM part, said result of said pretest includes said test data stored in said RAM part, said RAM part includes first to n-th groups of storage units (n: natural number) being units selected by said pattern generator part in execution of said self test, and each said group of storage units have m storage units (m: natural number) selected in a group for outputting said test data to said pattern generator part in execution of said self test while serving as serially connected shift registers in said pretest, said method comprising:
 a first step of inputting said test data from said first terminal and sequentially shifting and storing data in said first to n-th groups of storage units; and
 a second step of sequentially shifting and reading said test data set in said first to n-th groups of storage units from said n-th group of storage units through said first terminal.

* * * * *